(12) United States Patent
Spanier et al.

(10) Patent No.: US 10,845,399 B2
(45) Date of Patent: Nov. 24, 2020

(54) SYSTEM AND METHOD FOR PERFORMING DATA TRANSFERS IN AN INTELLIGENT ELECTRONIC DEVICE

(71) Applicant: Electro Industries/GaugeTech, Westbury, NY (US)

(72) Inventors: Joseph Spanier, Brooklyn, NY (US); Jorge A. Polar Seminario, Westbury, NY (US); Dulciane Siqueira Cansancao, Olinda (BR)

(73) Assignee: ELECTRO INDUSTRIES/GAUGETECH, Westbury, NY (US)

( * ) Notice: Subject to any disclaimer, the term of this patent is extended or adjusted under 35 U.S.C. 154(b) by 967 days.

(21) Appl. No.: 13/839,359

(22) Filed: Mar. 15, 2013

(65) Prior Publication Data
US 2014/0025321 A1    Jan. 23, 2014

(51) Int. Cl.
  *G01R 21/133* (2006.01)
  *G01R 22/06* (2006.01)
  *G01D 4/00* (2006.01)

(52) U.S. Cl.
  CPC ........ *G01R 21/133* (2013.01); *G01R 22/063* (2013.01); *G01D 4/004* (2013.01); *Y02B 90/242* (2013.01); *Y04S 20/322* (2013.01)

(58) Field of Classification Search
  CPC ...... G01D 4/002; G01D 4/004; G01R 21/133; G05B 23/02; G06Q 50/06; Y04S 20/42;
  (Continued)

(56) References Cited

U.S. PATENT DOCUMENTS 1,863,741 A   6/1932 Leon
2,292,163 A   8/1942 Shea
    (Continued)

FOREIGN PATENT DOCUMENTS

JP      08247783     9/1996
WO      WO9854583    12/1998
    (Continued)

OTHER PUBLICATIONS

Electro Industries/Gauge Tech Dm Series-specification brochure, "DMMS 425 Low-Cost Multifunction Power Monitoring Outperforms All Others in its Class", 4 pages.
    (Continued)

*Primary Examiner* — Austin J Moreau
(74) *Attorney, Agent, or Firm* — Gerald Hespos; Michael Porco; Matthew Hespos

(57) ABSTRACT

There is provided an intelligent electronic device for responding to user data and information requests regarding power usage and power quality for any metered point within a power distribution system. The intelligent electronic device includes a first network interface which receives client side information and data requests, which are processed in accordance with a network protocol and forwarded to a network interface via a network socket interface translator which translates management signals to facilitate the eventual data transfer. Protocol routines process the requests by constructing an internal data request in certain cases and forwards the internal data request to a data interface for translation from an internal data request format of the protocol routine format to a native database format. The database receives the translated request, and retrieves the requested data from a measuring unit of the electric power meter, and forwards the data back to the requesting client.

29 Claims, 24 Drawing Sheets

(58) Field of Classification Search
CPC .......... Y04S 20/52; Y04S 20/30; Y04S 20/46; H04Q 2209/60
See application file for complete search history.

(56) References Cited

U.S. PATENT DOCUMENTS

| | | | |
|---|---|---|---|
| 2,435,753 A | 2/1948 | Elliot et al. |
| 2,606,943 A | 8/1952 | Barker |
| 2,883,255 A | 4/1959 | Anderson |
| 2,900,605 A | 8/1959 | Squires et al. |
| 2,987,704 A | 6/1961 | Daniels et al. |
| 2,992,365 A | 7/1961 | Brill |
| 3,084,863 A | 4/1963 | Du |
| 3,142,820 A | 7/1964 | Daniels |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck |
| 3,458,810 A | 7/1969 | Wald |
| 3,467,864 A | 9/1969 | Vander Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Friedman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,336,736 A | 6/1982 | Mishima |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptrnann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,623,997 A | 11/1986 | Tulpule |
| 4,642,563 A | 2/1987 | McEachern et al. |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,897,599 A | 1/1990 | Koslar |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | Mofachern |
| 5,017,860 A | 5/1991 | Germer et al. |
| 5,079,715 A | 1/1992 | Venkataraman et al. |
| 5,081,701 A | 1/1992 | Silver |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,054 A | 6/1993 | Wallis |
| 5,226,120 A | 7/1993 | Brown et al. |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,315,527 A | 5/1994 | Beckwith |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne et al. |
| 5,453,697 A | 9/1995 | Schweer et al. |
| 5,459,395 A | 10/1995 | Berkcan |
| 5,459,459 A | 10/1995 | Lee |
| 5,475,628 A | 12/1995 | Adams et al. |
| 5,514,958 A | 5/1996 | Germer |
| 5,528,507 A | 6/1996 | McNamara et al. |
| 5,537,340 A | 7/1996 | Gawlik |
| 5,544,064 A | 8/1996 | Beckwith |
| 5,548,527 A | 8/1996 | Hemminger et al. |
| 5,555,508 A | 9/1996 | Munday et al. |
| 5,559,719 A | 9/1996 | Johnson et al. |
| 5,563,506 A | 10/1996 | Fielden et al. |
| 5,568,047 A | 10/1996 | Stayer et al. |
| 5,572,438 A | 11/1996 | Ehlers et al. |
| 5,574,654 A | 11/1996 | Bingham et al. |
| 5,581,173 A | 12/1996 | Yalla et al. |
| 5,592,165 A | 1/1997 | Jackson et al. |
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |
| 5,650,936 A | 7/1997 | Loucks et al. |
| 5,706,204 A | 1/1998 | Cox et al. |
| 5,706,214 A | 1/1998 | Putt et al. |
| 5,734,571 A | 3/1998 | Pilz et al. |
| 5,736,847 A | 4/1998 | Van Doorn et al. |
| 5,737,231 A | 4/1998 | Pyle et al. |
| 5,757,357 A | 5/1998 | Grande et al. |
| 5,764,523 A | 6/1998 | Yoshinaga et al. |
| 5,768,632 A | 6/1998 | Husted et al. |
| 5,774,366 A | 6/1998 | Beckwith |
| 5,801,643 A | 9/1998 | Williams et al. |
| 5,819,203 A | 10/1998 | Moore et al. |
| 5,822,165 A | 10/1998 | Moran |
| 5,828,576 A | 10/1998 | Loucks et al. |
| 5,832,210 A | 11/1998 | Akiyama et al. |
| 5,862,391 A | 1/1999 | Salas et al. |

(56) References Cited

U.S. PATENT DOCUMENTS

| | | |
|---|---|---|
| 5,874,903 A | 2/1999 | Shuey et al. |
| 5,890,097 A | 3/1999 | Cox |
| 5,892,758 A | 4/1999 | Argyroudis |
| 5,896,547 A | 4/1999 | Lee |
| 5,897,607 A | 4/1999 | Jenney et al. |
| 5,898,387 A | 4/1999 | Davis et al. |
| 5,899,960 A | 5/1999 | Moore |
| 5,907,238 A | 5/1999 | Owerko et al. |
| 5,933,029 A | 8/1999 | Kuroda et al. |
| 5,952,819 A | 9/1999 | Berkcan et al. |
| 5,963,734 A | 10/1999 | Ackerman et al. |
| 5,978,655 A | 11/1999 | Ohura et al. |
| 5,986,574 A | 11/1999 | Colton |
| 5,994,892 A | 11/1999 | Turino et al. |
| 5,995,911 A | 11/1999 | Hart |
| 6,000,034 A | 12/1999 | Lightbody et al. |
| 6,011,519 A | 1/2000 | Sadler et al. |
| 6,018,690 A | 1/2000 | Toshiba |
| 6,018,700 A | 1/2000 | Edel |
| 6,023,160 A | 2/2000 | Coburn |
| 6,032,109 A | 2/2000 | Ritmiller |
| 6,038,516 A | 3/2000 | Alexander et al. |
| 6,041,257 A | 3/2000 | MacDuff et al. |
| 6,064,192 A | 5/2000 | Redmyer |
| 6,073,169 A | 6/2000 | Shuey et al. |
| 6,098,175 A | 8/2000 | Lee |
| 6,100,817 A | 8/2000 | Mason et al. |
| 6,112,136 A | 8/2000 | Paul et al. |
| 6,133,720 A | 10/2000 | Elmore |
| 6,157,329 A | 12/2000 | Lee et al. |
| 6,163,243 A | 12/2000 | Titus |
| 6,167,329 A | 12/2000 | Engel et al. |
| 6,185,508 B1 | 2/2001 | Van Doorn et al. |
| 6,186,842 B1 | 2/2001 | Hirschbold et al. |
| 6,195,614 B1 | 2/2001 | Kochan |
| 6,236,949 B1 | 5/2001 | Hart |
| 6,262,672 B1 | 7/2001 | Brooksby et al. |
| 6,269,316 B1 | 7/2001 | Hubbard |
| 6,289,267 B1 | 9/2001 | Alexander et al. |
| 6,292,717 B1 | 9/2001 | Alexander et al. |
| 6,301,527 B1 | 10/2001 | Butland et al. |
| 6,363,057 B1 | 3/2002 | Ardalan et al. |
| 6,374,084 B1 | 4/2002 | Fok |
| 6,396,421 B1 | 5/2002 | Bland |
| 6,396,839 B1 | 5/2002 | Ardalan et al. |
| 6,397,155 B1 | 5/2002 | Przydatek et al. |
| 6,401,054 B1 | 6/2002 | Andersen |
| 6,415,244 B1 | 7/2002 | Dickens et al. |
| 6,417,661 B1 | 7/2002 | Berkcan et al. |
| 6,418,450 B2 | 7/2002 | Daudenarde |
| 6,423,960 B1 | 7/2002 | Engelhardt et al. |
| 6,429,637 B1 | 8/2002 | Gandhi |
| 6,433,981 B1 | 8/2002 | Fletcher et al. |
| 6,437,692 B1 | 8/2002 | Petite et al. |
| 6,438,651 B1 | 8/2002 | Slane |
| 6,444,971 B1 | 9/2002 | Engelhardt et al. |
| 6,479,976 B1 | 11/2002 | Edel |
| 6,483,291 B1 | 11/2002 | Bhateja et al. |
| 6,493,644 B1 | 12/2002 | Jonker et al. |
| 6,509,850 B1 | 1/2003 | Bland |
| 6,519,537 B1 | 2/2003 | Yang |
| 6,522,517 B1 | 2/2003 | Edel |
| 6,526,581 B1 | 2/2003 | Edson |
| 6,528,957 B1 | 3/2003 | Luchaco |
| 6,538,577 B1 | 3/2003 | Ehrke et al. |
| 6,542,838 B1 | 4/2003 | Haddad et al. |
| 6,553,418 B1 | 4/2003 | Collins et al. |
| 6,563,697 B1 | 5/2003 | Simbeck et al. |
| 6,577,642 B1 * | 6/2003 | Fijolek .......... H04L 12/2801 370/465 |
| 6,590,380 B2 | 7/2003 | Edel |
| 6,611,773 B2 | 8/2003 | Przydatek et al. |
| 6,611,922 B2 | 8/2003 | Ozcetin et al. |
| 6,615,147 B1 | 9/2003 | Jonker et al. |
| 6,621,433 B1 | 9/2003 | Hertz |
| 6,636,030 B1 | 10/2003 | Rose et al. |
| 6,639,538 B1 | 10/2003 | Sechi et al. |
| 6,657,552 B2 | 12/2003 | Belski et al. |
| 6,661,357 B2 | 12/2003 | Bland |
| 6,671,635 B1 | 12/2003 | Forth et al. |
| 6,671,654 B1 | 12/2003 | Forth et al. |
| 6,671,802 B1 | 12/2003 | Ott |
| 6,674,379 B1 | 1/2004 | Li et al. |
| 6,687,627 B1 | 2/2004 | Gunn et al. |
| 6,694,270 B2 | 2/2004 | Hart |
| 6,701,264 B2 | 3/2004 | Caso et al. |
| 6,714,881 B2 | 3/2004 | Carlson et al. |
| 6,717,394 B2 | 4/2004 | Elms |
| 6,732,124 B1 | 5/2004 | Koseki et al. |
| 6,735,535 B1 | 5/2004 | Kagan et al. |
| 6,737,855 B2 | 5/2004 | Huber et al. |
| 6,745,138 B2 | 6/2004 | Przydatek et al. |
| 6,751,562 B1 | 6/2004 | Blackett et al. |
| 6,751,563 B2 | 6/2004 | Spanier et al. |
| 6,757,628 B1 | 6/2004 | Anderson et al. |
| 6,759,837 B2 | 7/2004 | Gandhi |
| 6,762,675 B1 | 7/2004 | Cafiero et al. |
| 6,792,337 B2 | 9/2004 | Blackett et al. |
| 6,792,364 B2 | 9/2004 | Jonker et al. |
| 6,798,190 B2 | 9/2004 | Harding et al. |
| 6,798,191 B1 | 9/2004 | Macfarlane et al. |
| 6,801,865 B2 | 10/2004 | Gilgenbach et al. |
| 6,813,571 B2 | 11/2004 | Lightbody et al. |
| 6,817,890 B1 | 11/2004 | Schindler |
| 6,825,776 B2 | 11/2004 | Lightbody et al. |
| 6,829,267 B2 | 12/2004 | Vaughan et al. |
| 6,836,737 B2 | 12/2004 | Petite et al. |
| 6,842,707 B2 | 1/2005 | Raichle et al. |
| 6,853,978 B2 | 2/2005 | Forth et al. |
| 6,871,150 B2 | 3/2005 | Huber et al. |
| 6,894,979 B1 | 5/2005 | Lee |
| 6,900,738 B2 | 5/2005 | Crichlow |
| 6,934,754 B2 | 8/2005 | West et al. |
| 6,944,555 B2 | 9/2005 | Blackett et al. |
| 6,957,158 B1 | 10/2005 | Hancock et al. |
| 6,957,275 B1 | 10/2005 | Sekiguchi |
| 6,961,641 B1 | 11/2005 | Forth et al. |
| 6,963,195 B1 | 11/2005 | Berkcan |
| 6,972,364 B2 | 12/2005 | Diedrichsen |
| 6,975,209 B2 | 12/2005 | Gromov |
| 6,983,211 B2 | 1/2006 | Macfarlene et al. |
| 6,985,087 B2 | 1/2006 | Soliman |
| 6,988,025 B2 | 1/2006 | Ransom et al. |
| 6,988,043 B1 | 1/2006 | Randall |
| 6,988,182 B2 | 1/2006 | Teachman et al. |
| 6,989,735 B2 | 1/2006 | Fisher et al. |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,035,593 B2 | 4/2006 | Miller et al. |
| 7,043,459 B2 | 5/2006 | Peevey |
| 7,047,216 B2 | 5/2006 | Kashti |
| 7,049,975 B2 | 5/2006 | Vanderah et al. |
| 7,050,808 B2 | 5/2006 | Janusz et al. |
| 7,050,916 B2 | 5/2006 | Curtis et al. |
| 7,072,779 B2 | 7/2006 | Hancock et al. |
| 7,085,824 B2 | 8/2006 | Forth et al. |
| 7,089,089 B2 | 8/2006 | Cumming et al. |
| 7,126,439 B2 | 10/2006 | Qi et al. |
| 7,126,493 B2 | 10/2006 | Junker |
| 7,127,328 B2 | 10/2006 | Ransom |
| 7,135,956 B2 | 11/2006 | Bartone et al. |
| 7,136,384 B1 | 11/2006 | Wang |
| 7,155,350 B2 | 12/2006 | Kagan |
| 7,158,050 B2 | 1/2007 | Lightbody et al. |
| 7,171,467 B2 | 1/2007 | Carley |
| 7,174,258 B2 | 2/2007 | Hart |
| 7,174,261 B2 | 2/2007 | Gunn et al. |
| 7,188,003 B2 | 3/2007 | Ransom et al. |
| 7,191,076 B2 | 3/2007 | Huber et al. |
| 7,196,673 B2 | 3/2007 | Savage et al. |
| 7,203,736 B1 | 4/2007 | Burnett et al. |
| 7,209,804 B2 | 4/2007 | Curt et al. |
| 7,216,043 B2 | 5/2007 | Ransom et al. |

(56) References Cited

U.S. PATENT DOCUMENTS

| | | |
|---|---|---|
| 7,239,184 B2 | 7/2007 | Cetrulo et al. |
| 7,243,050 B2 | 7/2007 | Armstrong |
| 7,246,014 B2 | 7/2007 | Forth et al. |
| 7,248,977 B2 | 7/2007 | Hart |
| 7,248,978 B2 | 7/2007 | Ransom |
| 7,249,265 B2 | 7/2007 | Carolsfeld et al. |
| 7,256,709 B2 | 8/2007 | Kagan |
| 7,257,107 B2 | 8/2007 | Swier, Jr. et al. |
| 7,271,996 B2 | 9/2007 | Kagan et al. |
| 7,294,997 B2 | 11/2007 | Kagan |
| 7,304,586 B2 | 12/2007 | Wang et al. |
| 7,304,829 B2 | 12/2007 | Nadipuram et al. |
| 7,305,310 B2 | 12/2007 | Slota et al. |
| 7,313,176 B1 | 12/2007 | Groen |
| 7,337,081 B1 | 2/2008 | Kagan |
| 7,342,507 B2 | 3/2008 | Jonker |
| 7,346,786 B1 | 3/2008 | Dimick et al. |
| 7,359,809 B2 | 4/2008 | Bruno |
| 7,369,950 B2 | 5/2008 | Wall et al. |
| 7,372,574 B2 | 5/2008 | Sanders et al. |
| 7,379,997 B2 | 5/2008 | Ehlers et al. |
| 7,395,323 B2 | 7/2008 | Larson et al. |
| 7,409,303 B2 | 8/2008 | Yeo et al. |
| 7,415,368 B2 | 8/2008 | Gilbert et al. |
| 7,436,687 B2 | 10/2008 | Patel |
| 7,444,454 B2 | 10/2008 | Yancey et al. |
| 7,447,760 B2 | 11/2008 | Forth et al. |
| 7,447,762 B2 | 11/2008 | Curray et al. |
| 7,486,624 B2 | 2/2009 | Shaw et al. |
| 7,511,468 B2 | 3/2009 | McEachern et al. |
| 7,514,907 B2 | 4/2009 | Rajda et al. |
| 7,554,320 B2 | 6/2009 | Kagan |
| 7,577,542 B2 | 8/2009 | Vacar et al. |
| 7,616,656 B2 | 11/2009 | Wang et al. |
| 7,630,863 B2 | 12/2009 | Zweigle et al. |
| 7,660,682 B2 | 2/2010 | Slota et al. |
| 7,761,910 B2 | 7/2010 | Ransom et al. |
| 7,765,127 B2 | 7/2010 | Banks et al. |
| 7,877,169 B2 | 1/2011 | Slota et al. |
| 7,881,907 B2 | 2/2011 | Curt et al. |
| 7,899,630 B2 | 3/2011 | Kagan |
| 7,916,060 B2 | 3/2011 | Zhu et al. |
| 7,920,976 B2 | 4/2011 | Banhegyesi |
| 7,953,899 B1 | 5/2011 | Hooper |
| 7,962,298 B2 | 6/2011 | Przydatek et al. |
| 7,974,713 B2 | 7/2011 | Disch et al. |
| 7,996,171 B2 | 8/2011 | Banhegyesi |
| 7,999,696 B2 | 8/2011 | Wang et al. |
| 8,022,690 B2 | 9/2011 | Kagan |
| 8,037,173 B2 | 10/2011 | Tuckey et al. |
| 8,063,704 B2 | 11/2011 | Wu et al. |
| 8,073,642 B2 | 12/2011 | Slota et al. |
| 8,078,418 B2 | 12/2011 | Banhegyesi et al. |
| 8,107,491 B2 | 1/2012 | Wang et al. |
| 8,121,801 B2 | 2/2012 | Spanier et al. |
| 8,160,824 B2 | 4/2012 | Spanier et al. |
| 8,190,381 B2 | 5/2012 | Spanier et al. |
| 8,269,482 B2 | 9/2012 | Banhegyesi |
| 8,442,660 B2 | 5/2013 | Kagan |
| 8,515,348 B2 | 8/2013 | Kagan |
| 8,599,036 B2 | 12/2013 | Wang et al. |
| 8,620,608 B2 | 12/2013 | Banhegyesi et al. |
| 8,666,688 B2 | 3/2014 | Spanier et al. |
| 8,700,347 B2 | 4/2014 | Spanier et al. |
| 8,797,202 B2 | 8/2014 | Zhu et al. |
| 8,862,435 B2 | 10/2014 | Spanier et al. |
| 8,878,517 B2 | 11/2014 | Banhegyesi |
| 8,930,153 B2 | 1/2015 | Kagan et al. |
| 8,933,815 B2 | 1/2015 | Kagan et al. |
| 9,080,894 B2 | 7/2015 | Spanier et al. |
| 9,194,898 B2 | 11/2015 | Banhegyesi et al. |
| 9,482,555 B2 | 11/2016 | Spanier et al. |
| 9,696,180 B2 | 7/2017 | Kagan |
| 9,903,895 B2 | 2/2018 | Banhegyesi et al. |
| 9,989,618 B2 | 6/2018 | Spanier et al. |
| 2001/0038343 A1 | 11/2001 | Meyer et al. |
| 2001/0038689 A1 | 11/2001 | Liljestrand et al. |
| 2002/0014884 A1 | 2/2002 | Chung |
| 2002/0018399 A1 | 2/2002 | Schultz et al. |
| 2002/0026957 A1 | 3/2002 | Reyman |
| 2002/0032535 A1 | 3/2002 | Alexander et al. |
| 2002/0048269 A1 | 4/2002 | Hong et al. |
| 2002/0072868 A1 | 6/2002 | Bartone et al. |
| 2002/0073211 A1 | 6/2002 | Lin et al. |
| 2002/0091784 A1* | 7/2002 | Baker .................... G05B 19/05 709/208 |
| 2002/0105435 A1 | 8/2002 | Yee et al. |
| 2002/0109608 A1 | 8/2002 | Petite et al. |
| 2002/0114326 A1 | 8/2002 | Mahalingaiah |
| 2002/0120723 A1 | 8/2002 | Forth et al. |
| 2002/0129342 A1 | 9/2002 | Kil et al. |
| 2002/0161536 A1* | 10/2002 | Suh ........................ G01D 4/004 702/62 |
| 2002/0162014 A1 | 10/2002 | Przydatek et al. |
| 2002/0165677 A1 | 11/2002 | Lightbody et al. |
| 2002/0169570 A1 | 11/2002 | Spanier et al. |
| 2002/0173927 A1* | 11/2002 | Vandiver ............. G06F 11/2294 702/122 |
| 2002/0180420 A1 | 12/2002 | Lavoie et al. |
| 2003/0009401 A1 | 1/2003 | Ellis |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0065459 A1 | 4/2003 | Huber et al. |
| 2003/0076247 A1 | 4/2003 | Bland |
| 2003/0084112 A1 | 5/2003 | Curray et al. |
| 2003/0093429 A1 | 5/2003 | Nishikawa et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0176952 A1 | 9/2003 | Collins et al. |
| 2003/0178982 A1 | 9/2003 | Elms |
| 2003/0178985 A1 | 9/2003 | Briese et al. |
| 2003/0185110 A1 | 10/2003 | Fujisawa |
| 2003/0187550 A1 | 10/2003 | Wilson et al. |
| 2003/0204756 A1 | 10/2003 | Ransom et al. |
| 2003/0210699 A1 | 11/2003 | Holt et al. |
| 2003/0212512 A1 | 11/2003 | Hart |
| 2003/0220752 A1 | 11/2003 | Hart |
| 2003/0226058 A1 | 12/2003 | Miller et al. |
| 2004/0049524 A1 | 3/2004 | Toyota et al. |
| 2004/0064198 A1 | 4/2004 | Reynolds et al. |
| 2004/0066311 A1 | 4/2004 | Giles et al. |
| 2004/0078474 A1 | 4/2004 | Ramaswamy |
| 2004/0083066 A1 | 4/2004 | Hayes et al. |
| 2004/0113810 A1 | 6/2004 | Mason et al. |
| 2004/0122833 A1 | 6/2004 | Forth et al. |
| 2004/0128260 A1 | 7/2004 | Amedure et al. |
| 2004/0138786 A1* | 7/2004 | Blackett ................. G01D 4/00 700/295 |
| 2004/0138787 A1 | 7/2004 | Ransom et al. |
| 2004/0138835 A1 | 7/2004 | Ransom et al. |
| 2004/0153594 A1* | 8/2004 | Rotvold ............. G05B 19/4186 710/305 |
| 2004/0167686 A1 | 8/2004 | Baker et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0208182 A1 | 10/2004 | Boles et al. |
| 2004/0229578 A1 | 11/2004 | Lightbody et al. |
| 2005/0017874 A1 | 1/2005 | Lightbody et al. |
| 2005/0021252 A1 | 1/2005 | Hui |
| 2005/0027464 A1 | 2/2005 | Jonker et al. |
| 2005/0039040 A1 | 2/2005 | Ransom et al. |
| 2005/0060110 A1 | 3/2005 | Jones et al. |
| 2005/0071106 A1 | 3/2005 | Huber et al. |
| 2005/0093571 A1 | 5/2005 | Suaris et al. |
| 2005/0144437 A1 | 6/2005 | Ransom et al. |
| 2005/0165585 A1 | 7/2005 | Bhateja et al. |
| 2005/0187725 A1 | 8/2005 | Cox |
| 2005/0220079 A1 | 10/2005 | Asokan |
| 2005/0240362 A1 | 10/2005 | Randall |

(56) References Cited

U.S. PATENT DOCUMENTS

| | | |
|---|---|---|
| 2005/0243204 A1 | 11/2005 | Zhu |
| 2005/0273183 A1 | 12/2005 | Curt et al. |
| 2005/0273280 A1 | 12/2005 | Cox |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0020405 A1 | 1/2006 | Kagan |
| 2006/0020634 A1 | 1/2006 | Huras et al. |
| 2006/0047787 A1 | 3/2006 | Agarwal et al. |
| 2006/0049694 A1 | 3/2006 | Kates |
| 2006/0052958 A1 | 3/2006 | Hancock et al. |
| 2006/0066456 A1 | 3/2006 | Jonker |
| 2006/0066903 A1 | 3/2006 | Shiimori |
| 2006/0077999 A1 | 4/2006 | Kagan et al. |
| 2006/0083260 A1 | 4/2006 | Wang et al. |
| 2006/0085419 A1 | 4/2006 | Rosen |
| 2006/0086893 A1 | 4/2006 | Spanier et al. |
| 2006/0095219 A1 | 5/2006 | Bruno |
| 2006/0116842 A1 | 6/2006 | Tarantola et al. |
| 2006/0145890 A1 | 7/2006 | Junker et al. |
| 2006/0161360 A1 | 7/2006 | Yao et al. |
| 2006/0161400 A1 | 7/2006 | Kagan |
| 2006/0170409 A1 | 8/2006 | Kagan et al. |
| 2006/0187956 A1 | 8/2006 | Doviak et al. |
| 2006/0200599 A1 | 9/2006 | Manchester et al. |
| 2006/0224336 A1* | 10/2006 | Petras ............... H04L 12/66 702/62 |
| 2006/0230394 A1 | 10/2006 | Forth et al. |
| 2006/0267560 A1 | 11/2006 | Rajda et al. |
| 2006/0271244 A1 | 11/2006 | Cumming et al. |
| 2006/0271314 A1 | 11/2006 | Hayes |
| 2007/0055889 A1* | 3/2007 | Henneberry ....... G01R 19/2513 713/186 |
| 2007/0058634 A1 | 3/2007 | Gupta et al. |
| 2007/0067119 A1* | 3/2007 | Loewen ............. G01R 22/065 702/57 |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1* | 5/2007 | Deveaux ............... G06F 8/60 700/83 |
| 2007/0114987 A1 | 5/2007 | Kagan |
| 2007/0136010 A1 | 6/2007 | Gunn et al. |
| 2007/0152058 A1 | 7/2007 | Yeakley et al. |
| 2007/0156915 A1* | 7/2007 | Neishi ................. H04L 69/32 709/230 |
| 2007/0233323 A1 | 10/2007 | Wiemeyer et al. |
| 2008/0046205 A1 | 2/2008 | Gilbert et al. |
| 2008/0065335 A1 | 3/2008 | Doig et al. |
| 2008/0071482 A1* | 3/2008 | Zweigle ............. G01R 19/2513 702/62 |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0127210 A1* | 5/2008 | Bosold ............... H04L 67/025 719/313 |
| 2008/0147334 A1 | 6/2008 | Kagan |
| 2008/0158008 A1 | 7/2008 | Kagan et al. |
| 2008/0172192 A1 | 7/2008 | Banhegyesi |
| 2008/0195794 A1 | 8/2008 | Banker |
| 2008/0215264 A1 | 9/2008 | Spanier et al. |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0240140 A1* | 10/2008 | Dabagh ................ H04L 49/90 370/412 |
| 2008/0252481 A1 | 10/2008 | Vacar et al. |
| 2009/0012728 A1 | 1/2009 | Spanier et al. |
| 2009/0066528 A1 | 3/2009 | Bickel et al. |
| 2009/0072813 A1 | 3/2009 | Banhegyesi |
| 2009/0096654 A1 | 4/2009 | Zhu et al. |
| 2009/0172455 A1* | 7/2009 | Pind .................... H04J 3/0667 713/400 |
| 2009/0228224 A1 | 9/2009 | Spanier et al. |
| 2009/0247146 A1 | 10/2009 | Wesby |
| 2009/0265124 A1 | 10/2009 | Kagan |
| 2010/0054276 A1 | 3/2010 | Wang et al. |
| 2010/0153036 A1 | 6/2010 | Elwarry et al. |
| 2010/0169876 A1 | 7/2010 | Mann |
| 2010/0324845 A1 | 12/2010 | Spanier et al. |
| 2011/0040809 A1 | 2/2011 | Spanier et al. |
| 2011/0119673 A1* | 5/2011 | Bloch .................... G06F 9/546 718/102 |
| 2011/0153697 A1 | 6/2011 | Nickolov et al. |
| 2011/0158244 A1 | 6/2011 | Long et al. |
| 2011/0260710 A1 | 10/2011 | Zhu et al. |
| 2011/0270551 A1 | 11/2011 | Kagan et al. |
| 2012/0025807 A1 | 2/2012 | Banhegyesi |
| 2012/0209057 A1 | 8/2012 | Siess et al. |
| 2012/0209552 A1 | 8/2012 | Spanier et al. |
| 2012/0209557 A1 | 8/2012 | Crandall et al. |
| 2013/0019042 A1* | 1/2013 | Ertugay ............... G06F 13/385 710/267 |
| 2013/0154833 A1* | 6/2013 | Kiss .................... H04Q 9/00 340/545.1 |
| 2013/0158918 A1 | 6/2013 | Spanier et al. |
| 2014/0180613 A1 | 6/2014 | Banhegyesi et al. |
| 2014/0222357 A1 | 8/2014 | Spanier et al. |
| 2015/0019148 A1 | 1/2015 | Spanier et al. |
| 2015/0172226 A1* | 6/2015 | Borshteen ........... H04L 49/9057 370/412 |

FOREIGN PATENT DOCUMENTS

| | | |
|---|---|---|
| WO | WO01055733 | 8/2001 |
| WO | WO 2005/059572 A1 * | 6/2005 |

OTHER PUBLICATIONS

International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.

"Power Quality—A guide to voltage fluctuation and light flicker"; BChydro Power Smart, Vancouver, B.C., Canada; Dated Mar. 2005; pp. 1-12.

3720 ACM, 3-phase Power Instruction Package, Power Measurement, specification, 8 pages, revision date Dec. 16, 1998.

3720 ACM, Installation & Operation Manual, Power Measurement, 67 pages, revision date Apr. 4, 2000.

6200 ION, Installation & Basic Setup Instructions, (c)Power Measurement Ltd., Revision Date Apr. 25, 2001, 50 pages.

7700 Ion 3-Phase Power Meter, Analyzer and Controller, pp. 1-10, Dec. 10, 1998.

8400 ION/8500 ION Instruction Leaflet, Power Measurement, pp. 1-8, Oct. 1999.

8500 ION Technical Documentation, 8500 ION and 8500 ION-PQ Advanced Intelligent Billing Meters, specification, Power Measurement, revision date Apr. 15, 1999.

Brochure, Sentinel TM Electronic "Multimeasurement Meter," Schlumberger, Mar. 2001, 4 pages.

Communicator EXT 3.0, User Manual Version 1.28; Electro Industries/Gauge Tech; Doc # E107707 V1.28, Nov. 11, 2005.

European Standard En-50160; "Voltage characteristics of electricity supplied by public distribution networks"; Copyright 2007 CENELEC; published Oct. 31, 2007; pp. 1-23.

Futura+Series, "Advanced Power Monitoring and Analysis for the 21st Century", Electro Industries/Gauge Tech, specification, 8 pages, Apr. 13, 2000.

http://www.landisgyrus/Landis-Gyr/Meters/2510-socket-meter.asp, Apr. 18, 2005, 25 pages.

IEC 61000-4-15: Electromagnetic compatibility (EMC) Part 4: Testing and measuring techniques, Section 15: Flickermeter-Functional and design specifications; Cenelec-European Committee for Electrotechnical Standardization; Apr. 1998.

(56) References Cited

OTHER PUBLICATIONS

IEEE Std 1159-1995; IEEE Recommended Practice for monitoring Electric Power Quality; Copyright the Institute of Electrical and Electronics Engineers, Inc. 1995; New York, NY; pp. 1-76.
IEEE Std 519-1992; IEEE Recommended Practices and Requirements for Harmonic Control in Electrical Power Systems; Copyright The Institute of Electrical and Electronics Engineers, Inc. 1993; New York, NY; pp. 1-101.
International Standard IEC-1180-1; "High-voltage test techniques for low-voltage equipment"; Copyright Commission dectrotechnique Commission 1992; Geneva, Switzerland; pp. 1-62.
International Standard IEC-61000-2-4, Second Edition; "Electromagnetic compatibility (EMC)—Part 2-4: EnvironnentCompatbility levels in industrial plants for low-frequency conducted disturbances"; Copyright Commission Electrotechnique Commission 2002; Geneva, Switzerland; pp. 1-84.
International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.
International Standard IEC-687, Second Edition; "Alternating current static watt-hours meters for active energy"; Copyright Commission Electrotechnique Commission 1992; Geneva, Switzerland; pp. 1-36.
ION 7550/10N7650 User Guide Power Measuremen—Revision Date Aug. 31, 2004.
ION Technology 7700 ION 3-Phase Power Meter, Analyzer and Controller, Power Measurement, specification, pp. 1-10, revision date Dec. 8, 1998.
ION Technology 7700 ION Installation & Operation Manual, Power Measurement, revision date Nov. 20, 1996.
ION Technology 8500 ION. 8400 ION Advanced Socket-Mount Meter, specification, Power Measurement, pp. 1-12, revision date Dec. 3, 1999.
ION Technology, 7500 ION 7600 Ion High Visibility Energy & Power Quality Compliance Meters, Power Measurement, specification, pp. 1-8, revision date Nov. 30, 2000.
ION Technology, 7500 ION High Visibility 3-Phase Energy & Power Quality Meter, Power Measurement, specification, pp. 1-8, revision date Mar. 21, 2000.
ION(R) Technology, Meter Shop User's Guide, (C)Power Measurement Ltd., Revision DAte May 10, 2001, 48 pages.
ION7550/ion7650 PowerLogic power-monitoring units, Technical data sheets, Copyright 2006 Schneider Electric.
Manual, "3300 ACM, Economical Digital Power Meter/Transducer—Installation and Operation Manual, Power Measurement, Ltd.", 1999, pp. 79.
Nagura et al., "Correction method for a single chip power meter", May 10-12, 1994, IEEE, 1994 IEEE Instrumentation and Measurement Technology Conference, 1994. ITMC/94.
Nexus 1250 Installation and Operation Manual Revision 1.20, Electro Industries/Gauge Tech, 50 pages, Nov. 8, 2000.
Nexus 1250, Precision Power Meter & Data Acquisition Node, Accumeasure Technology, Electro Industries/Gauge Tech, specification, 16 pages, Nov. 1999.
Performance Power Meter & Data Acquisition Node, Electro Industries/Gauge Tech., Nexus 1250 specification, 8 pages, Dec. 14, 2000.
Power Platform PP1 & PP1E TASKCard-Inrush Operator's Manual; Dranetz—BMI, Revision A—Apr. 15, 1997, pp. 231.
PowerLogic Series 4000 Circuit Monitors, pp. 1-4; Document #3020H00601; Jan. 2006.
Ramboz, J.D. and Petersons, O., Nist Measurement Services: A Calibration Service for Current Transformers, U.S. Dept. of Commerce, National Institute of Standards and Tech., U.S. Gov. PMtg. Ofc., Jun. 1991.

Series 5500 InfoNode User's Guide; Dranetz—BMI, Edison, NJ; Copywright 1999, 2002, 2004; pp. 1-220.
The Dranetz Field Handbook for Power quality Analysis; Dranetz Technologies Incorporated, Edison, NJ; Copyright 1991; pp. 1-271.
User's Installation & Operation and User's Programming Manual. The Futura Series, Electro Industries, pp. 1-64, Copyright 1995.
Zeinalipour-Yazti et ai, MicroHash: An Efficient Index Structure for Flash-Based Sensor Devices, Proceedings of the 4th Conference on USENIX Conference on File and Storage Technologies, vol. 4, Dec. 2005, pp. 14.
"MuNet Demonstrates End-toEnd IP-Based Energy Management System at DistribuTECH," pp. 1-2 at http://www.munet.com/muNetNewPressReleases.sub.-0205001.htm, May 24, 2001.
"MuNet's WebGate IRIS Deployed for Utility Trials Across US", pp. 1-2 at http://www.munet.com/muNetNewPressReleases121300.htm.
"MuNet's WebGate System Finds a Home on the Internet," pp. 1-2 at http://www.munet.com/muNetNewPressReleases031899.htm, May 24, 2001.
"Webgate Icis (Internet Commercial Information System)", pp. 1 at http://www.munet.com/munetproductsicisindex.htm, "Products (WebGate ICIS Internet AMR now)," pp. 1-2 at http://www.munet.com/munetproductsicis.htm, Products (Webgate ICIS Control Cenetr Software), pp. 1-2 at http://222.munet.com/munetproductsicisSpec.htm, May 24, 2001.
"Webgate Iris (Internet Residential Information System )"; http://www.munet.com/munetproducts.irisindex.html "Products," pp. 1-3; http://www.munet.com/munetproductsiris.html "Preliminary Specification" pp. 1-2; http://www.munet.com/munetproductsiris.sub.-Spec.html.
Braden, R (editor), "Requirements for Internet Hosts-Application and Support", RFC 1123, pp. 1-97, Oct. 1989.
Cerf et al., A Protocol for Packet Network Intercommunication, IEEE Trans on Comms, vol. Com-22, No. 5, May 1974, 13 pages (Year:1974).
Communicator EXT 3.0 User Manual Revision 1.32, Electro Industries/Gauge Tech, 558 pages, Aug. 27, 2007.
Deutsch, P., Emtage, A., and Marine, A., "How to Use Anonymous FTP", RFC1635, pp. 1-13, May 1994.
Engage Network, Inc., "Internet Protocol Card for Revenue Meters", http://www.engagenet.com. Link present as of Mar. 2000 on http://web.archive.org/web/20010306005433/www.engagenet.com/content/produ- cts.shtml.
Hubbell, "What is flat file?", WhatIs.com, http://searchsqlservertechtarget.com/definition/flat-file, Jul. 2006, 1 pp.
Multi-port Communications Card (MPCC), Multi-port Ethernet Communications Card (MPE), Installation & Configuration Instructions, Power Measurement, pp. 1-9, rev. date Jul. 25, 1997.
Nexus 1250/1252 Installation and Operation Manual Revision 1.31, Electro Industries/Gauge Tech, 146 pages, Jan. 21, 2010.
Nexus 1500 Installation and Operation Manual Revision 1.03, Electro Industries/Gauge Tech, 124 pages, Jan. 4, 2010.
Postel, J.B., and Reynolds, J.K. "File Transfer Protocol (FTP)", RFC959, pp. 1-66, Oct. 1985.
Power Platform 4300 Multi-DAQ TASKCard Operator's Manual; Dranetz—BMI, Original Issue—Jul. 2002, pp. 203.
Speirs, "What is binary file?", WhatIs.com, http://whatis.techtarget.com/definition/binary-file, Apr. 2005, 1 pp.
Webopedia, https://web.archive.org/web/20021015112112/http://www.webopedia.com/TERM/F/flat_file_system.html, 2 pp., Oct. 15, 2002.
Xu Hong, Wang Jianhua, "An Extendable Data Engine based on OPC Specification", Computer Standards & Interfaces 26 (2004) 515-525; Dec. 5, 2003.

* cited by examiner

SYSTEM AND METHOD FOR PERFORMING DATA TRANSFERS IN AN INTELLIGENT ELECTRONIC DEVICE

BACKGROUND

Field

The present disclosure relates generally to intelligent electronic devices (IEDs) and, in particular, to a system and method for sending/receiving data to/from intelligent electronic devices (IEDs) at high speeds over a network.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

Conventional IEDs include the ability to communicate with remote computing systems. Traditionally, IEDs would transfer data using serial based download commands. These commands would be accessed via an RS232, and RS485 or an Ethernet port encapsulating the serial request with an Ethernet message using any Ethernet protocol such as HTTP or TCP/IP. For instance, host software or a "master" would make a request for a set of data from one or more memory registers in an IED slave. At that point, the IED slave would then communicate the data stored in the memory registers back to the host software utilizing a serial transfer. This technology is inherently limited because host software traditionally is limited by the amount of memory registers that it would be able to accept at any one time. For example, if the serial based protocol is Modbus, a recognized industry standard protocol, most software master systems are limited by the protocol definition to 256 bytes of data that can be transferred at any one time. Thus, to pull large amount of data, many such requests would have to be sent to the IED or meter repeatedly. This would create many delays due to processing and data traffic.

SUMMARY

In accordance with embodiments of the present disclosure, there are provided herein methods and systems for improving data transfer from an intelligent electronic device (IED) to external devices, such as servers, PC clients, etc., via a network interface.

According to one aspect of the present disclosure, an intelligent electronic device for responding to user data and information requests regarding power usage and power quality for any metered point within a power distribution system is provided. The intelligent electronic device includes a first network interface configured to receive one of a client side information request, data request or configuration request, process the request in accordance with one or more network protocols and forward the request to a second network interface, via a network socket interface translator. The intelligent electronic device further including a network socket interface translator coupled to the first network interface and configured to translate management signals between a network interface model of the first network interface and a network interface model of the second network interface to facilitate the transfer of data to/from the electric power meter and a client device, and forward the requests from the first network interface to the second network interface. The intelligent electronic device further including a collection of protocol routines coupled to the network socket interface translator via the second network interface, the protocol routines configured to process the client side data requests by identifying the request as one of said information request, data request and configuration request, construct an internal data request in the case where the request is identified as one of a data request or a configuration request, and forward the internal data request to a data interface. The data interface is coupled to the protocol routines and configured to receive the internal data request, translate the internal data request from a protocol routine format to a native database format, request data from a native database according to the request. The intelligent electronic device further including a native database coupled to the data interface and configured to receive the data request from the data interface, retrieve the requested data from a measuring unit of the electric power meter, and forward the requested data to a requesting client via the data interface, protocol routines, network socket interface translator and network interface.

The present disclosure further provides a method for responding to user data and information requests regarding power usage and power quality for any metered point within a power distribution system. The method includes the steps of receiving a client side request at a first network interface; forwarding the request to a second network interface via a network socket interface; translating management signals between a network interface model of the first network interface and a network interface model of the second network interface, processing the requests including identifying the request as one of an information request, a data request or a configuration request, constructing an internal data request where the request is identified as one of a data request or a configuration request, forwarding the internal data request to a data interface, translating the internal data request from a protocol routine format to a native database format, forwarding the translated request to a native database, retrieving the requested data by the native database from a measuring unit of the electric power meter, and forwarding the requested data to a client device.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
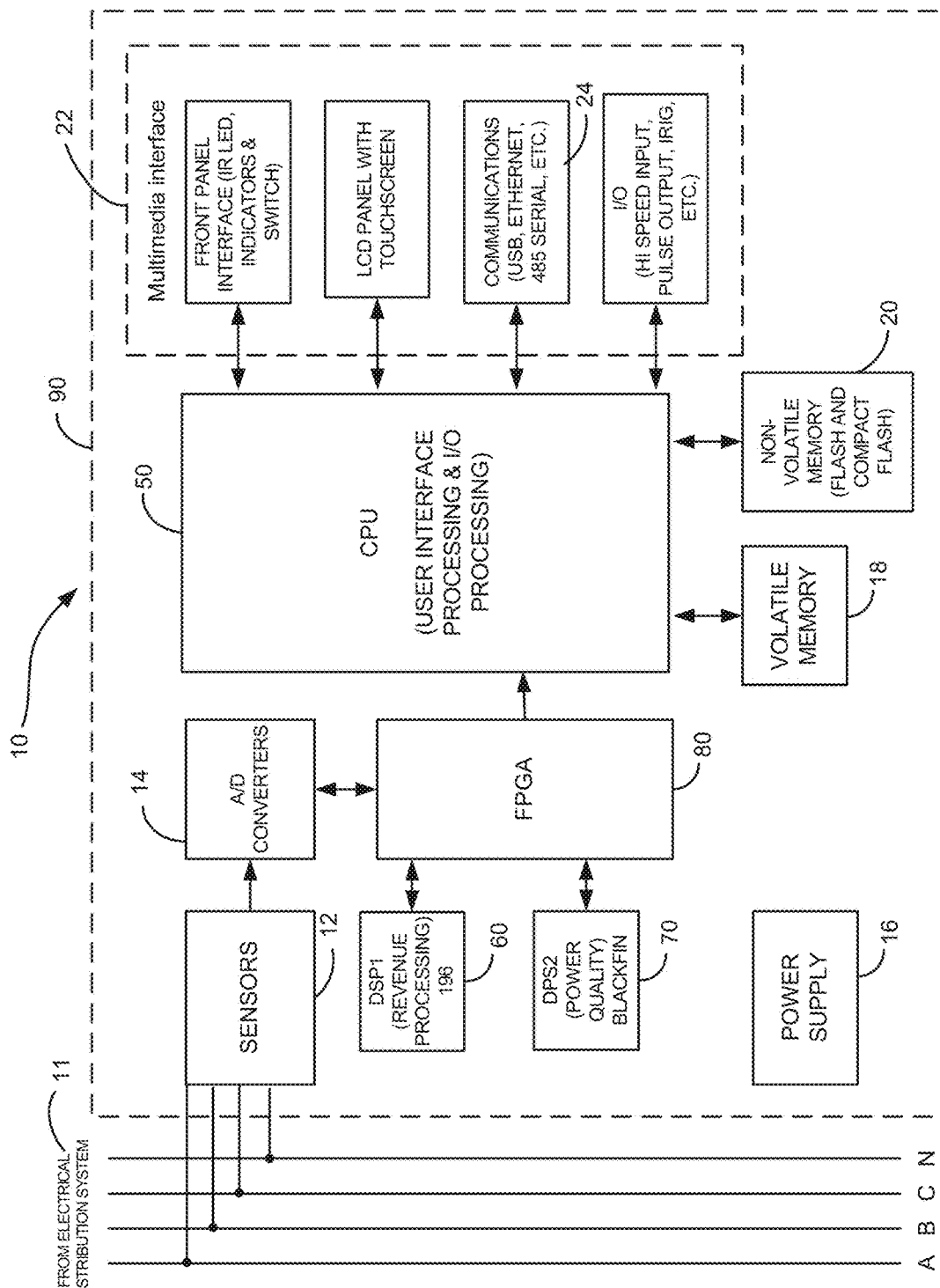
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (A/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processor 60. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A-2H.

The plurality of sensors 12 sense electrical parameters, e.g., voltage and current, on incoming lines, (i.e., phase A, phase B, phase C, neutral N), from an electrical power distribution system 11 e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alphanumeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. application Ser. No. 11/589,381, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft Windows Media Video files (.wmv), Microsoft Photo Story files (.asp, Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 10 further comprises a volatile memory 18 and a non-volatile memory 20. In addition to storing audio and/or video files, volatile memory 18 will store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 24, also know as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 will perform its functionality by hardwired and/or wireless connectivity. The hardwire connection may include but is not limited to hard wire cabling e.g., parallel or serial cables, RS232, RS485, USB cable, Firewire (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
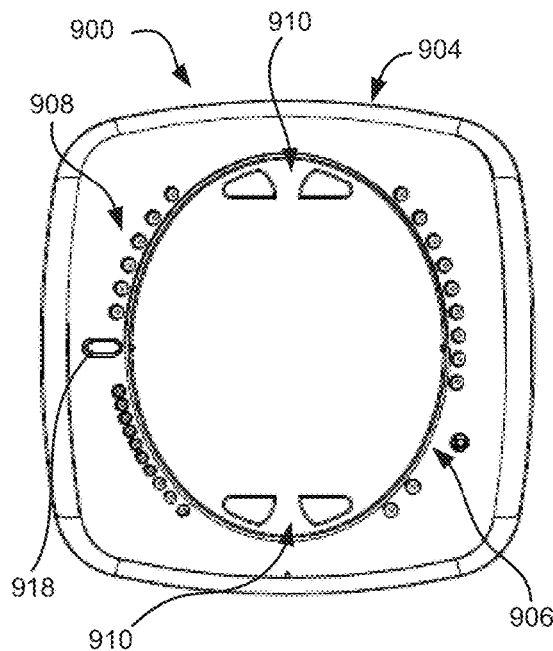
FIGS. 2A-2H illustrate exemplary form factors for an intelligent electronic device (IED) in accordance with an embodiment of the present disclosure.
Figure 2B:
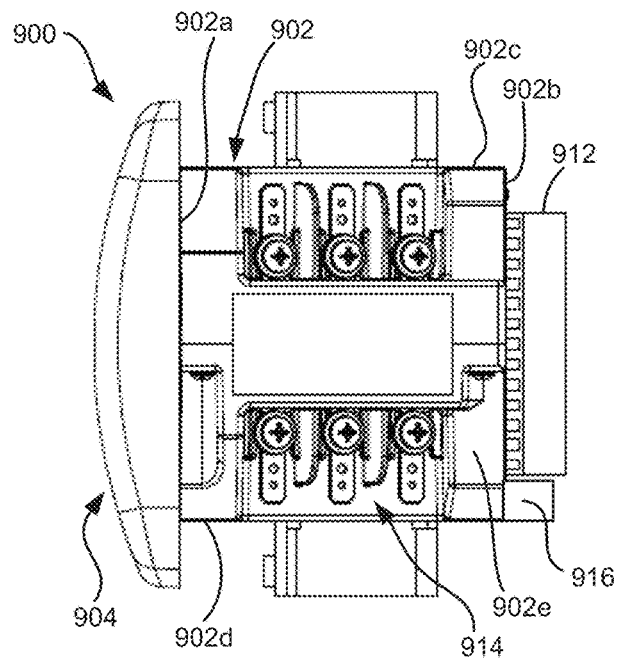

Furthermore, it is to be appreciated that the components and devices of the IED 10 of FIG. 1 may be disposed in various housings depending on the application or environment. For example, the IED 10 may be configured as a panel meter 900 as shown in FIGS. 2A and 2B. The panel meter 900 of FIGS. 2A and 2B is described in more detail in commonly owned U.S. Pat. No. 7,271,996, the contents of which are hereby incorporated by reference. As seen in FIGS. 2A and 2B, the IED 900 includes a housing 902 defining a front surface 902a, a rear surface 902b, a top surface 902c, a bottom surface 902d, a right side surface 902e, and a left side surface (not shown). Electrical device 900 includes a face plate 904 operatively connected to front surface 902a of housing 902. Face plate 904 includes displays 906, indicators 908 (e.g., LEDs and the like), buttons 910, and the like providing a user with an interface for visualization and operation of electrical device 100. For example, as seen in FIG. 2A, face plate 904 of electrical device 900 includes analog and/or digital displays 906 capable of producing alphanumeric characters. Face plate 904 includes a plurality of indicators 908 which, when illuminated, indicate to the user the "type of reading", the "% of load bar", the "parameter designation" which indicates the reading which is being displayed on displays 906, a "scale selector" (e.g., Kilo or Mega multiplier of Displayed Readings), etc. Face plate 904 includes a plurality of buttons 910 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 902 includes voltage connections or inputs 912 provided on rear surface 902*b* thereof, and current inputs 914 provided along right side surface 902*e* thereof. The IED 900 may include a first interface or communication port 916 for connection to a master and/or slave device. Desirably, first communication port 916 is situated in rear surface 902*b* of housing 902. IED 900 may also include a second interface or communication port 918 situated on face plate 904.

Figure 2C:
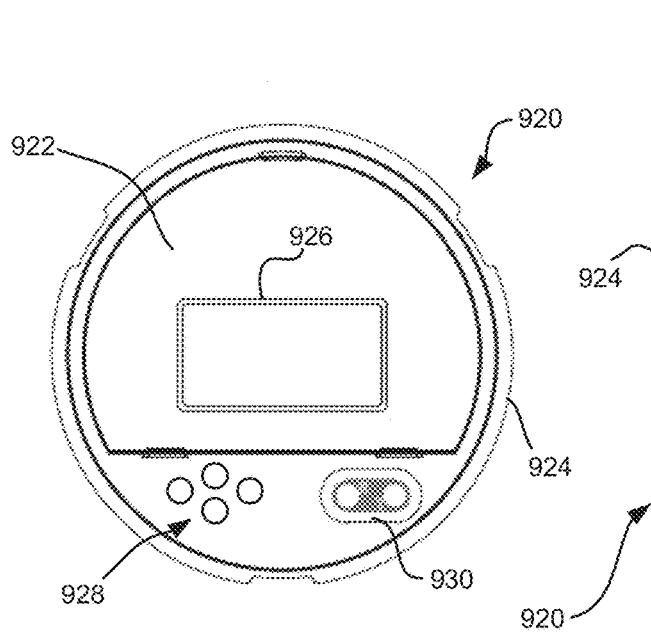
Figure 2D:
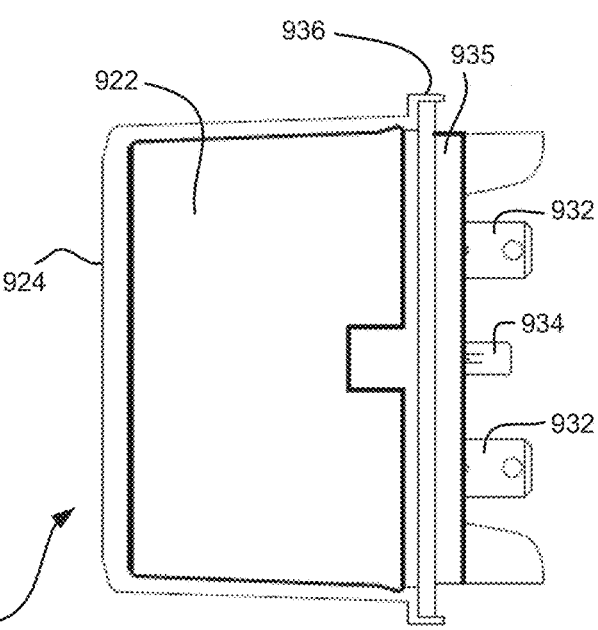

In other embodiment, the IED 10 may be configured as a socket meter 920, also known as a S-base type meter or type S meter, as shown in FIGS. 2C an 2D. The socket meter 920 of FIGS. 2C and 2D is described in more detail in commonly owned application Ser. No. 12/578,062 (U.S. Publication No. 2010/0090680), the contents of which are hereby incorporated by reference. Referring to FIGS. 2C and 2D, the meter 920 includes a main housing 922 surrounded by a cover 924. The cover 924 is preferably made of a clear material to expose a display 926 disposed on the main body 922. An interface 928 to access the display and a communication port 930 is also provided and accessible through the cover 924. The meter 920 further includes a plurality of current terminals 932 and voltage terminals 934 disposed on backside of the meter extending through a base 935. The terminals 932, 934 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 936 is used as a seal between the meter 920 and/or cover 924 and the meter socket to prevent removal of the meter and to indicate tampering with the meter.

Figure 2E:
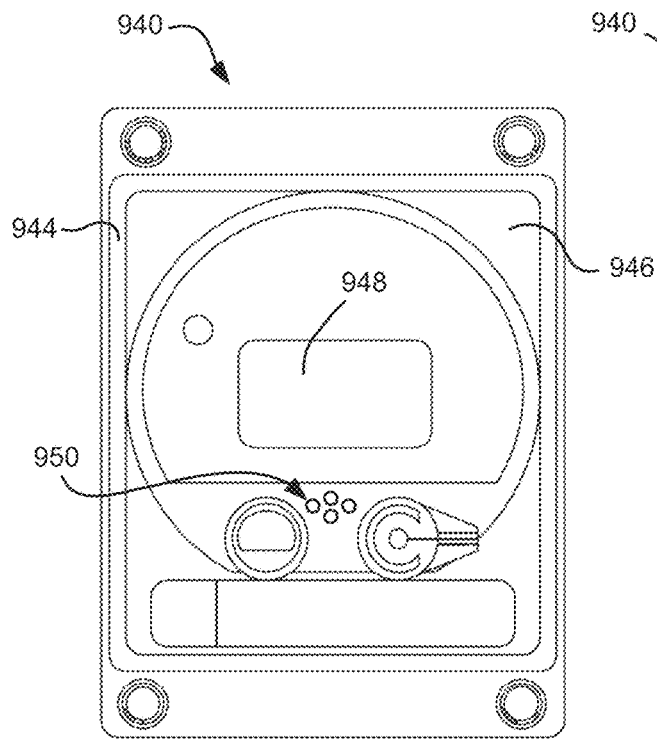
Figure 2F:
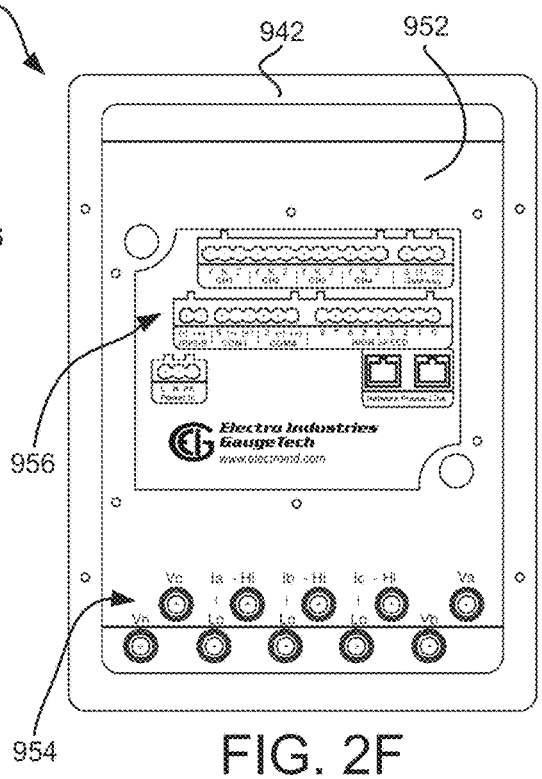

In a further embodiment, the IED 10 of FIG. 1 may be disposed in a switchboard or draw-out type housing 940 as shown in FIGS. 2E and 2F, where FIG. 2E is a front view and FIG. 2F is a rear view. The switchboard enclosure 942 usually features a cover 944 with a transparent face 946 to allow the meter display 948 to be read and the user interface 950 to be interacted with by the user. The cover 944 also has a sealing mechanism (not shown) to prevent unauthorized access to the meter. A rear surface 952 of the switchboard enclosure 942 provides connections for voltage and current inputs 954 and for various communication interfaces 956. Although not shown, the meter disposed in the switchboard enclosure 942 may be mounted on a draw-out chassis which is removable from the switchboard enclosure 942. The draw-out chassis interconnects the meter electronics with the electrical circuit. The draw-out chassis contains electrical connections which mate with matching connectors 954, 956 disposed on the rear surface 952 of the enclosure 942 when the chassis is slid into place.

Figure 2G:
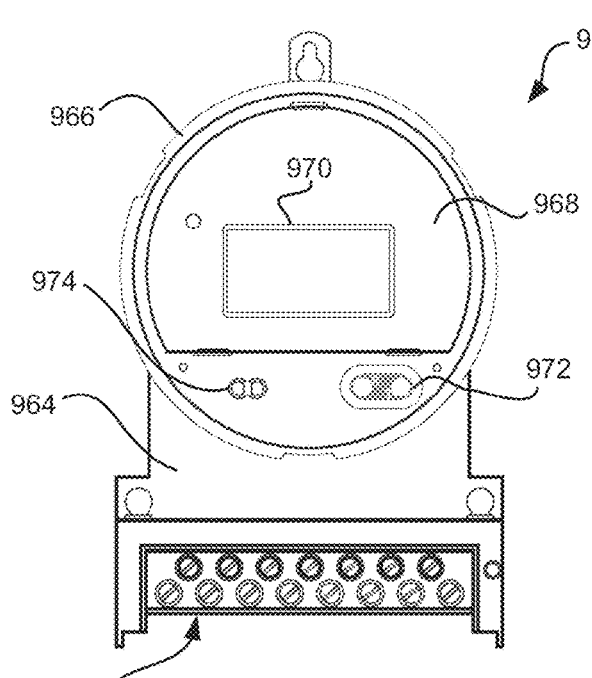
Figure 2H:
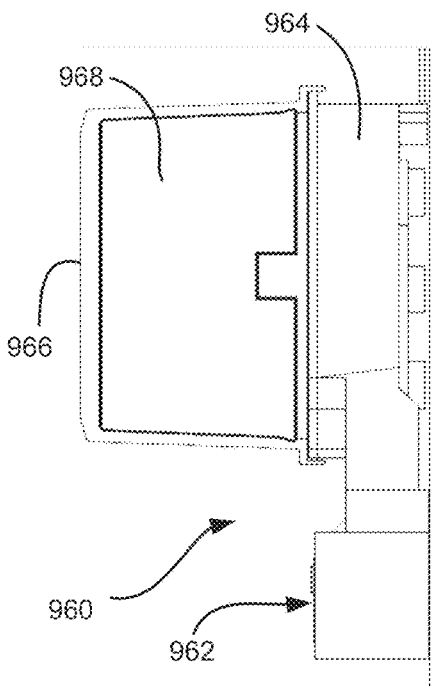

In yet another embodiment, the IED 10 of FIG. 1 may be disposed in an A-base or type A housing as shown in FIGS. 2G and 2H. A-base meters 960 feature bottom connected terminals 962 on the bottom side of the meter housing 964. These terminals 962 are typically screw terminals for receiving the conductors of the electric circuit (not shown). A-base meters 960 further include a meter cover 966, meter body 968, a display 970 and input/output means 972. Further, the meter cover 966 includes an input/output interface 974. The cover 966 encloses the meter electronics 968 and the display 970. The cover 966 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
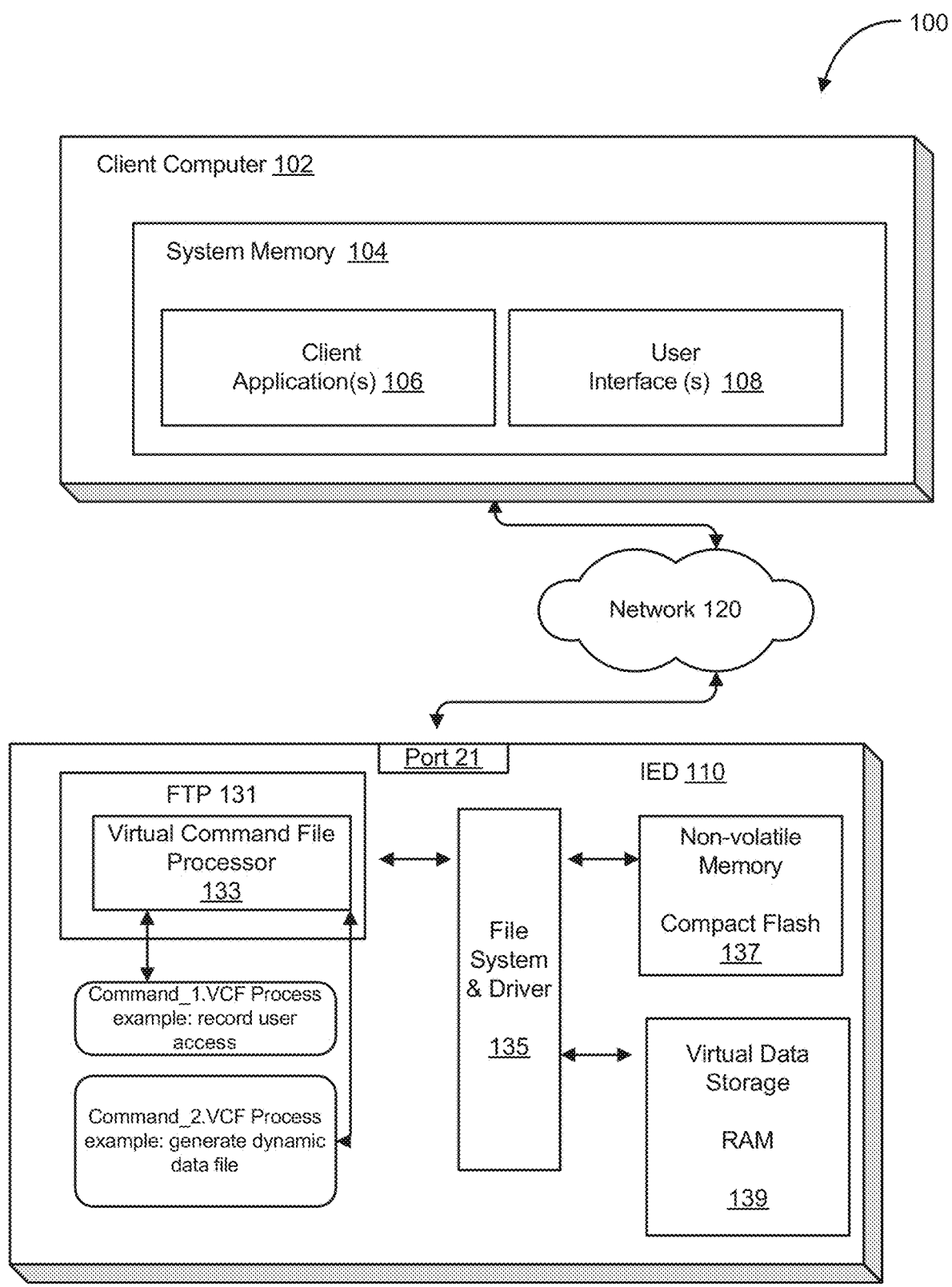
FIG. 3 illustrates an environment in which the present disclosure may be utilized.

FIG. 3 illustrates an exemplary environment 100 in which the present disclosure may be practiced. The network 120 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite, however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 110 may communicate using the network 120 as will be hereinafter discussed.

It is to be appreciated that are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (and that's not counting multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX— that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system is a standard PC that is running an OS such as Windows. Current OSes contain client software that enables the client computers to access the resources that servers share. Older OSes, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in client/server versus peer-to-peer networks, it is only the logical organization, management and control of the network that varies.

The PC client 102 may comprise any computing device, such as a server, mainframe, workstation, personal computer, hand held computer, laptop telephony device, network appliance, other IED, Programmable Logic Controller, Power Meter, Protective Relay etc. The PC client 102 includes system memory 104, which may be implemented in volatile and/or non-volatile devices. One or more client applications 106 which may execute in the system memory 104 is provided. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". Additionally, user interfaces 108 may be included for displaying system configuration, retrieved data and diagnostics associated with the IED 110.

The intelligent electronic device (IED) 110, in one embodiment, is comprised of at least an FTP Server 131 including a Virtual Command File Processor 133, a File System and Driver 135, a non-volatile memory 137 and a virtual data store 139. Of course, the IED 110 may contain other hardware/software for performing functions associated with the IED, however, these functions are not relevant to the present application and will therefore not be further discussed.

IED 110 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as a Modbus TCP handler, can run on IED 110 concurrently with the FTP Server 131. This also means that multiple FTP connections can be made with the only limitation being the system's available resources.

The FTP Server 131 provides access to the file system 135 of the IED 110 on the standard FTP port (port 21). When a connection is made, PC client 102 sends a FTP logon sequence, which includes a USER command and a PASS command. The PC client 102 then interacts with the IED 110, requesting information and writing files, ending in a logout.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, Logs, settings, and configuration, more suitable to be stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (49152-65535), sends the FTP server the dynamic port number on which it is listening over the control stream and waits for a connection from the FTP server. When the FTP server initiates the data connection to the FTP client it binds the source port to port 21 on the FTP server.

To use active mode, the client sends a PORT command, with the IP and port as argument. The format for the IP and port is "h1, h2, h3, h4, p1, p2". Each field is a decimal representation of 8 bits of the host IP, followed by the chosen data port. For example, a client with an IP of 192.168.0.1, listening on port 49154 for the data connection will send the command "PORT 192, 168, 0, 1, 192, 2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case, the FTP client binds the source port of the connection to a dynamic port between 49152 and 65535.

To use passive mode, the client sends the PASV command to which the server would reply with something similar to "227 Entering Passive Mode (127, 0, 0, 1, 192, 52)". The syntax of the IP address and port are the same as for the argument to the PORT command.

In extended passive mode, the FTP server operates exactly the same as passive mode, however it only transmits the port number (not broken into high and low bytes) and the client is to assume that it connects to the same IP address that was originally connected to.

The objectives of FTP are to promote sharing of files (computer programs and/or data), to encourage indirect or implicit use of remote computers, to shield a user from variations in file storage systems among different hosts and to transfer data reliably, and efficiently.

In one embodiment of the present disclosure, the IED 110 has the ability to provide an external PC client 102 with an improved data transfer rate when making data download requests of data stored within an IED. This is achieved by configuring the IED 110 to include an FTP server 131 including a Virtual Command File Processor 133. An improved data transfer rate from the IED 110 may be realized by the external PC client 102 issuing virtual commands to the IED 110. In response, the IED 110 processes the received virtual commands in the Virtual Command File processor 133 to construct FTP commands therefrom to be applied to a novel file system 135 of the IED 110, coupled to the FTP server 131, wherein the novel file system 135 is configured as a PC file structure amenable to receiving and responding to the constructed FTP commands. The Virtual command files and the novel file system 135 are discussed in greater detail in co-pending application Ser. No. 12/061, 979.

While FTP file transfer comprises one embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

Figure 4:
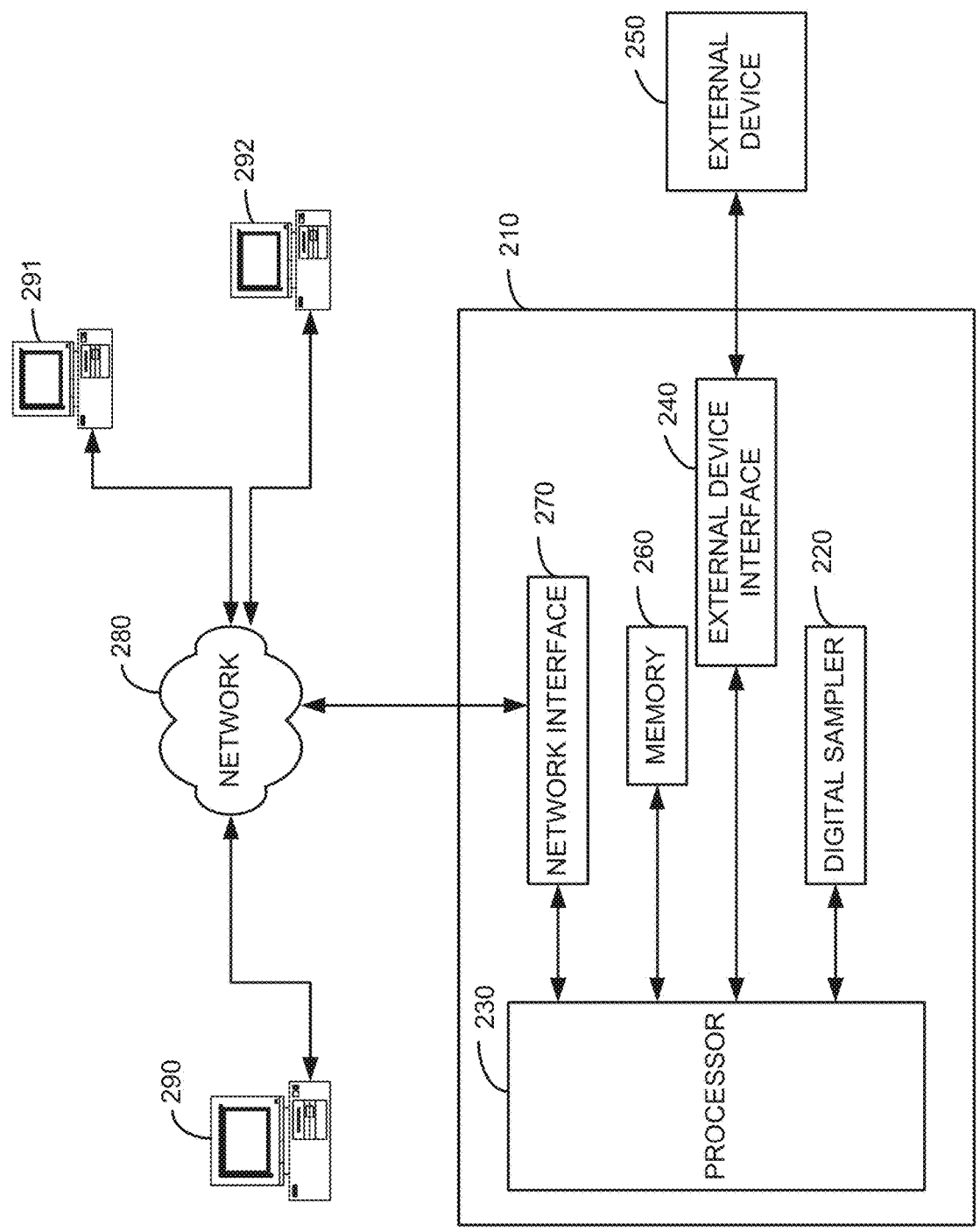
FIG. 4 is a block diagram of a web server power quality and revenue meter, according to an embodiment of the present disclosure.

Portions of U.S. Pat. No. 6,751,563 will be reproduced here. FIG. 4 is a block diagram of a web server power quality and revenue meter 210. The meter is connected to monitor electric distribution power lines (not shown), to monitor voltage and current at the point of connection. Included therein is digital sampler 220 for digitally sampling the voltage and current of the power being supplied to a customer or monitored at the point of the series connection in the power grid. Digital sampler 220 digitally samples the voltage and current and performs substantially similar to the A/D converters 14 described above in relation to FIG. 1. The digital samples are then forwarded to processor 230 for processing. It is to be appreciated that the processor may be a single processing unit or a processing assembly including at least one CPU 50, DSP1 60, DSP2 70 and FPGA 80, or any combination thereof. Also connected to processor 230 is external device interface 240 for providing an interface for external devices 250 to connect to meter 210. These external devices might include other power meters, sub-station control circuitry, on/off switches, etc. Processor 230 receives data packets from digital sampler 220 and external devices 250, and processes the data packets according to user defined or predefined requirements. A memory 260 is connected to processor 230 for storing data packets and program algorithms, and to assist in processing functions of processor 230. These processing functions include the power quality data and revenue calculations, as well as formatting data into different protocols which will be described later in detail. Processor 130 provides processed data to network 280 through network interface 270. Network 280 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter simultaneously. In a like fashion, network interface 270 might be comprised of a modem, cable connection, or other devices that provide formatting functions. Computers 290-292 are shown connected to network 280.

A web server program (web server) is contained in memory 260, and accessed through network interface 270. The web server provides real time data through any known web server interface format. For example, popular web server interface formats consist of HTML and XML formats. The actual format of the programming language used is not essential to the present disclosure, in that any web server format can be incorporated herein. The web server provides a user friendly interface for the user to interact with the meter 210. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The processor 230 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 290-292 through network 280, that connects to meter 210 at the network interface 270. In one embodiment, network interface 270 is an Ethernet interface that supports, for example, 100 base-T or 10 base-T communications. This type of network interface can send and receive data packets between WAN connections and/or LAN connections and the meter 210. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer, and maintenance personnel to simultaneously and interactively monitor and diagnose possible problems with the power service.

Figure 5:
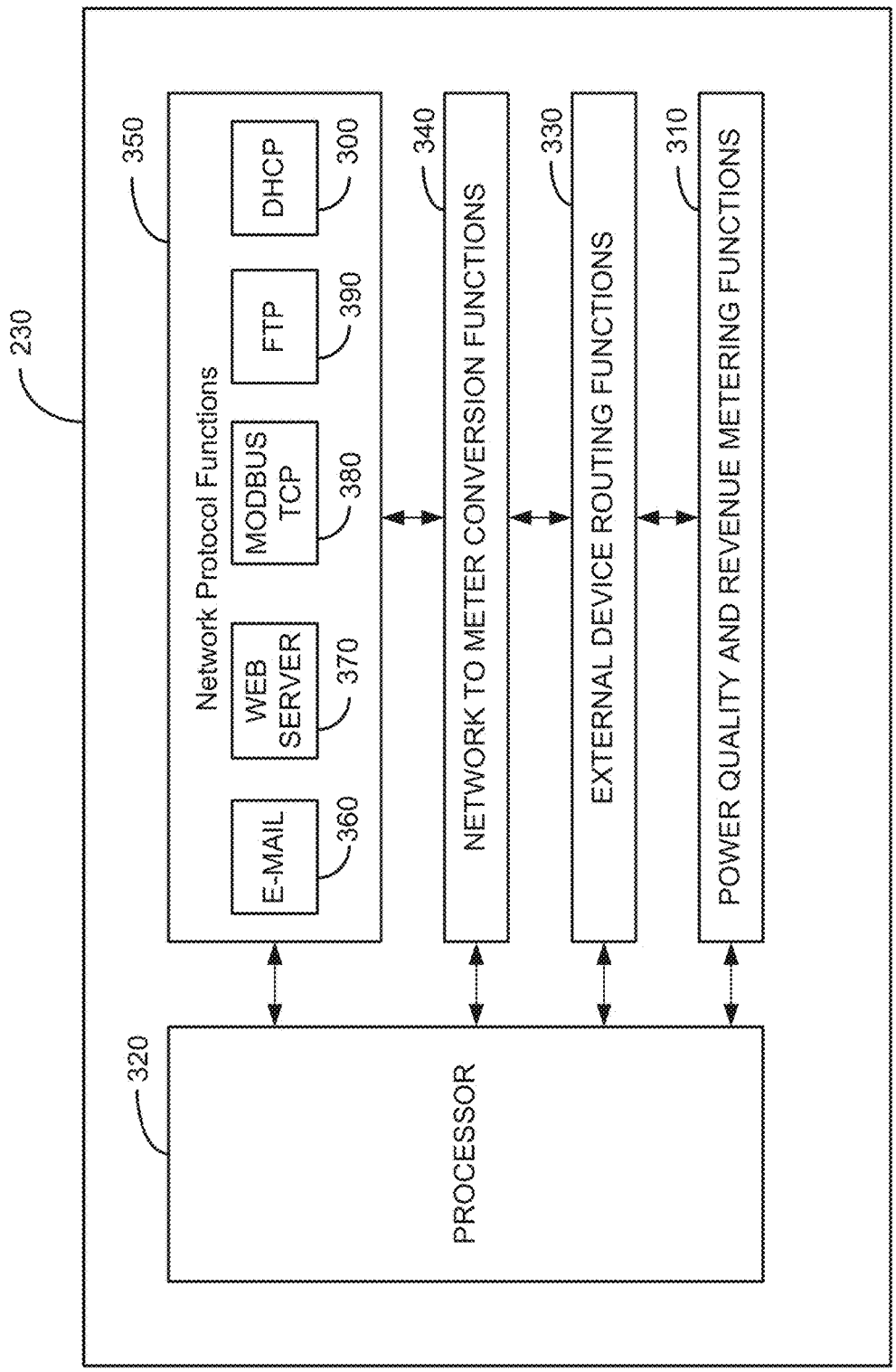
FIG. 5 is a functional block diagram of the processor of the web server power quality and revenue meter system shown in FIG. 4, according to the embodiment of the present invention.

FIG. 5 is a functional block diagram of processor 230 of the web server power quality and revenue meter system according to the embodiment of the present invention. Processor 230 is shown containing four main processing functions. The functions shown are illustrative and not meant to be inclusive of all possible functions performed by processor 230. Power Quality and Revenue Metering functions (metering functions) 310 consists of a complete set of functions which are needed for power quality and revenue metering. Packet data collected by digital sampler 220 is transmitted to processor 230. Processor 230 calculates, for example, power reactive power, apparent power, and power factor. The metering function 310 responds to commands via the network or other interfaces supported by the meter. External Device Routing Functions 330 handle the interfacing between the external device 250 and meter 210. Raw data from external device 250 is fed into meter 210. The external device 250 is assigned a particular address. If more than one external device is connected to meter 210, each device will be assigned a unique particular address. The Network Protocol Functions 350 of meter 210 are executed by processor 230 which executes multiple networking tasks that are running concurrently. As shown in FIG. 5, these include, but are not limited to, the following network tasks included in network protocol functions 350: e-mail 360, web server 370, Modbus TCP 380, FTP 390, and DHCP 300. The e-mail 360 network protocol function can be utilized to send e-mail messages via the network 280 to a user to, for example, notify the user of an emergency situation or if the power consumption reaches a user-set or pre-set high level threshold. As the processor receives packets of data it identifies the network processing necessary for the packet by the port number associated with the packet. The processor allocates the packet to a task as a function of the port number. Since each task is running independently the meter 210 can accept different types of requests concurrently and process them transparently from each other. For example, the web server may be accessed by one user while another user is communicating via Modbus TCP and at the same time a third user may download a log file via FTP. The Network to Meter Protocol Conversion Function 340 is used to format and protocol convert the different network protocol messages to a common format understood by the other functional sections of meter 210. After the basic network processing of the packet of data, any "commands" or data which are to be passed to other functional sections of meter 210 are formatted and protocol converted to a common format for processing by the Network to Meter Protocol Conversion Function 340. Similarly, commands or data coming from the meter for transfer over the network are pre-processed by this function into the proper format before being sent to the appropriate network task for transmission over the network. In addition this function first protocol converts and then routes data and commands between the meter and external devices.

Although the above described embodiments enable users outside of the network the IED or meter is residing on to access the internal memory or server of the IED or meter, IT departments commonly block this access through a firewall to avoid access by dangerous threats into corporate networks. A firewall is a system designed to prevent unauthorized access to or from a private network, e.g., an internal network of a building, a corporate network, etc. Firewalls can be implemented in both hardware and software, or a combination of both. Firewalls are frequently used to prevent unauthorized Internet users from accessing private networks connected to the Internet, especially intranets. All messages entering or leaving the intranet pass through the firewall, which examines each message and blocks those that do not meet the specified security criteria. A firewall may employ one or more of the following techniques to control the flow of traffic in and of the network it is protecting: 1) packet filtering: looks at each packet entering or leaving the network and accepts or rejects it based on user-defined rules; 2) Application gateway: applies security mechanisms to specific applications, such as FTP and Telnet servers; 3) Circuit-level gateway: applies security mechanisms when a TCP or UDP connection is established, once the connection has been made, packets can flow between the hosts without further checking; 4) Proxy server: intercepts all messages entering and leaving the network, effectively hides the true network addresses; and 5) Stateful inspection: doesn't examine the contents of each packet but instead compares certain key parts of the packet to a database of trusted information; if the comparison yields a reasonable match, the information is allowed through; otherwise, it is discarded. Other techniques and to be developed techniques are contemplated to be within the scope of the present disclosure.

In one embodiment, the present disclosure provides for overcoming the problem of not being allowed firewall access to an IED or meter installed within a facility, i.e., the meter is residing on a private network, by enabling an IED to initiate one way communication through the firewall. In this embodiment, the IED or meter posts the monitored and generated data on an Internet site external to the corporate or private network, i.e., on the other side of a firewall. The benefit is that any user would be able to view the data on any computer or web enabled smart device without having to pierce or bypass the firewall. Additionally, there is a business opportunity to host this data on a web server and charge a user a monthly fee for hosting the data. The features of this embodiment can be incorporated into any telemetry application including vending, energy metering, telephone systems, medical devices and any application that requires remotely collecting data and posting it on to a public Internet web site.

Figure 6:
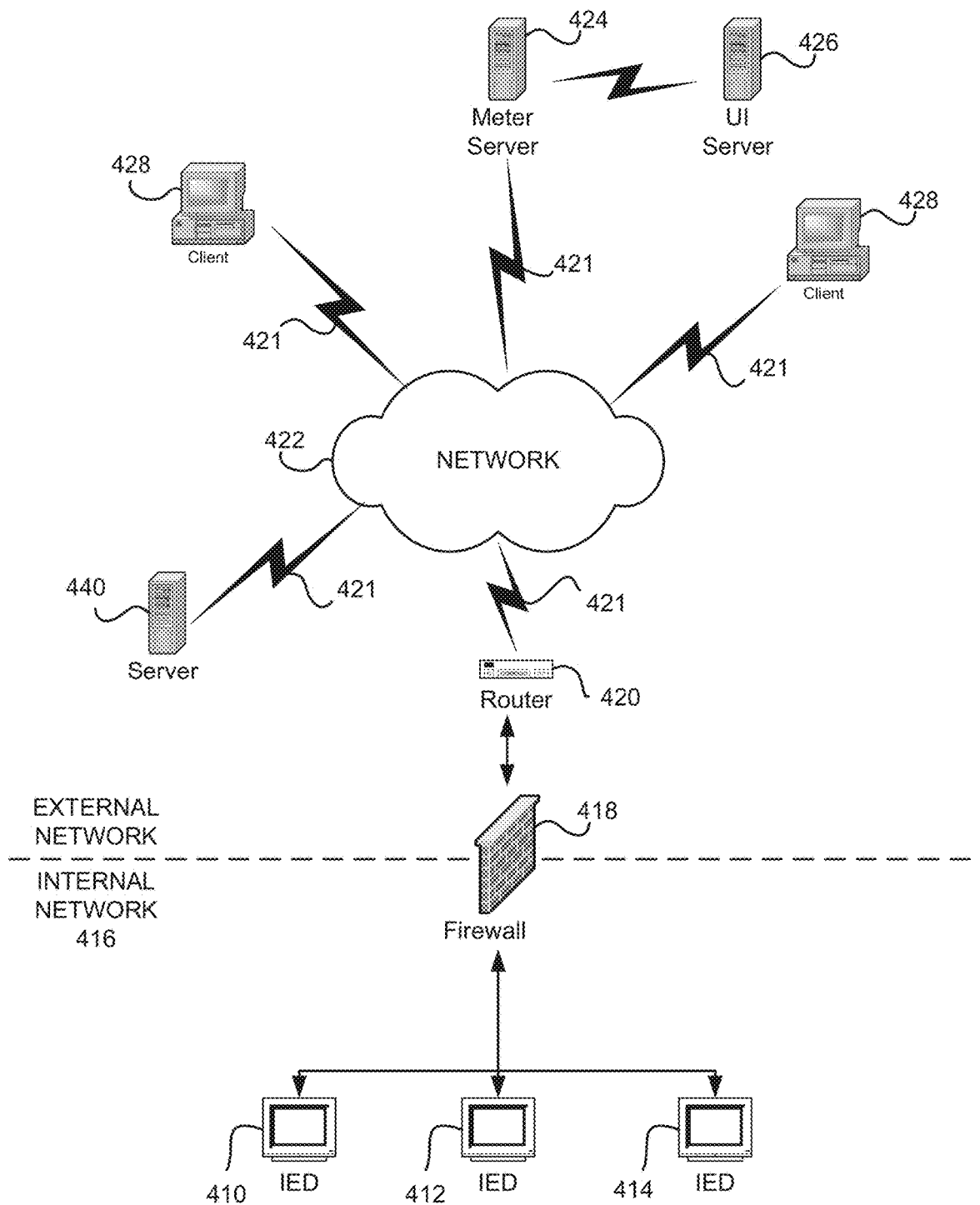
FIG. 6 illustrates another environment in which the present disclosure may be utilized.

In one embodiment, the IED or metering device will communicate through the firewall using a protocol such as HTTP via a port that is open through the firewall. Referring to FIG. 6, IEDs or meters 410, 412 414 reside on an internal network 416, e.g., an intranet, private network, corporate network, etc. The internal network 416 is coupled to an external network 422, e.g., the Internet, via a router 420 or similar device over any known hardwire or wireless connection 421. A firewall 418 is disposed between the internal network 416 and external network 422 to prevent unauthorized access from outside the internal network 416 to the IEDs or meters 410, 412, 414. Although the firewall 418 is shown between the internal network 416 and the router 420, it is to be appreciated that other configurations are possible, for example, the firewall 418 being disposed between the router 420 and external network 422. In other embodiments, the firewall 418 and router 420 may be configured as a single device. It is further to be appreciated that firewall 418 can be implemented in both hardware and software, or a combination of both.

The communication device or network interface of the meter (as described above in relation to FIG. 1) will communicate through the firewall 418 and read a web site or meter server 424. It is to be appreciated that the one way communication from the IED through the firewall may be enabled by various techniques, for example, by enabling outbound traffic to the IP address or domain name of the server 424 or by using a protocol that has been configured, via the firewall settings, to pass through the firewall such as HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol), Telnet, etc. Alternatively, the IED may have exclusive access to a particular port on the firewall, which is unknown to other users on either the internal or external network. Other methods or techniques are contemplated, for example, e-mail, HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

The server 424 will provide instructions in computer and/or human readable format to the IED or meter. For instance, the web server 424 might have XML tags that state in computer readable format to provide data for the last hour on energy consumption by 15 minute intervals. The meter 410, 412, 414 will then read those instructions on that web server 424 and then post that data up on the server 424. In this manner, the IED or meter initiates communication in one direction, e.g., an outbound direction, to the server 424.

Another server (or can be in one server) will read the data that the meter 410, 412, 414 posts and will format the meter data into data that can be viewed for humans on a web site or a software application, i.e., UI Server 426. Servers 424, 426 can also store the data in a database or perform or execute various control commands on the data. Clients 428 may access the IED data stored or posted on servers 424, 426 via a connection to the network 422.

Since the meters are only communicating in an outbound direction only, the meters 410, 412, 414 can read data or instructions from an external network application (e.g., server 424), the external network application cannot request information directly from the meter. The server 424 posts the data or instructions on the web site and waits for the meter to check the site to see if there has been a new post, i.e., new instructions for the meter. The meter can be programmed at the user's discretion as to frequency for which the meter 410, 412, 414 exits out to the external network to view the postings.

The meter instruction server 424 will post instructions in a directory programmed/located on the server or into XML or in any fashion that the meter is configured to understand and then the meter will post whatever data it is instructed to do. The meter can also be configured to accomplish control commands. In addition to the meter instruction server 424, a user interface (UI) server 426 is provided that can be used to enable a user interface to the user. The user can provide input on the UI server 426 that might trigger the meter instruction server 424 to produce a message to control the energy next time the meter reads that server.

Figure 7:
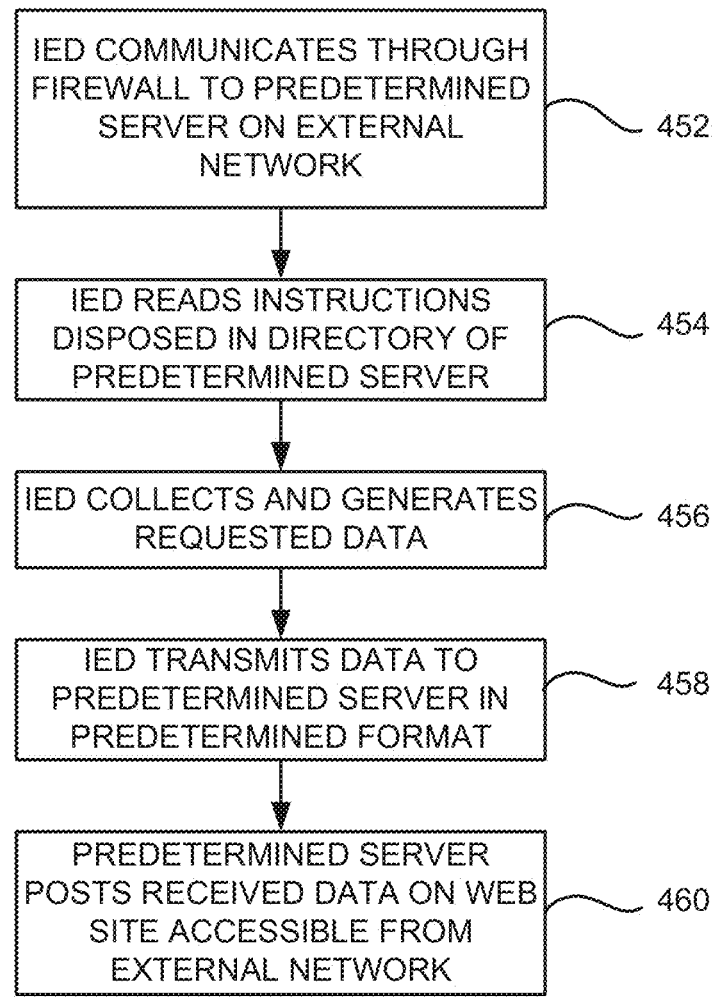
FIG. 7 is a flow chart illustrating a method for communicating data from an IED on an internal network to a server on an external network through a firewall.

Referring to FIG. 7, a method for communicating data from an IED on an internal network to a server on an external network through a firewall is illustrated. In step 452, the IED 410 communicates through the firewall 418 to a predetermined server 424 on an external network 422. The IED 410 may be programmed to periodically communicate to the server at predefined intervals. During this communication session, the IED 410 reads instructions disposed in a directory or folder on the predetermined server 424, step 454. Next, in step 456, the IED 410 collects data from its internal memory or generates data based on the read instructions. The IED 410 then transmits the data to the server 424 in a predetermined format, e.g., XML, CSV, etc., step 458. In step 460, the predetermined server 424 posts the received data on a web site accessible from the external network 422. The data may be posted on the server 424 or a UI (user interface) server 426 configured to provide data for end users, e.g., clients 428. It is to be appreciated that the UI server 426 may be configured to post data from several locations in one convenient interface for, for example, an organization managing the several locations. A provider of the servers 424, 426 may charge a fee to the end user for the hosting of the web site and providing the data in a convenient and accessible format.

Figure 8:
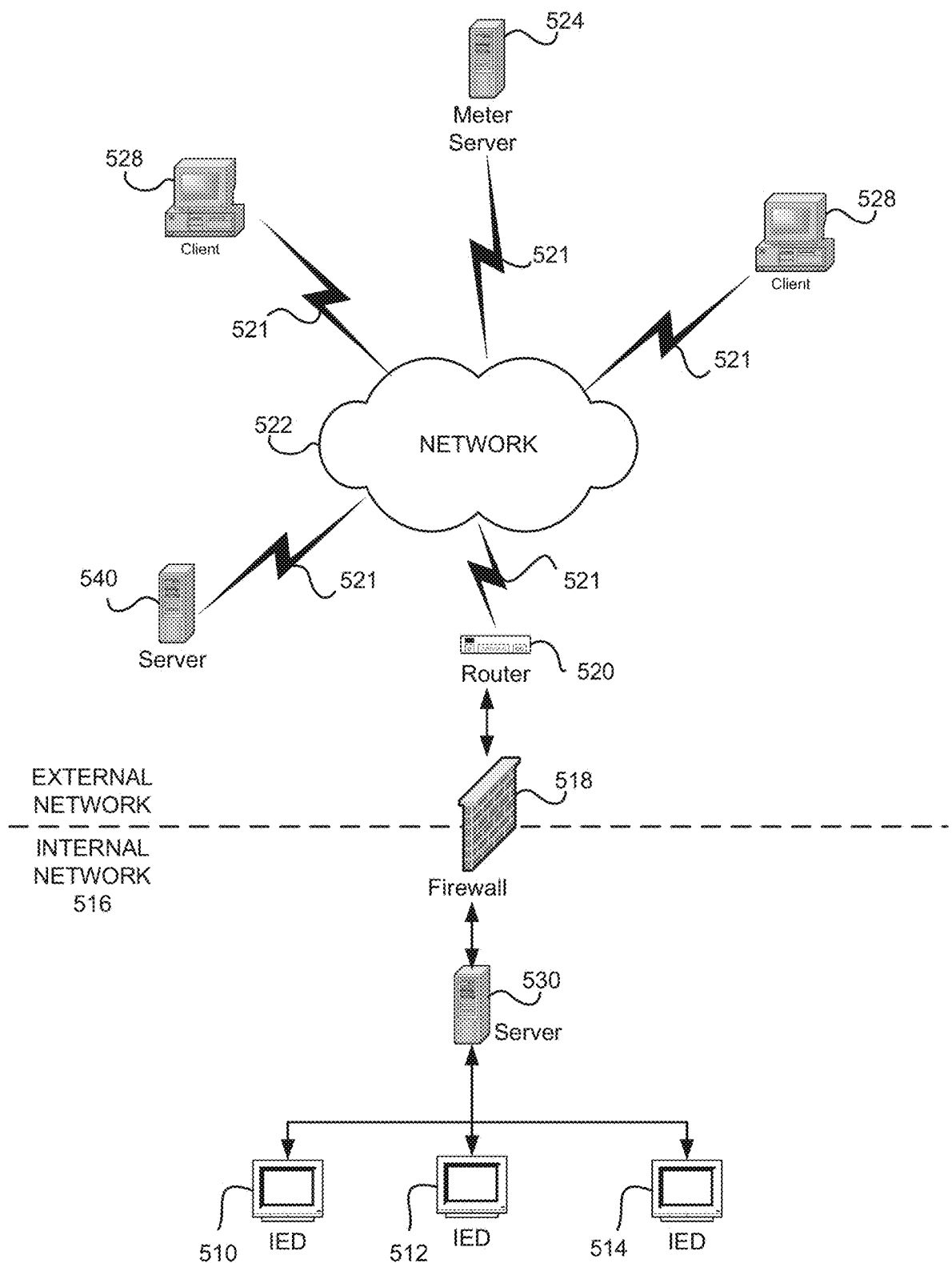
FIG. 8 illustrates yet another environment in which the present disclosure may be utilized.

In another embodiment, the IED or metering device will communicate through the firewall using a server 530 disposed on an internal network protected by a firewall. Referring to FIG. 8, IEDs or meters 510, 512 514 reside on an internal network 516, e.g., an intranet, private network, corporate network, etc. The internal network 516 is coupled to an external network 522, e.g., the Internet, via a router 520 or similar device over any known hardwire or wireless connection 521. A firewall 518 is disposed between the internal network 516 and external network 522 to prevent unauthorized access from outside the internal network 516 to the IEDs or meters 510, 512, 514. Although the firewall 518 is shown between the internal network 516 and the router 520, it is to be appreciated that other configurations are possible, for example, the firewall 518 being disposed between the router 520 and external network 522. In other embodiments, the firewall 518 and router 520 may be configured as a single device. It is further to be appreciated that firewall 518 can be implemented in both hardware and software, or a combination of both.

In this embodiment, server 530 aggregates data from the various IEDs 510, 512, 514 coupled to the internal or private network 516. Since the server 530 and the IEDs 510, 512, 514 are all on the same side of the firewall 518, generally communications and data transfers among the server 530 and the IEDs 510, 512, 514 are unrestricted. Server 530 then communicates or transfers the data from the IEDs to server 524 on the external network on the other side of the firewall 518. The communication between servers 530 and 524 may be accomplished by any one of the communication means or protocols described in the present disclosure. The server 524 then posts the data from the IEDs 510, 512, 514 making the data accessible to clients 528 on the external network, as described above.

Figure 9:
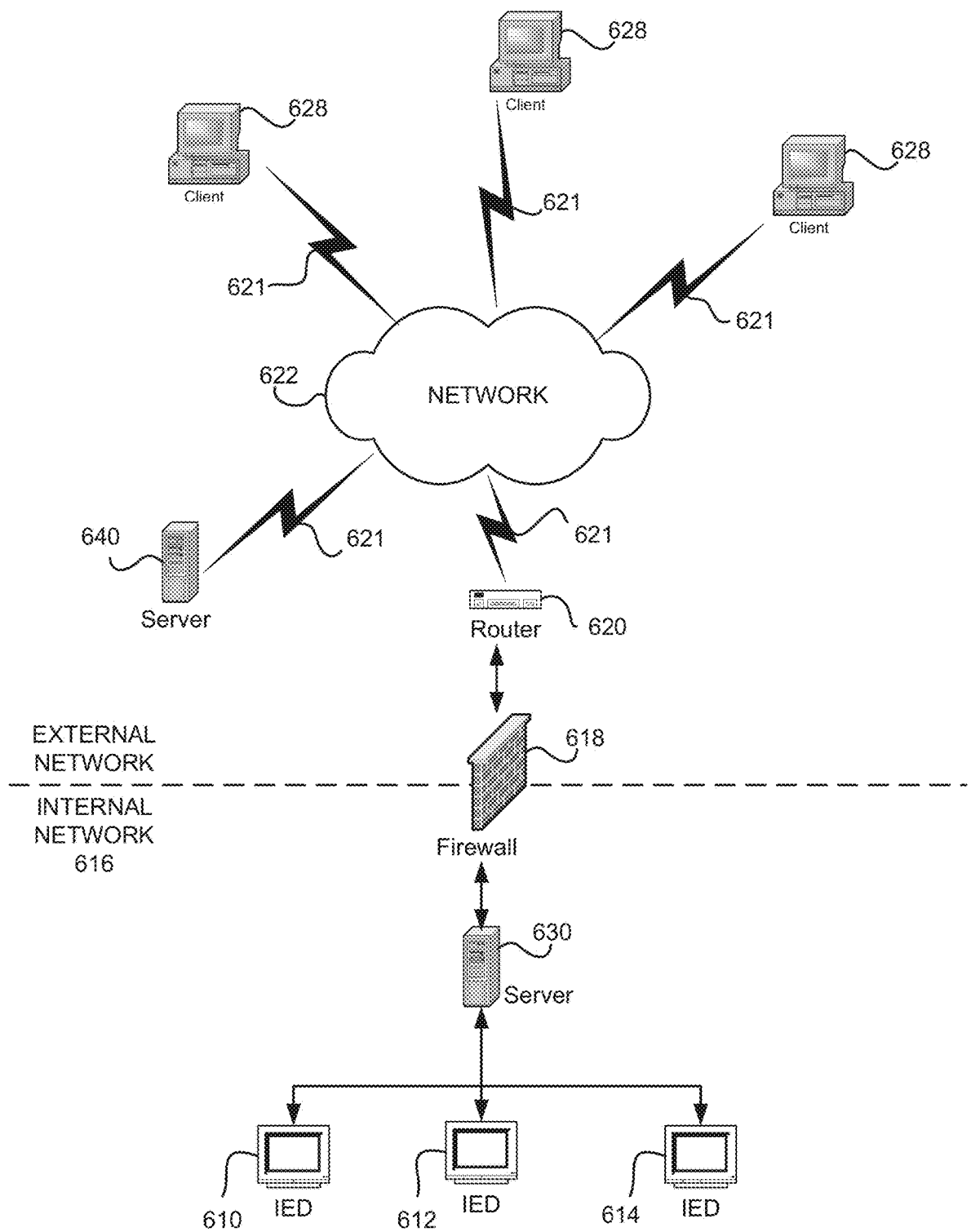
FIG. 9 illustrates a further environment in which the present disclosure may be utilized.

In a further embodiment, the IED or metering device will communicate through the firewall using a server 630 disposed on an internal network protected by a firewall. Referring to FIG. 9, IEDs or meters 610, 612 614 reside on an internal network 616, e.g., an intranet, private network, corporate network, etc. The internal network 616 is coupled to an external network 622, e.g., the Internet, via a router 620 or similar device over any known hardwire or wireless connection 621. A firewall 618 is disposed between the internal network 516 and external network 622 to prevent unauthorized access from outside the internal network 616 to the IEDs or meters 610, 612, 614. Although the firewall 618 is shown between the internal network 616 and the router 620, it is to be appreciated that other configurations are possible, for example, the firewall 618 being disposed between the router 620 and external network 622. In other embodiments, the firewall 618 and router 620 may be configured as a single device. It is further to be appreciated that firewall 618 can be implemented in both hardware and software, or a combination of both.

In this embodiment, server 630 aggregates data from the various IEDs 610, 612, 614 coupled to the internal or private network 616. Since the server 630 and the IEDs 610, 612, 614 are all on the same side of the firewall 618, generally communications and data transfers among the server 630 and the IEDs 610, 612, 614 are unrestricted. Server 630 then communicates or transfers the data from the IEDs to clients 628 on the external network on the other side of the firewall 618. The communication between server 630 and clients 628 may be accomplished by any one of the communication means or protocols described in the present disclosure.

In another embodiment, each IED 610, 612, 614 may be configured to act as a server to perform the functionality described above obviating the need for server 630.

Further more in another embodiment, each IED 610, 612, 614 and each client device 628 may be configured as a server to create a peer-to-peer network, token ring or a combination of any such topology.

The systems and methods of the present disclosure may utilize one or more protocols and/or communication techniques including, but not limited to, e-mail, File Transfer Protocol (FTP), HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

In one non-limiting embodiment, each IED sends data to a recipient via electronic mail, also known as email or e-mail. An Internet email message consists of three components, the message envelope, the message header, and the message body. The message header contains control information, including, minimally, an originator's email address and one or more recipient addresses. Usually descriptive information is also added, such as a subject header field and a message submission date/time stamp. Network-based email was initially exchanged on the ARPANET in extensions to the File Transfer Protocol (FTP), but is now carried by the Simple Mail Transfer Protocol (SMTP), first published as Internet standard 10 (RFC 821) in 1982. In the process of transporting email messages between systems, SMTP communicates delivery parameters using a message envelope separate from the message (header and body) itself. Messages are exchanged between hosts using the Simple Mail Transfer Protocol with software programs called mail transfer agents (MTAs); and delivered to a mail store by programs called mail delivery agents (MDAs, also sometimes called local delivery agents, LDAs). Users can retrieve their messages from servers using standard protocols such as POP or IMAP, or, as is more likely in a large corporate environment, with a proprietary protocol specific to Novell Groupwise, Lotus Notes or Microsoft Exchange Servers. Webmail interfaces allow users to access their mail with any standard web browser, from any computer, rather than relying on an email client. Programs used by users for retrieving, reading, and managing email are called mail user agents (MUAs). Mail can be stored on the client, on the server side, or in both places. Standard formats for mailboxes include Maildir and mbox. Several prominent email clients use their own proprietary format and require conversion software to transfer email between them. Server-side storage is often in a proprietary format but since access is through a standard protocol such as IMAP, moving email from one server to another can be done with any MUA supporting the protocol.

In one embodiment, the IED composes a message using a mail user agent (MUA). The IED enters the email address of a recipient and sends the message. The MUA formats the message in email format and uses the Submission Protocol (a profile of the Simple Mail Transfer Protocol (SMTP), see RFC 6409) to send the message to the local mail submission agent (MSA), for example, run by the IED's internet service provider (ISP). The MSA looks at the destination address provided in the SMTP protocol (not from the message header). An Internet email address is a string of the form recipient@meter. The part before the @ sign is the local part of the address, often the username of the recipient, and the part after the @ sign is a domain name or a fully qualified domain name. The MSA resolves a domain name to determine the fully qualified domain name of the mail exchange server in the Domain Name System (DNS). The DNS server for the domain responds with any MX records listing the mail exchange servers for that domain, for example, a message transfer agent (MTA) server run by the recipient's ISP. The MSA sends the message to MTA using SMTP. This server may need to forward the message to other MTAs before the message reaches the final message delivery agent (MDA). The MDA delivers it to the mailbox of the recipient. The recipient retrieves the message using either the Post Office Protocol (POP3) or the Internet Message Access Protocol (IMAP4).

Other types of e-mail systems may also be employed, for example, web-based email, POP3 (Post Office Protocol 3) email services, IMAP (Internet Message Protocol) e-mail servers, and MAPI (Messaging Application Programming Interface) email servers to name a few.

In a further embodiment, File Transfer Protocol (FTP) may be employed. Techniques for transferring data from an IED to a device is described in commonly owned pending U.S. patent application Ser. No. 12/061,979, the contents of which are incorporated by reference.

In one embodiment, IEDs employ Universal Plug and Play (UPnP) protocol, which is a set of networking protocols that permits networked devices to discover each other's presence, and notify clients of services available on these devices. UPnP takes the form of UDP broadcast messages, which are sent across a local network, to notify other devices of available services, and http requests to query the details of those devices and services.

In one embodiment, UPnP is employed to allow the network addresses of devices, such as meters, to automatically be discovered by a client. This enables the client software to display a list of all devices which are available. In addition, this could also allow the client software to enable the user to connect to these devices, without having to configure the network address of that device. In addition, the UPnP notify may be used to indicate the health status of the device, including starting up, running, errors in configuration, and resetting.

In another embodiment, UPnP is employed to allow devices, such as meters, to notify the clients of what services they support, such as modbus, dnp, web, ftp, log download, and data streaming. This could be extended by including information particular to that service or protocol, such as to allow the client to interface with that service with no user input. This could enable the client software to display the device such that the user can focus on the details of the device, rather then worrying about the minutiae of connection information.

In another embodiment, an automated server is configured to perform actions related to these automatically discovered services, such as retrieving real time information, downloading logs, or registering for notification of events. For example, as shown in FIG. 8, a server 530 could be on a network 516 to collect log information from meters 510, 512, 514, and whenever a meter broadcast that it provided log data, the server 530 could automatically collect that data from the meter. As another example, the server 530 could automatically poll and log the real-time readings of all meters on the network, automatically including them as they become available on the network. As described above, the server 530 may then post the data to server 524.

In one embodiment, HTTP tunneling is employed to send a message (including the IED's or meter's data) to a server, which listens for such messages, and parses out the IED's or meter's data. This could be performed by embedding the meter's data in a HTTP message, which could be sent to the server, for example, server 424 as shown in FIG. 6. The HTTP wrapper would allow this data to pass through firewalls which only allow web traffic. For example, in the architecture of FIG. 6, IED 410 may send a HTTP message containing measured or calculated data through firewall 418 to server 424 or server 430. In another example as shown in FIG. 8, server 530 may collect data from the various IEDs 510, 512, 514 and forward the collected data in a HTTP message through firewall 518 to server 524.

It is to be appreciated that HTTP tunneling applies to system architectures where a server is provided as the receiver of the IED or meter data, as the clients would be unable to process such information. Referring to FIG. 9, server 630 is the destination (and collects) the messages generated from the various IEDs 610, 612, 614, but device 628 is a client, and without server software, would be unable to receive the messages. However, by programming device 628 with server software, the client device 628 becomes a server and can receive the messages.

It is further to be appreciated that the HTTP message can be sent based on various triggers including, but not limited to, time-based trigger, event-based trigger, storage capacity based trigger, etc.

In another embodiment, the IEDs can communicate through to devices using a Simple Network Management Protocol (SNMP) trap. SNMP traps enable an agent, e.g., an agent running on an IED, to notify a management station, e.g., a server, of significant events by way of an unsolicited SNMP message. Upon occurrence of an event, an agent that sends an unsolicited or asynchronous trap to the network management system (NMS), also known as a manager. After the manager receives the event, the manager displays it and can choose to take an action based on the event. For instance, the manager can poll the agent or IED directly, or poll other associated device agents to get a better understanding of the event. For the management system to understand a trap sent to it by an agent, the management system must know what the object identifier (OID) of the trap or message defines. Therefore, the management system or server must have the Management Information Base (MIB) for that trap loaded. This provides the correct OID information so that the network management system can understand the traps sent to it. Additionally, a device does not send a trap to a network management system unless it is configured to do so. A device must know that it should send a trap. The trap destination is usually defined by an IP address, but can be a host name, if the device is set up to query a Domain Name System (DNS) server.

Common chat protocols, such as MSN, AIM, IRQ, IRC, and Skype, could be used to send a message, containing the meter's data, to a public chat server, e.g., server 440, 540, 640, which could then route that message to any desired client. Another possible implementation could be to have a special client that listens for these messages, parses the data contents, and presents them an another manner. In one embodiment, the messages are proprietary format Ethernet messages, typically sent over TCP. It is to be appreciated that the actual format depends on the specific chat protocol.

A public social server that supports a common web interface for posting information, such as Twitter™, Facebook™, BBS's, could be used to post a status, containing the meter's data, to a user on the public social server for that service, e.g., server 440, 540, 640. This post could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as a user updating it from their browser (HTTP push). Some of these servers also provide a proprietary format Ethernet message, typically sent over TCP.

In one non-limiting example, a public social server such as the system employed by Facebook may be utilized to post the IEDs data so the data is accessible on the external network outside of the firewall. Facebook uses a variety of services, tools and programming languages to make up its infrastructure which may be employed in the systems and methods of the present disclosure to implement the technique described herein. In the front end, the servers run a LAMP (Linux, Apache, MySQL and PHP) stack with Memcache. Linux is a Unix-like operating system kernel. It is open source, highly customizable, and good for security. Facebook's server runs the Linux operating system Apache HTTP server. For the database, Facebook uses MySQL for its speed and reliability. MySQL is used primarily as a key store of value when the data are randomly distributed among a large number of cases logical. These logical instances extend across physical nodes and load balancing is done at physical node. Facebook uses PHP, since it is a good web programming language and is good for rapid iteration. PHP is a dynamically typed language/interpreter. Memcache is a caching system that is used to accelerate dynamic web sites with databases (like Facebook) by caching data and objects in RAM to reduce reading time. Memcache is the main form of caching on Facebook and helps relieve the burden of database. Having a caching system allows Facebook to be as fast as it is to remember information. Furthermore, Facebook backend services are written in a variety of different programming languages like C++, Java, Python, and Erlang. Additionally, it employs the following services: 1.) Thrift—a lightweight remote procedure call framework for scalable cross-language services development, which supports C++, PHP, Python, Perl, Java, Ruby, Erlang, and others; 2.) Escribano (server logs)—a server for aggregating log data streamed in real time on many other servers, it is a scalable framework useful for recording a wide range of data; 3.) Cassandra (database)—a database designed to handle large amounts of data spread out across many servers; 4.) HipHop for PHP—a transformer of source code for PHP script code and was created to save server resources, HipHop transforms PHP source code in C++ optimized, among others. It is to be appreciated that any of the above systems, devices and/or services may be implemented in the various architectures disclosed in the present disclosure to achieve the teaching and techniques described herein.

A public web site, e.g., hosting on server 440, 540, 640, which allows the posting of information, such as a Forum, could be used to post a message, containing the meter's data, to a group, thread, or other location. This post would take place by a HTTP POST to the web site's server, whereby the server would store that information, and present it on the web site. This message could then be viewed by the clients to see the meter's data, or read by another server for further parsing and presentation. The data could be formatted as human readable text (e.g., "The voltage is 120.2v"), as machine parsable text (e.g., "voltage.an=120.2"), hex representing binary data (e.g., "0152BF5E"). The HTTP interface could be used, which would work the same way as a user updating it from their browser (HTTP push).

User Datagram Protocol (UDP) messages could be used to send a message from the IEDs or meters to a server, which listens for such messages, and parses out the meter's data. When employing UDP broadcasts, messages could be sent from the IEDs or meters to a server, e.g., servers 530, 630, since UDP broadcasts do not work across networks. The messages containing the IED's or meter's data can then be sent to external networks via any of the described (or to be developed) communication methods. Alternatively, a UDP unicast could support sending to any server, e.g., server 424, 524.

A Virtual Private Network (VPN) could be created such that each meter on the internal network is part of the same virtual private network as each of the clients. A Virtual Private Network (VPN) is a technology for using the Internet or another intermediate network to connect computers to isolated remote computer networks that would otherwise be inaccessible. A VPN provides security so that traffic sent through the VPN connection stays isolated from other computers on the intermediate network. VPNs can connect individual IEDs or meters to a remote network or connect multiple networks together. Through VPNs, users are able to access resources on remote networks, such as files, printers, databases, or internal websites. VPN remote users get the impression of being directly connected to the central network via a point-to-point link. Any of the other described (or to be developed) protocols could then be used to push data to another server or clients on the VPN.

Hosted data services, such as a hosted database, cloud data storage, Drop-Box, or web service hosting, could be used as an external server to store the meter's data, called Hosting. Each of these Hosts, e.g., servers 440, 540, 640, could then be accessed by the clients to query the Hosted Data. Many of these hosted data services support HTTP Push messages to upload the data, or direct SQL messages. As many web service and cloud hosts allow their users to use their own software, a hosted data service could be further extended by placing proprietary software on them, thus allowing them to act as the external meter server for any of the previously mentioned methods (e.g., servers 424, 524).

In another embodiment, the IEDs can communicate to devices using Generic Object Oriented Substation Event (GOOSE) messages, as defined by the IEC-61850 standard, the content of which is herein incorporated by reference. A GOOSE message is a user-defined set of data that is "published" on detection of a change in any of the contained data items sensed or calculated by the IED. Any IED or device on the LAN or network that is interested in the published data can "subscribe" to the publisher's GOOSE message and subsequently use any of the data items in the message as desired. As such, GOOSE is known as a Publish-Subscribe message. With binary values, change detect is a False-to-True or True-to-False transition. With analog measurements, IEC 61850 defines a "deadband" whereby if the analog value changes greater than the deadband value, a GOOSE message with the changed analog value is sent. In situations where changes of state are infrequent, a "keep alive" message is periodically sent by the publisher to detect a potential failure. In the keep-alive message, there is a data item that indicates "The NEXT GOOSE will be sent in XX Seconds" (where XX is a user-definable time). If the subscriber fails to receive a message in the specified time frame, it can set an alarm to indicate either a failure of the publisher or the communication network.

The GOOSE message obtains high-performance by creating a mapping of the transmitted information directly onto an Ethernet data frame. There is no Internet Protocol (IP) address and no Transmission Control Protocol (TCP). For delivery of the GOOSE message, an Ethernet address known as a Multicast address is used. A Multicast address is normally delivered to all devices on a Local Area Network (LAN). Many times, the message is only meant for a few devices and doesn't need to be delivered to all devices on the LAN. To minimize Ethernet traffic, the concept of a "Virtual" LAN or VLAN is employed. To meet the reliability criteria of the IEC-61850, the GOOSE protocol automatically repeats messages several times without being asked. As such, if the first GOOSE message gets lost (corrupted), there is a very high probability that the next message or the next or the next will be properly received.

It is to be appreciated that the above-described one-way communication embodiments may apply to systems other than for energy metering. For example, the present disclosure may be applied to a vending machine or system, wherein the vending machine located in a building or structure having a private or corporate network. The vending machine will include, among other data collecting components, at least a communication device or network interface as described above. The communication device or network interface will coupled the vending machine to the internal network which may be further coupled to the Internet via a firewall. The vending machine may vend or dispense a plurality of items, such as soda cans, candy bars, etc., similar to the vending machine described in U.S. Pat. No. 3,178, 055, the contents of which are incorporated by reference. In accordance with the present disclosure, the vending machine will monitor and collect data related to the items sold. Such data may include quantities of items sold, a re-stock limit that has been reached, total revenue generated by the vending machine, etc. In one embodiment, the vending machine will post to a web site, residing on a server outside of the internal network such as the Internet, quantities of specific items sold by the vending machine that are required to fill the vending machine. In this manner, an operator that maintains the vending machine can check the web site before going to the location of the vending machine and know exactly how many items are required to fill the vending machine before going to the location to refill the vending machine.

In another embodiment, the teachings of the present disclosure may be applied to a medical device, for example, a medical monitoring device configured to be worn on a patient. In this embodiment, the medical monitoring device will include at least a communication device or network interface as described above and monitor a certain parameter relating to a patient, e.g., a heartbeat. In one embodiment, the at least a communication device or network interface operates on a wireless connection and coupled the medical monitoring device to internal network (e.g., a home network) which may be further coupled to the Internet via a firewall, e.g., a router provided by the Internet Service Provider. At predetermined intervals, the medical monitoring device will communicate to and post the monitored data on a remote website. A user such as a doctor may then view the data of the patient by accessing the web site and not directly connecting to the medical monitoring device.

Other embodiments may include security systems such as fire alarm systems, security alarm systems, etc., which need to report data. Also envisioned are manufacturing sensing equipment, traffic sensing equipment, scientific instrumentation or other types of reporting instrumentation.

Based on the sensitivity of the data being communicated and posted through the firewall to various external networks, various data security techniques are employed by the IEDs (e.g., meters, vending machines, medical monitoring device, etc.) contemplated by the present disclosure, some of which are described below.

The original FTP specification is an inherently insecure method of transferring files because there is no method specified for transferring data in an encrypted fashion. This means that under most network configurations, user names, passwords, FTP commands and transferred files can be "sniffed" or viewed by anyone on the same network using a packet sniffer. This is a problem common to many Internet protocol specifications written prior to the creation of SSL such as HTTP, SMTP and Telnet. The common solution to this problem is to use simple password protection or simple encryption schemes, or more sophisticated approaches using either SFTP (SSH File Transfer Protocol), or FTPS (FTP over SSL), which adds SSL or TLS encryption to FTP as specified in RFC 4217. The inventors have contemplated the use of each of these schemes in the IEDs described above.

In one embodiment, the FTP server 131 in the IED 110 shown in FIG. 3 uses a set of username and passwords which are programmed through Modbus. These username and passwords can only be programmed when a user performs a logon with administrative rights. Each programmed user account can be given differing permissions, which grant or restrict access to different roles within the file system. Each role controls read and write access to specific files and directories within the file system through FTP. These roles can be combined to customize the access a specific user is given. When passwords are disabled by the user, a default user account is used, with full permissions, and a username and password of "anonymous".

Password protection schemes are measured in terms of their password strength which may be defined as the amount of resiliency a password provides against password attacks. Password strength can be measured in bits of entropy. Password strength is an important component of an overall security posture, but as with any component of security, it is not sufficient in itself. Strong passwords can still be exploited by insider attacks, phishing, keystroke login, social engineering, dumpster diving, or systems with vulnerabilities that allow attackers in without passwords. To overcome these drawbacks it is contemplated to use some form of password encryption scheme (e.g., 8-bit, 10-bit, 16-bit) in concert with the password protection system to facilitate secure communication between an external device, such as PC client 102 and the FTP server 131. However, there are drawbacks associated even with these schemes. For example, a username and password may be encoded as a sequence of base-64 characters. For example, the user name Aladdin and password open sesame would be combined as Aladdin:open sesame which is equivalent to QWxhZGRpbjpvcGVuIHNlc2FtZQ==when encoded in base-64. Little effort is required to translate the encoded string back into the user name and password, and many popular security tools will decode the strings "on the fly", so an encrypted connection should always be used to prevent interception.

In another embodiment, an encrypted connection scheme is used. In particular, the FTP server 131 in the IED 110 uses some form of FTP security encryption, such as, for example, FTPS (FTP over SSL), Secure FTP (sometimes referred to as FTP over SSH, i.e., FTP over Secure Shell encryption (SSH)), Simple File Transfer Protocol (SFTP), or SSH file transfer protocol (SFTP). These FTP security encryption protocols provide a level of security unattainable with the previously described password encryption schemes.

FTP over SSH refers to the practice of tunneling a normal FTP session over an SSH connection. Because FTP uses multiple TCP connections, it is particularly difficult to tunnel over SSH. With many SSH clients, attempting to set up a tunnel for the control channel (the initial client-to-server connection on port 21) will protect only that channel; when data is transferred, the FTP software at either end will set up new TCP connections (data channels) which will bypass the SSH connection, and thus have no confidentiality, integrity protection, etc. If the FTP client, e.g., PC client 102, is configured to use passive mode and to connect to a SOCKS server interface that many SSH clients can present for tunneling, it is possible to run all the FTP channels over the SSH connection. Otherwise, it is necessary for the SSH client software to have specific knowledge of the FTP protocol, and monitor and rewrite FTP control channel messages and autonomously open new forwardings for FTP data channels.

In further embodiments, the networks may be configured to adhere to various cyber security standards to minimize the number of successful cyber security attacks. The cyber security standards apply to devices, IEDs, computers and computer networks. The objective of cyber security standards includes protection of information and property from theft, corruption, or natural disaster, while allowing the information and property to remain accessible and productive to its intended users. The term cyber security standards means the collective processes and mechanisms by which sensitive and valuable information and services are protected from publication, tampering or collapse by unauthorized activities or untrustworthy individuals and unplanned events respectively. In the various embodiments and implementations of the present disclosure, the systems, devices and methods may be configured to be in accordance with, for example, the Standard of Good Practice (SoGP) as defined by the Information Security Forum, Critical Infrastructure Protection (CIP) standards as defined by the North American Electric Reliability Corporation (NERC), and the ISA-99 standard as defined by the International Society for Automation (ISA), the contents of each being incorporated by reference herein. It is to be appreciated that this lists of cyber security standards is merely an exemplary list and is not meant to be exhaustive.

In one embodiment, the IED 10 implements the IEC 61850 communication protocol to allow external IEC 61850 clients to make data and information requests to the IED 10 regarding power usage and power quality for any metered point within a power distribution system 11. The IED 10 supports IEC 61850 GOOSE, which is a server/client model called publisher/subscriber for fast exchange of information. The IED 10 as a publisher sends out a new GOOSE message (i.e., publishing), when an event occurs (e.g., data from a referenced dataset changed), with no user intervention, to multiple subscribers using LAN multicast. The GOOSE message is repeatedly sent with no acknowledge message sent by the subscribers. Besides other things, the GOOSE message contains data, which are values from a referenced dataset. The IED 10 as a publisher can listen for GOOSE messages from subscribed publishers. The IED 10 is configured as a GOOSE publisher/subscriber based upon user's CID file.

Figure 10:
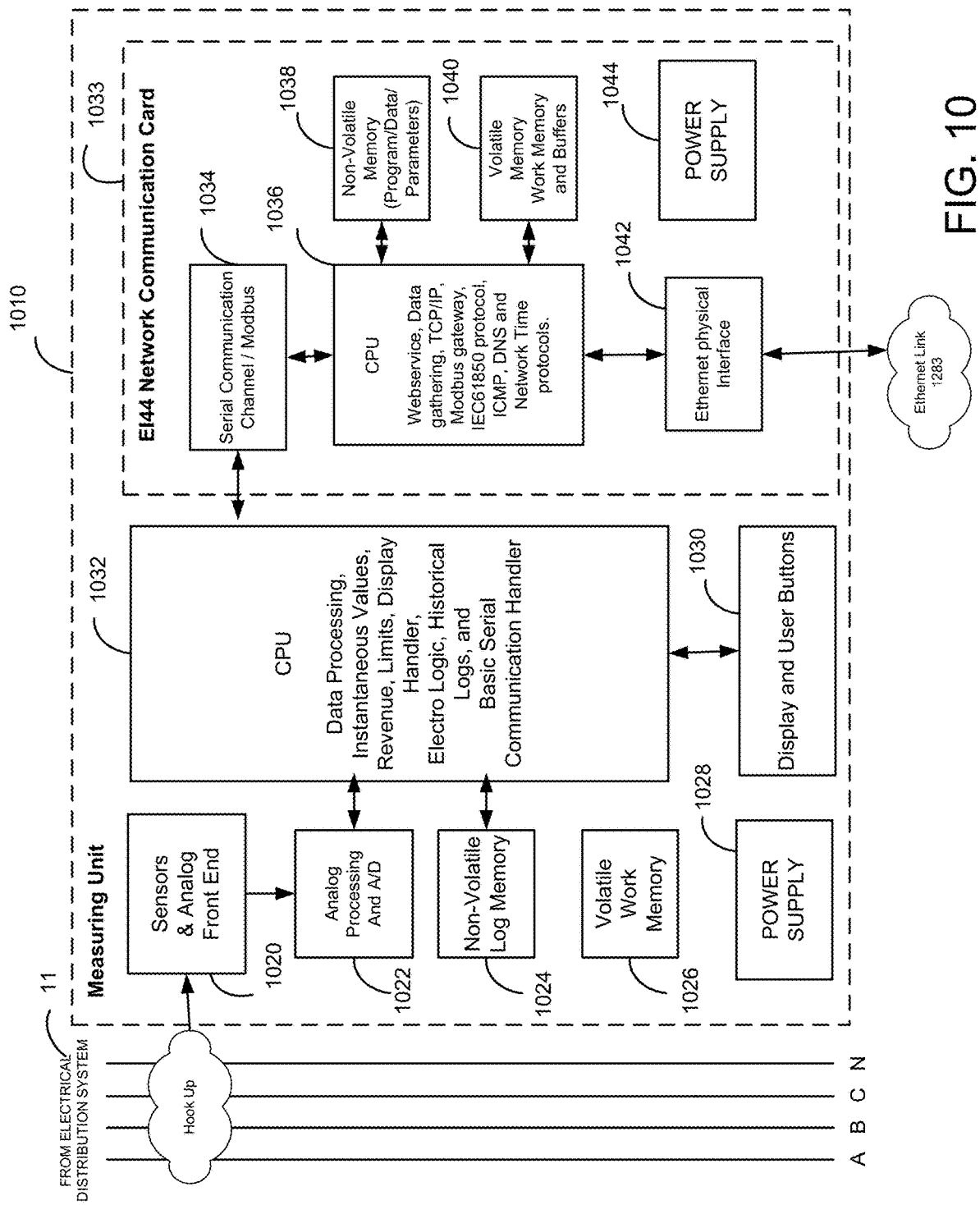
FIG. 10 is a block diagram of a measuring unit including a network communication network card for responding to user data and information requests regarding power usage and power quality for any metered point within a power distribution system.

FIG. 10 is a block diagram of a measuring unit 1010, i.e., an IED, including a network communication card 1033 for responding to user data and information requests regarding power usage and power quality for any metered point within a power distribution system 11. Furthermore, the communication card 1033 is configured for sending/receiving IEC 61850 GOOSE messages.

The measuring unit 1010 includes at least one sensor & analog front end 1020, at least one analog processing and A/D 1022, at least one non-volatile log memory 1024, at least one volatile work memory 1026, a power supply 1028, display and user buttons 1030, and a CPU 1032. An optional network communication card 1033 may be coupled to or disposed into the measuring unit 1010 to extend communication capabilities of the measuring unit 1010. These capabilities include: a Web Server that allows any internet browser to connect to the measuring unit 1010; a Modbus Server that allows a Modbus RTU client to connect to the 1010 for transferring data and operation parameters; and other supporting services.

The network communication card 1033 is shown to include, in one embodiment, a serial communication interface 1034 to communicate with the measuring unit 1010, a CPU 1036, non-volatile memory 1038, volatile memory 1040, an Ethernet physical interface 1042 and a power supply 1044.

The network communication card 1033 operates in accordance with the IEC 61850 communication protocol, which is not a single protocol, but is instead a suite of protocols.

The IEC 61850 suite of protocols collectively provide functionality for different uses in a single application by sharing data from several entities within a substation automation system to make operation more reliable through use of remote and local control and supervising of the working parameters and measurements. The IEC 61850 is a standard that was created not only as a communication tool but also as a method and a platform for designing, implementing and operation substation and energy-utility automation systems. Flexibly, the IEC 61850 protocol can implement all or a subset of the communication protocols in the suite. In one embodiment, the network communication card 1033 implements the SNTP (Simple Network Time Protocol) client side and the MMS (Manufacturing Message Specification) Server suite with Requested Data Transmission and Reporting. These protocols run over UDP/IP and TCP/IP, respectively. Additionally, IEC 61850 GOOSE over Ethernet.

In one embodiment, the IEC 61850 communication protocol, protocol routines 1203 (see FIG. 12) and certain support functions are implemented in the network communication card 1033 as a firmware implementation based on an IEC 61850 collection of protocol routines. This IEC 61850 collection of protocol routines is configured to interpret queries and format replies to external users in the IEC 61850 protocol, to be described further below. Additionally, the routines are to generate/interpret GOOSE messages: add/remove tags as upon transmission/reception, manage retransmission/timeouts, and interface with Ethernet. The IEC 61850 protocol routines perform a variety of tasks, such as, for example, identification, report and log handling, generation and packet validation.

Figure 12:
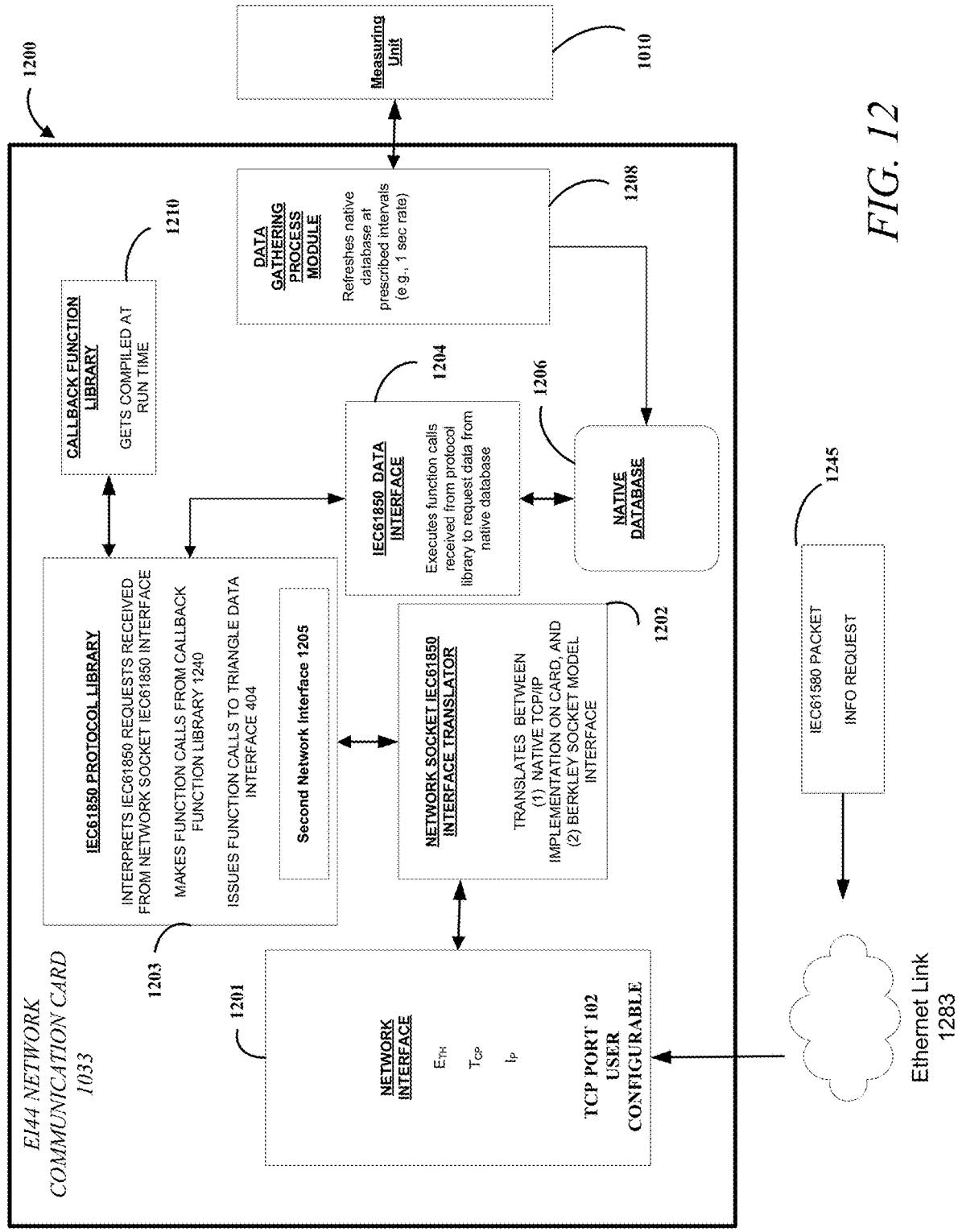
FIG. 12 is a functional block diagram of an IEC 61850 firmware implementation for responding to user data and information requests regarding measured data and others from the measuring unit.

FIG. 12 is a functional block diagram of an IEC 61850 firmware implementation for responding to user data and information requests regarding measured data and others from the measuring unit 1010 as well as send/receive GOOSE messages. The communication card 1033 includes a network interface 1201 module, an interface translator module 1202, a collection of protocol routines 1203, a data interface module 1204, a native database 1206, and a data gathering process module 1208. The interface translator 1202 translates network handling between the native TCP/IP implementation at interface 1201, and the internet sockets, e.g., Berkeley sockets model associated with Berkeley Software Distribution (BSD), implemented by the protocol routines 1203. The protocol routines 1203 interpret translated requests received from the interface translator 1202 and make function calls from callback function library 1210. The data interface 1204 is configured to receive function calls and execute those function calls to make data requests to database 1206.

Figure 11:
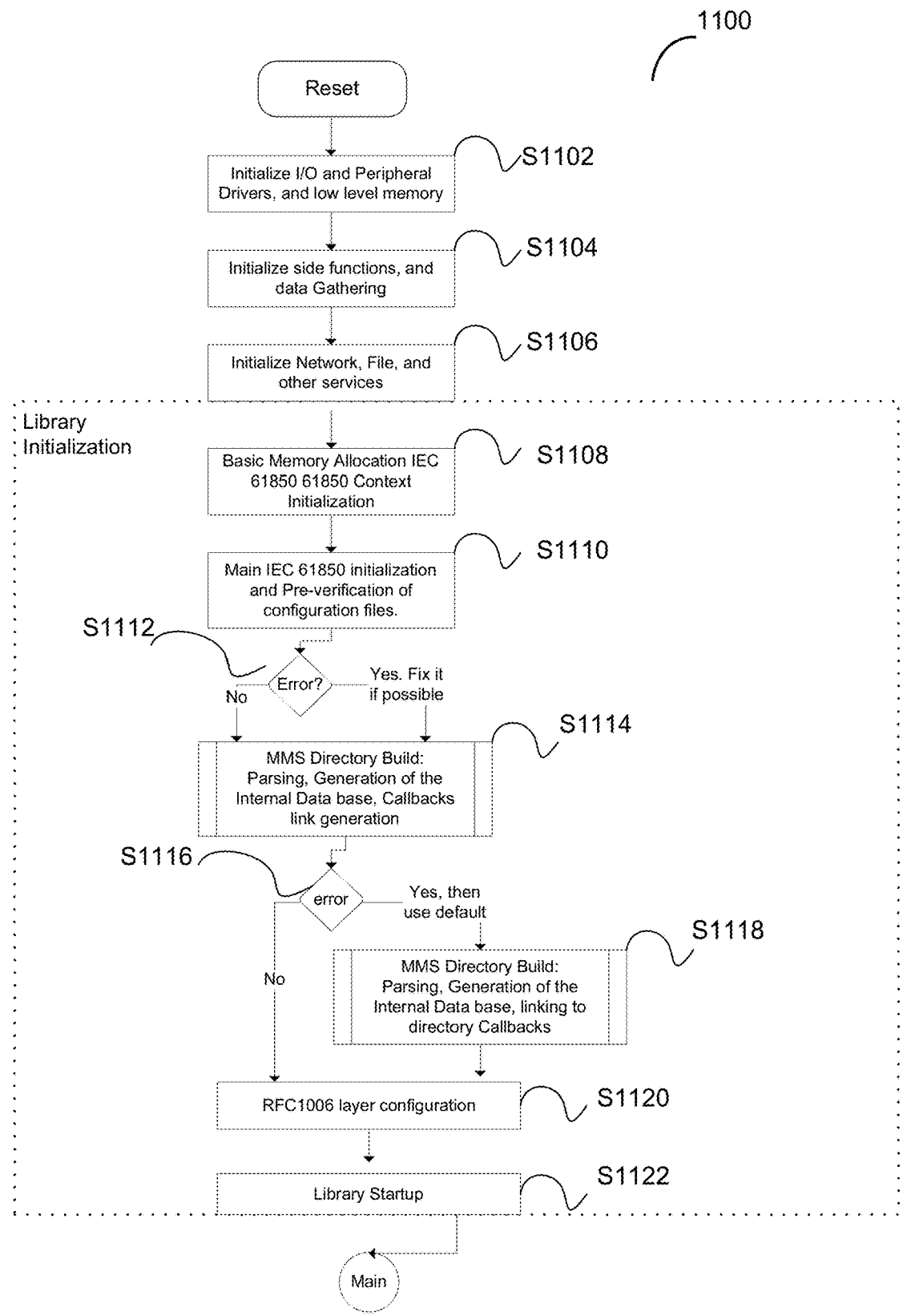
FIG. 11 shows a non-limiting and exemplary flowchart illustrating how the IEC 61850 communication protocol is implemented in the network communication card to serve external clients making requests for metering data and other information.
Figure 11:
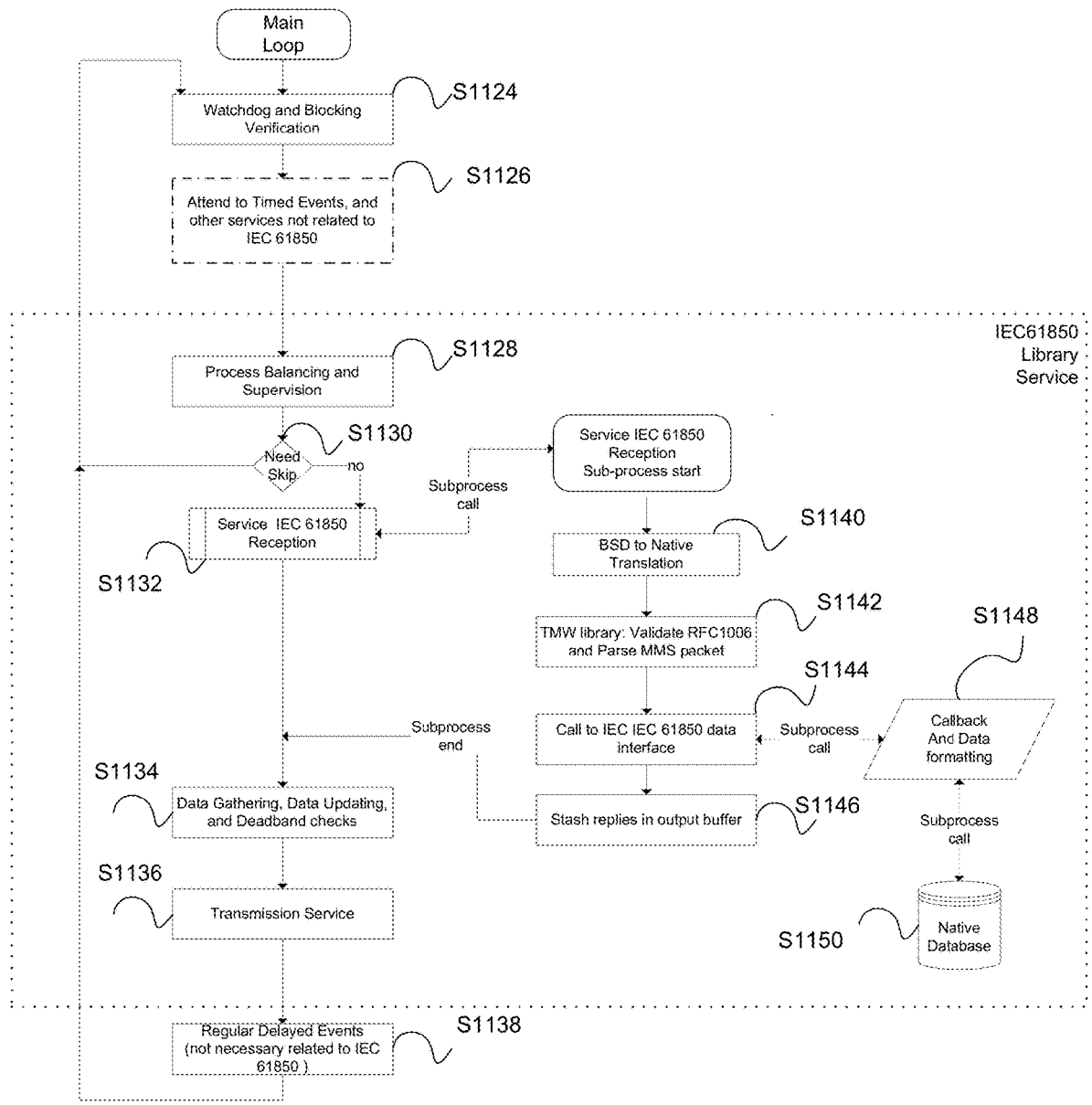

FIG. 11 shows a non-limiting and exemplary flowchart 1100 illustrating how the IEC 61850 communication protocol is implemented in the network communication card 1033 to serve external clients making requests for metering data and other information and also sending/receiving GOOSE messages.

At Step S1102, I/O, Peripheral Drivers and low level memory 1040, 1044 in the network communication card 1033 are initialized.

At Step S1104, side functions and data gathering is initialized.

At Step S1106, Network, File and other services are initialized. For example, TCP/IP, UDP as well as the internal file system and memory resources are initialized.

At Step S1108, basic memory allocation and IEC allocation is performed as well as context initialization. Some system calls allocate memory for the MMS context and communication buffers. All application related variables and operational and state parameters are allocated in a global structure, which can be accessed by the protocol routines and by the rest of the network card functions.

At Step S1110, main IEC initialization and pre-verification of configuration files are performed. At this step, the MMS context and application context data is filled in with IEC 61850 basic data like name of the unit in the IEC 61850 domain, the IED name assigned to the meter, IP address to be used as host server address and other parameters.

At Step S1112, it is determined whether there are any errors associated with the main IEC initialization and pre-verification of configuration files performed at Step S1110. If yes, the errors are corrected. In one embodiment, the only correctable error is matching the configured IEC 61850 IP addresses from user configuration file with the IP addresses from the IED 1010 unit profile.

At Step S1114, once basic structures are initialized, the MMS configuration functions are called to build the directory tree with all objects to be supported by the communication functions (e.g., reporting, dead-band checking events, etc.). To achieve this, a number of processes are executed in this step, like parsing the user configuration file, generation of the internal data base, more memory allocation, and callbacks link generation. Each of these processes are described as follows.

Parsing is the method used to read the user configuration file, i.e., a cid file. The user configuration .CID (Configured IED Description file) is a text file formatted with a XML structure according to the IEC 61850 definitions. The (.CID) file has been previously loaded in the communication card 1033 by any other means. By default, there is a (.CID) file, but it can also be uploaded via a web page. The parsing identifies special key words within the XML formatted file, and interprets values and strings from those keywords and structures. There are a limited number of possible keywords, and almost an unlimited number of possible values and strings. The parsing can detect if an expected format is not satisfied in the file, and thus it is a way to verify the validity of the (.CID) file. The (.CID) file can be edited by the user according to particular needs, but its versatility is limited by the hardware capabilities and features of the communication card 1033 itself. The IEC 61850 capabilities are provided in a .ICD (IED Capabilities Description file).

Figure 15:
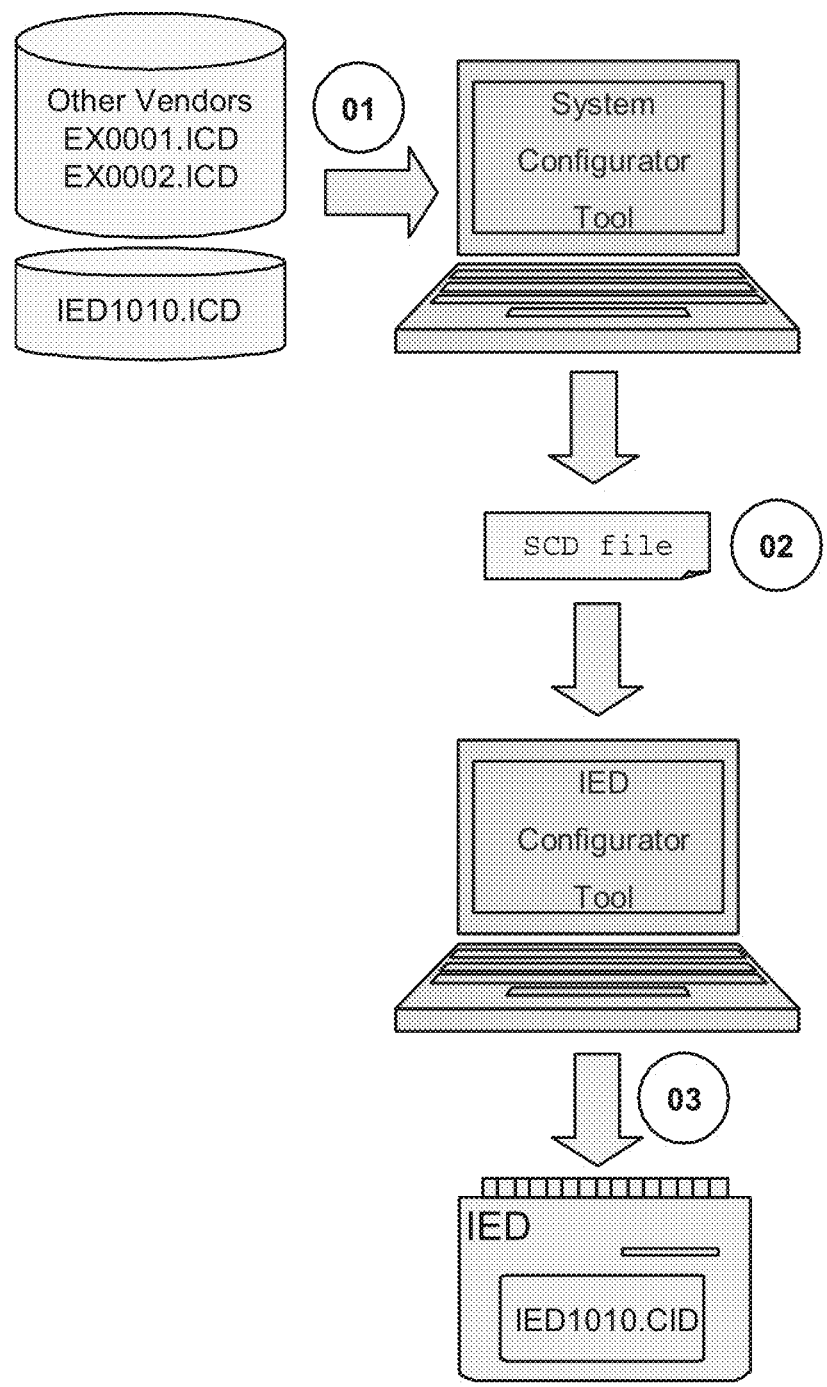
FIG. 15 illustrates an overview of a process for creating a CID file in accordance with an embodiment of the present disclosure.
Figure 16:
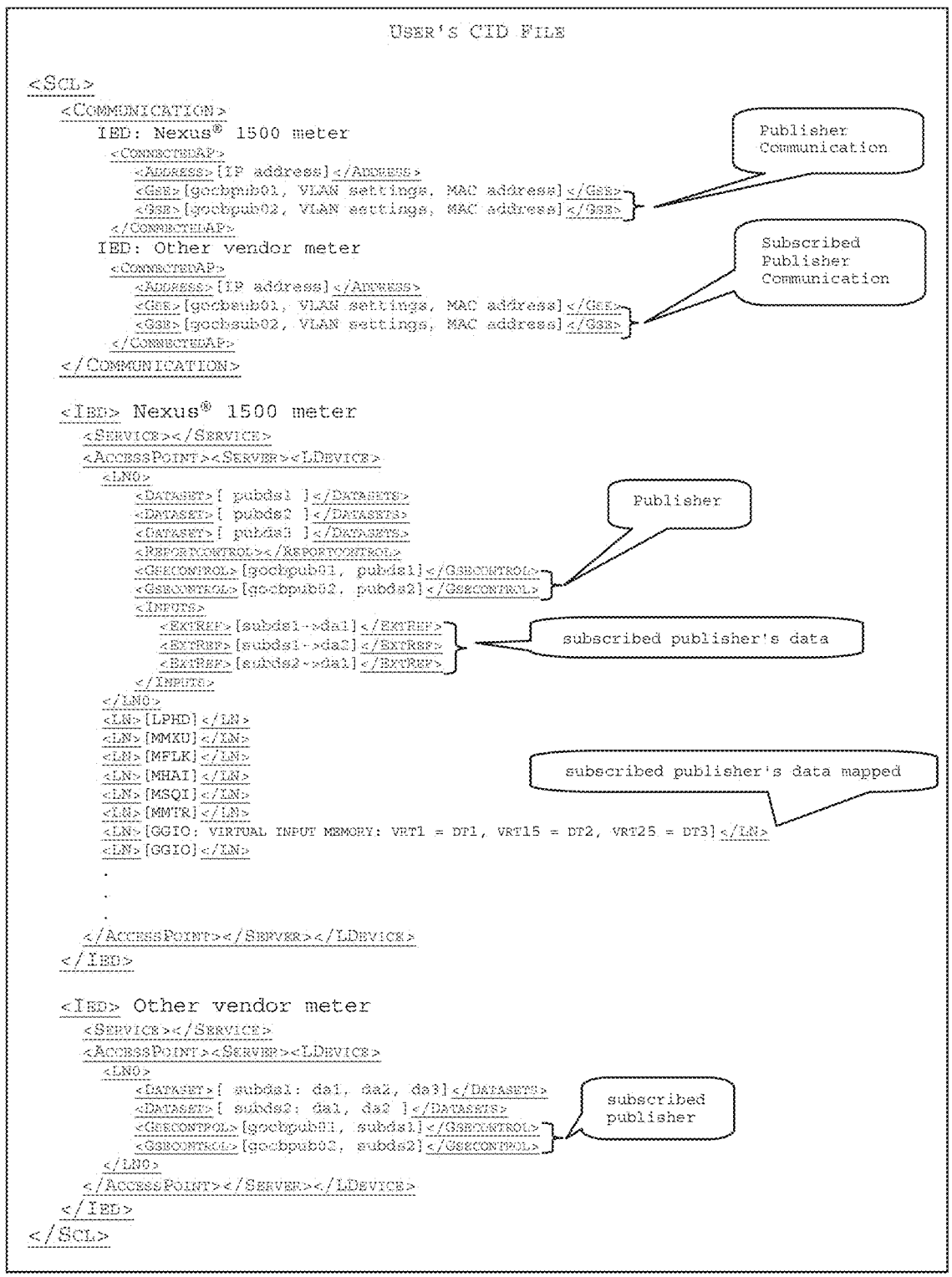
FIG. 16 is an exemplary CID file in accordance with an embodiment of the present disclosure.

The IED 1010 is configured as a server based upon (.CID), IED1010.cid. The (.CID) file is derived from the (.ICD) file, ied1010.icd, which defines all server capabilities, such as service and data models. Both files may be stored on a compact flash in the IED. To generate the (.CID) file, firstly, the (.ICD) file is downloaded may be via FTP and exported together with other vendor's (.ICD) file to a vendor-independent system configurator tool to produce a system configuration description file (.SCD). This tool defines IEDs by selecting which capabilities from its (.ICD) file each IED is going to have, defines communication addressing (e.g., IP address set here should be the same one set in device profile), data flow between IEDs and so on. Secondly, the (.SCD) file is imported by the IED configurator tool that will produce the (.CID) file to be upload into the IED 10. FIG. 15 gives an overview of the process to generate (.CID) file and FIG. 16 is a simplified view of (.CID) file.

Generation of Internal Database

The IEC 61850 routines have internally a database with information about the device and features it is supporting. This database, from here on in called IEC 61850 database, has the form of a directory and it is part of IEC 61850 collection of routines 1203 in FIG. 12. The IEC 61850 database needs to be built at start up time, this process is called MMS directory build, as shown in S1118 in FIG. 11-*a*. The building seeks to create a relationship between IEC 61850 known objects (and their attributes) and the internal objects of the communication card 1033 device like voltages, currents, watts, etc. However, these internal objects of the communication card 1033 device are maintained in another database, referred to herein as a native database 1206, as shown in FIG. 12. This native database 1206 is a resource used to map each of the internal objects (voltages, current, etc.) with known register numbers for the Modbus protocol, which is the native protocol used by the communication card 1033 to retrieve the values from the measuring unit 1010. It is noted that the Modbus protocol described herein is just an embodiment, any protocol or list of values in memory can be used. So in summary the IEC 61850 data base is built to relate IEC 61850 objects with the native objects in the communication card 1033, knowing that the native objects are already in the native database, as shown in FIG. 12, and described further below.

Figure 17:
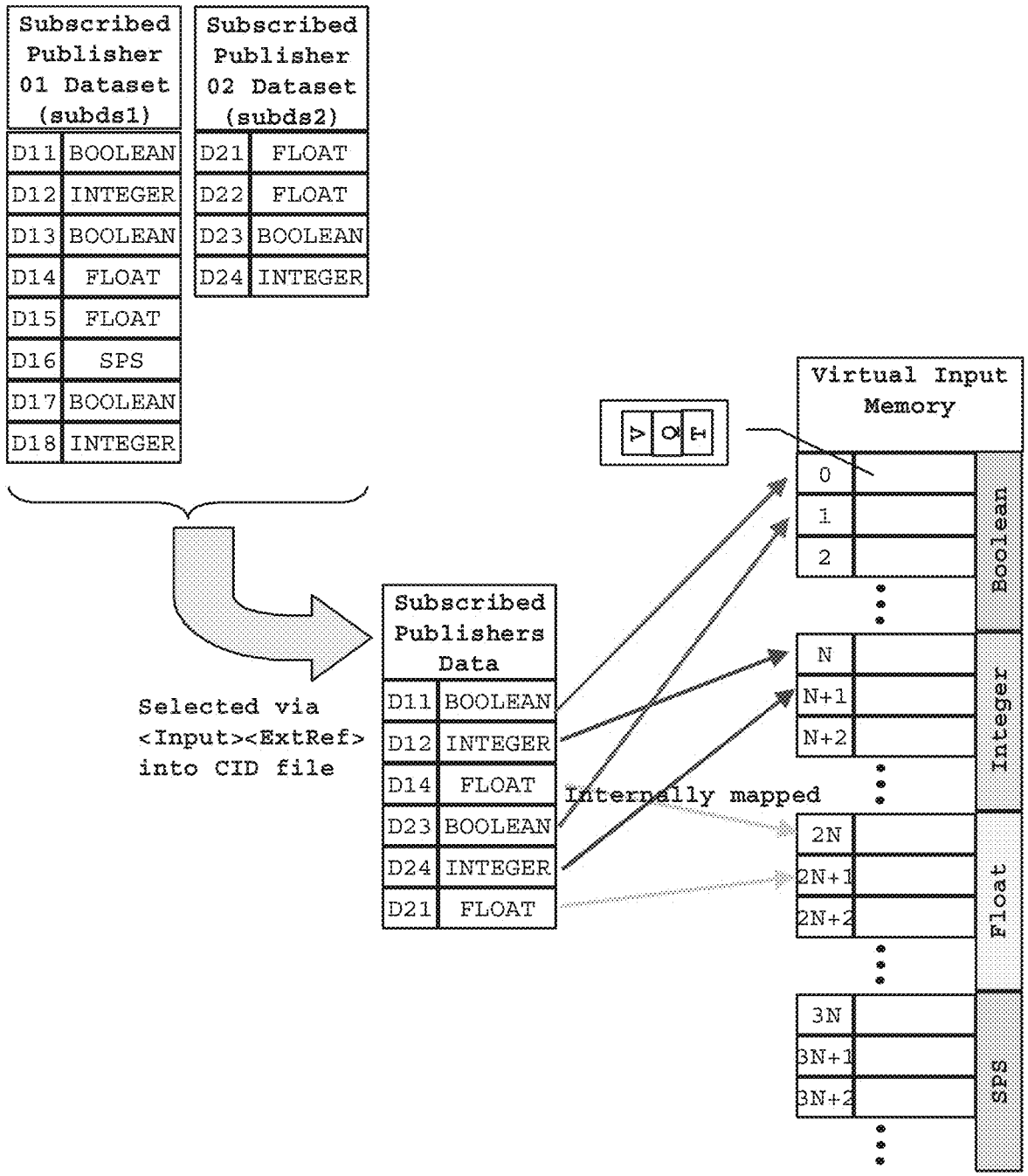
FIG. 17 is an exemplary memory structure in accordance with an embodiment of the present disclosure.

The IED 1010 has an internal virtual volatile memory, see FIG. 17, used to hold some or all data contained into received GOOSE messages from a subscribed publisher. Each subscribed publisher publishes the whole dataset. There is defined a logic node (LN) into (.CID) file that maps this virtual memory. The data from received GOOSE messages that is going to be processed are the ones defined by <Input><ExtRef> tag into (.CID) file. The data type understandable are integer, Boolean float and SPS (structure of Boolean+quality+timestamp). For each memory position, 3 pieces of information are saved: Value—copy from received GOOSE data; Quality—It has the same format as IEC 61850 quality data attribute. For all data type, excepted SPS, it indicates if the data is valid or not. If the values update at least once, it indicates that the data is valid; otherwise, it is invalid. For SPS data type, this is a copy from the received quality value. If the GOOSE message times out, it indicates that it is invalid for all data types. Timestamp—It has the same format as IEC 61850 timestamp data attribute. For all data types, except SPS, it indicates the timestamp when the value is updated. For SPS data type, this is a copy from the received timestamp value. The data are updated into the internal memory if the data into the memory is different from the received one. All those data can be configured to trigger IEC 61850 reports and GOOSE messages. Also those data can be configured to be internally logged or to generate alarms.

Callback Link Generation

There are several specific functions to retrieve values from the Modbus and change them from raw information to meaningful information. As an example, a voltage value could be 123, and once this is changed with the specific function (which is intended to read this value) the raw value 82342 is converted to 127.0 Volts, which is a floating point value scaled to factors derived from sensors and other measurement parameters. A callback to these functions needs to be linked into the IEC 61850 collection of routines 1203, thus, the moment the IEC 61850 routines 1203 require a value, it uses the call back and a reference to the mapped object to retrieve the real meaningful value. The process to associate the specific functions, and the registers in the native database 1206 is referred to herein as callback link generation.

While the directory is being built and the internal routine structure creates links between their internal elements, special functions are called from the routines 1203 for every built Node (e.g., a leap or non-leaf node). These special functions are not part of the routines 1203, but are instead part of the data interface routines specific to the network communication card 1033. These functions ensure that every node created in the dictionary routine is initialized, identified as valid and if needed perform a special processing based on the short address (sAddr) attribute found for this node in the (.CID) file, which is based in turn on the capabilities file (.ICD).

The network communication card 1033 of the IED 1010 actually takes the value in the sAddr field and uses it to identify what parameters are being mapped in terms of measurements. Because the sAddr field is a text string, the implementation stores in this file (when the .CID is written) all necessary information to unequivocally identify the value even within a set of data like the 15th harmonic of voltage within the harmonic array. The format is a form of the text in the sAddr field.

At Step S1116, it is determined whether there are any errors detected by the parsing method at Step S1114 or if parameters have been exceeded (e.g., too many objects). If yes, the file being parsed is assumed as useless and the process advances to Step S1118. Otherwise, the process advances to Step S1120.

At Step S1118, after detecting that the user configuration file (uploaded and stored in the communication card 1033) failed, the same processing is applied as previously described in Step S1114, to a default internal configuration file, which is known to be valid. In this manner, the communication card 1033 will enter into a partial operational state in that it is yet to be configured in accordance with a user preference. The partial operational state allows communication between the requesting client and measuring unit 1010, which provides the measuring unit 1010 with the ability to communicate the problem with the original user configuration file to the external world.

At Step S1120, "RFC 1006 Layer Configuration", initialization of the collection of routines continues and the interface between the MMS and the Internet Protocol is created and configured with fixed parameters, such as the maximum number of clients to be simultaneously attended, buffers and maximum size of the messages.

The network communication card 1033 uses a dedicated TCP/IP and UDP/IP stack, which does not have the same interface as, for example, the Berkeley Software Distribution (BSD) sockets. To overcome this, a network socket interface translator 1202, configured as an inter-layer code translates the native management signals of the TCP/IP protocol in the network communication card 1033 to a form that emulates the behavior of the BSD sockets. The IEC 61850 network socket interface translator 1202 provides a native translation of the network requests to both sides, without interfering with other network functions. As the "socket" is a software construct that is a logic insertion point or a network resource entry, where a client and/or server can be connected to. The BSD "socket" as used herein is a set of rules, methods and named processes to access network resources from a programming environment point of view. The IEC 61850 collection of routines 1203 employs the use of BSD sockets.

At Step S1122, routine startup. If all previous steps were successful, the routine start up function is called and the server functionality enters into a listen mode, waiting for connections. If any problem is detected in the previous steps, and those problems prevent the routines 1203 from working properly, the situation is considered a critical error and a flag and code are stored in the network communication card

1033. The user will then have to connect to the network communication card 1033, by other means like the web service, referred to above, and read the flag and code to determine the source of the problem. Possible problems can be lack of memory, lack of network resources, bad .CID file, etc.

After step S1122, the GOOSE publisher and subscribed publisher lists are obtained from MMS dictionary. If those lists are not empty, GOOSE context and communication are initialized.

At Step S1124, "Watchdog and Blocking Verification". The watchdog is a process that is performed with a certain frequency, e.g., less than 2 seconds. If the time constraints are not satisfied, the processor 1036 is assumed to be blocked, either by CPU crash, or an endless loop, or firmware bug. In this event, the processor 1036 is reset and the network communication card 1033 is restarted from fresh.

At Step S1126, "Attend to Timed Events and other services not related to IEC 61850", other regular processes for the network communication card 1033 are performed. For example, these processes may include, in one embodiment, keeping up time from the network time protocol, checking time out of gathered data, attending web requests, and handshaking internet network procedures to create an established state for a TCP/IP connection.

At Step S1128, "Process Balancing and Supervision". This process detects if the IEC 61850 processes are taking too much time away from the system resources. This situation needs to be avoided to allow other processes in the network card (e.g., data gathering, web page services, Modbus functions) to work correctly. If too much processor time is being consumed by the set of functions to implement the IEC 61850, when compared to the other regular processes, the call to these sets of functions to implement the IEC 61850 is skipped until the next check occurs, thereby effectively reducing the rate at which the processing time is being consumed by the IEC 61850 processes on communication card 1033.

The main loop usually attends timed events that are not tagged as real time responses. In this main loop, a call is made frequently to a function that compares the time spent in low priority processes, in idle processes and in the IEC 61850 routine 1203 calls. This function tries to distribute in an even way, the time spent by all these processes. In this way, none of these processes can saturate or block the other ones. The balancing function also assures that the IEC 61850 routines 1203 gets called at least once every time the values in the native database 1206 are updated, so the dead band functionality can check for new events.

Supervision

All activity in the network communication card 1033 is logged into an internal file. This includes the IEC 61850 operation. The IEC 61850 routines 1203 has the ability to log its activities as its processes take place. So any error, critical or not, can be traced back in the log system of the network communication card 1033 as long as the file was not overwritten. Additionally, a software interlock is included in the sequence of calls for the IEC 61850 routines to detect stack corruption and out of sequence calls. The interlock works together with the watchdog functions on the network card. In operation, the interlock acts as a nested check. That is, for every function called in the main loop, an interlock variable is set with a specific value by the caller, and this value is checked by the called function. The value is different among the check points. If the value does not match what was expected, the function hangs and waits for a reset coming from the watchdog.

At the boot time, when the dictionary building takes place, the internal watchdog is also taken care of, because those functions can take very long to complete (e.g., parsing and dictionary tree building).

At Step S1130, "need skip". This step is necessary when too much processing is consumed by the IEC 61850 routines 1203 to allow other processes in the network communication card 1033 to run, skips are taken to reduce the processing eager of the IEC 61850 routines 1203.

Figure 13:
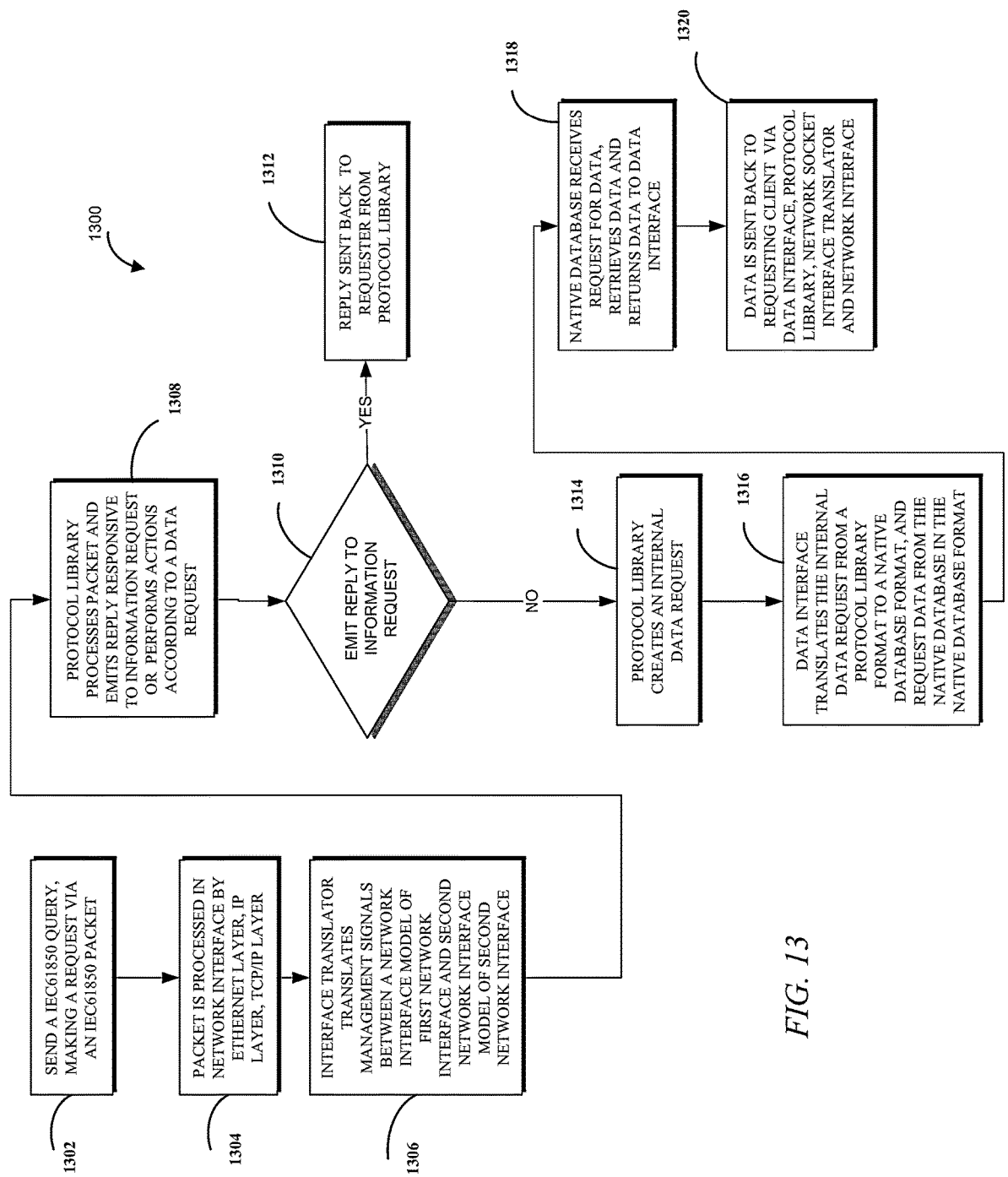
FIG. 13 shows a non-limiting and exemplary flowchart illustrating how the firmware implementation in the network communication network card responds to user data and information requests regarding measured data and others from the measuring unit.

FIG. 13 shows a non-limiting and exemplary flowchart 1300 illustrating how the firmware implementation in the network communication card 1033 responds to user data and information requests regarding measured data and others from measuring unit 1010.

At Step S1132, "service IEC 61850 reception", the reception service is called at regular intervals from the main loop. This process interacts with the IEC 61850 routines 1203 of FIG. 12 in pursuit of incoming requests 1245 from clients and any received GOOSE message. If a request is found and if it can be served, the socket is opened and put in to a FIFO to be serviced. Some errors can occur when servicing reception; however, most of them are soft-errors and can be corrected simply by closing the sockets and freeing the resources assigned to it. A critical error can also occur and when it occurs it is related to memory allocation. To avoid this critical error a predetermined function keeps an eye on the socket resources to limit the memory used. If the memory becomes critical, the socket interface will deny more connection requests without intervention of the library, keeping the network communication card 1033 stable.

Each incoming request from a client is in the form of an IEC 61850 packet 1245 which is part of a layered packetized message in which an Ethernet packet carrying an IP packet which in turn carries a TCP/IP packet which in turn carries the IEC 61850 MMS packet.

The IEC 61850 packet 1245 arrives at the network communication card 1033 through Ethernet link 1283 and it is processed at the network interface 1201 by the Ethernet layer, IP (internet protocol) layer, and the TCP/IP (transfer control protocol for IP) layer sequentially. (See step 1304 of FIG. 13)

At this point all handshaking of the processed packet enters into the network socket IEC 61850 interface translator 1202, which converts the management signals to the Berkeley Socket interface for further use. Management signals may include, for example, signals related to recognition of state events (e.g., packet received, link lost, etc.) and control commands (e.g., give me the packet, drop the packet, send a new packet).

It is to be appreciated that each received GOOSE message is in the form of an Ethernet packet, which arrives at the network communication card 1033 through Ethernet link and it is processed by data link layer. Afterwards, this enters into the IEC 61850 routines 1203, where the GOOSE message is extracted and interpreted. Then the application receives the GOOSE message and processes the data. If a timeout occurs, all data mapped into the internal memory is going to be set invalid.

At Step S1134, which is outside the scope of Service IEC 61850 reception, data gathering, data updating and deadband checks are performed. The measuring unit 1010 is responsible for measuring and computing all the data values such as, for example, voltage, amperes, power, energy and harmonics. These values are made available to the network communication card 1033 via an internal interface which talks to Modbus RTU. As stated herein, it is envisioned that this could be any protocol or just values of data in memory.

The network communication card 1033 at the other end, is responsible for gathering all usable data produced by the measuring unit 1010 and for keeping this data updated at near 1 second intervals.

When the IEC 61850 routines 1203 need to read data, it is done by means of a read handler routine, which is actually a callback function that interfaces with the native database 1206 of the network card. In this way, the read handler does not need to poll the measuring unit 1010 directly to request and wait the data, instead the data is taken immediately from the native database 1206 memory. Each data has a time stamp which is also available to the read handler, and as a consequence to the IEC 61850 routines 1203. For dead-banded data, the data time stamp informs when the data exceeded its dead band limit. For non-dead banded data, the data time stamp informs when the date was updated from the measuring unit 1010. The timestamp represents a UTC time with the epoch of midnight (00:00:00) of 1970:01:01. Each timestamp has associated a clock synchronization and time accuracy information. For IED 1010, the timestamp informs that it is either not synchronized, based on internal clock, or it is synchronized to external clock, such as SNTP and IRIG-B. The timestamp also informs its accuracy based on the synchronization information: 10 msec if it is not synchronized, 1 msec if it is using SNTP and 0.1 msec if it is using IRIG-B. This information is modified according to the current state of meter or IED 1010, for instance, the meter or IED 1010 has SNTP clock synchronization but lost the connection to SNTP server, then the clock synchronization and accuracy information will be changed, when the timestamp is update according to the above, to no synchronized and 10 msec of accuracy.

Most of the data is read only. However some data, for example, limits dead bands, and configuration data can be writable by the IEC 61850 routines 1203 only when parsing the file. So the configuration of such parameters can take place. Therefore, there is a write handler function linked to the IEC 61850 routines 1203 to be used when a parameter needs to be configured. The data gathering to update the native database 1206 from the network communication card 1033 is transparent and independent of the access point to the native database 1206 for the IEC 61850 routines 1203. The handlers are called within the IEC 61850 routines 1203 when a data access is needed.

At Step S1136, which is outside the scope of Service IEC reception, transmission service is called in a similar manner to how the reception service was called. The transmission service, which sends pending responses and handshake packets from the IEC 61850 routines 1203, is frequently called from the main loop. The IEC 61850 routines 1203 transmit service assures that the sockets with active connections are able to send data before actually sending the data, so the process is never blocked but needs to be polled for checking transmission availability. Transmission errors are handled in a similar way as reception errors, with possible critical errors being detected before they actually happen.

Figure 18:
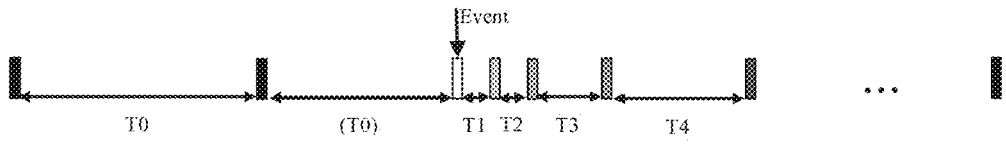
FIG. 18 illustrates a retransmission process in accordance with an embodiment of the present disclosure.

The application monitors events from data into a referenced data set. If an event occurs the application informs the IEC 61850 routines that a new GOOSE message needs to be sent. This new GOOSE message is repeatedly sent following some retransmission criteria, as shown, for example, in FIG. 18. The GOOSE message will have, among others things, the referenced dataset.

At Step S1138, which is outside the scope of Service IEC reception, regular delayed events, not necessarily related to the IEC are handled.

At Step S1140, "BSD to Native Translation", a conversion of the management (handling) signals is needed to convert the management signals from a network interface model of the network interface 1201 to the Berkeley socket model version of TCP/IP because the IEC 61850 protocol routines 1203 use the Berkeley Socket model as an interface to communicate with the TCP/IP layer. The network socket IEC 61850 interface translator 1202 performs this translation of the management (handling) signals. (See Step 1306 of FIG. 13).

At Step S1142, "Validate RFC1006 and Parse MMS packet", the IEC 61850 routines 1203 process the incoming request contained within the IEC 61850 MMS packet. (See Step 1308 of FIG. 13). The IEC 61850 routines 1203 determines whether to emit a reply, or otherwise perform the actions according to the request. (See Step 1310 of FIG. 13). If a reply needs to be sent without accessing data from the native database 1206 (e.g., getting status, directory tree, etc.), the IEC 61850 routines 1203 send the reply back to the requestor through the network interface translator 1202. (See Step 1312 of FIG. 13).

At Step S1144, "Call to IEC 61850 data interface 1204", it is verified that if a reply to a user request requires data such as data which resides in the native database 1206 (e.g., voltages, currents, harmonics, etc.), it creates an internal data request to the IEC 61850 data interface 1204 in order to retrieve the needed data from native database 1206 before sending the reply through the network interface translator 1202. See Step 1314 of FIG. 13.

At Step S1146—"Stash replies in output buffer". Reverse services.

At Step S1148—"Callback and Data formatting", most of the functions (i.e., the ones that retrieve data from the native database 1206), are functions that are linked at compile time with information from the configuration file (.CID). These functions are linked dynamically when the IEC 61850 directory is built at run time, when the IEC 61850 protocol routines start up. The latter ones are referred as callback links; they are mapped through 1210 to the actual functions in internal database 1204.

At Step S1150, native database 1206 has its own interface for facilitating the retrieval of data. In this manner, the IEC 61850 data interface 1204 translates requests from the IEC 61850 routines 1203 into a form that the native database 1206 interface understands.

The native database 1206 keeps its internal data up to date by receiving data from the data gathering process module 1208, which in turn uses the Modbus RTU communication protocol to retrieve data from the measuring unit 1010 of the IED 10. The data gathering process module 1208 sends periodic data queries to the measuring unit 1010 of the IED 10 on a regular interval basis. (See Step 1318 of FIG. 13). When the measuring unit 1010 replies, the data is stripped from the reply by the data gathering process module 1208 and passed back to the native database 1206. This refresh process is performed on a continuous basis irrespective of whether there are any data requests received from the IEC 61850 routines 1203. In this manner, the native database 1206 can always reply with the newest data (e.g., within a 1 second period) to any requests issued from the IEC 61850 routines 1203, formatted by the call-back function in the way the IEC 61850 routines 1203 needs it. The data gathering process performed by the data gathering process module 1208 and the database 1206 itself collectively comprise the means to keep the process efficient and reduce the response time of the IEC 61850 routines 1203 requests.

The database 1206 holds the data, its age, and its status. In this manner, when the IEC 61850 routines 1203 need to retrieve a value, a fresh value may already be stored in database 1206 thereby precluding the need to perform a Modbus RTU transaction with the measurement side of measuring unit 1010. Note that the data gathering module 1208, the native database 1206 and the measuring unit 1010 may all be disposed on the same physical board and may be in at least one processor or spread among separate processors.

Figure 14:
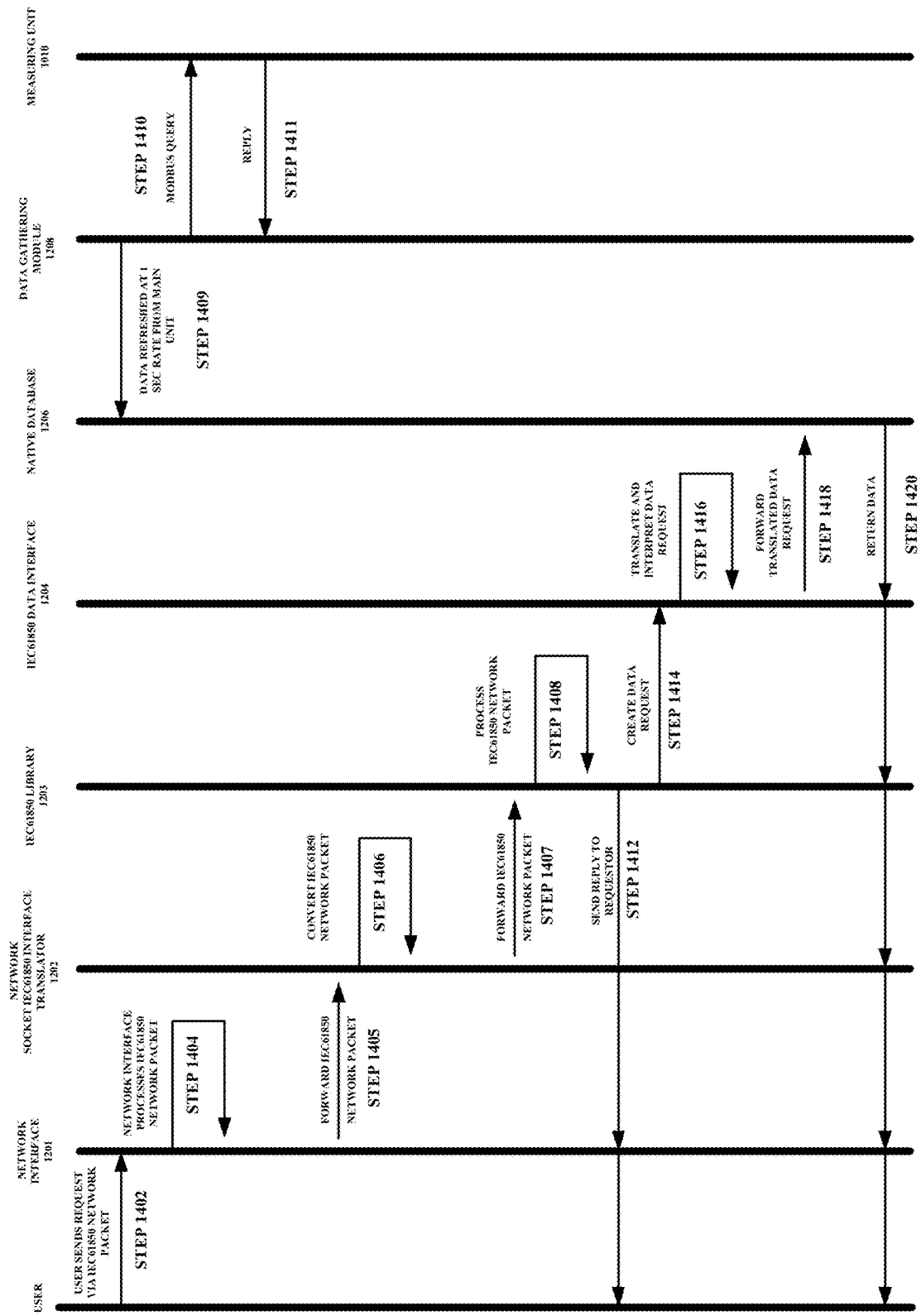
FIG. 14 shows a non-limiting and exemplary data flow diagram that corresponds to the steps of exemplary flowchart of FIG. 13.

FIG. 14 shows a non-limiting and exemplary data flow diagram 1400 that corresponds to the steps of exemplary flowchart 1300 of FIG. 13. The data flow begins with a user sending a TCP/IP synchronization request in accordance with the standard TCP/IP protocol to port 102 of the network interface 1201. The request is sent via an IEC 61850 network packet 1245. In the event the user request is allowed, the network interface 1201 sends an ACK and SYN back to the user (not shown). The TCP/IP layer on the user side sends an ACK in response (not shown), thus forming an established state.

In the established state, the IEC 61850 network packet 1245, comprising one of a user information request, data request or configuration request, is packaged into the TCP/IP layer. The IEC 61850 packet 1245 is constructed in accordance with the MMS protocol, which is one protocol from among a plurality of protocols supported by the IEC 61850 standard.

Next, the IEC 61850 network packet 1245 is issued from the client side to the network socket IEC 61850 interface translator 1202 via network interface 1201. (See Step 1402) Requests can comprise, for example, requests for information about measurements (e.g., voltage, current), requests for unit identifications, and requests for status, or commands to perform an action, such as to configure periodic reports. The IEC 61850 network packet 1245 is part of a layered packetized message in which an Ethernet packet carries an IP packet which carries a TCP/IP packet which carries the IEC 61850 network packet 1245. The IEC 61850 network packet 1245 arrives at the network communication card 1033 through an Ethernet link and it is processed by the Ethernet layer, IP (internet protocol) layer, and the TCP/IP (transfer control protocol for IP) layer sequentially (See Step 1404).

At this point all handshaking of the processed IEC 61850 network packet 1245 enters into the network socket IEC 61850 interface translator 1202, which converts the management signals to the Berkeley Socket interface for further use. (See Step 1406) A conversion of the management signals is needed to Berkeley socket model version of TCP/IP because the IEC 61850 protocol routines 1203 uses the Berkeley Socket model as an interface to communicate with the TCP/IP layer. The IEC 61850 network packet 1245 request is then forwarded to the IEC 61850 protocol routines. (See Step 1407).

The IEC 61850 protocol routines 1203 then process the request contained within the IEC 61850 network packet. (See Step 1408). The IEC 61850 protocol routines then either emits a reply or it performs the actions according to the request. If a reply needs to be sent to the requester, the IEC 61850 protocol routines 1203 are used to send the reply through the network back to the requestor via the network socket IEC 61850 interface translator 1202 and the network interface 1201. (See Step 1412). Most of the actions and requests processed by the IEC 61850 protocol routines 1203 need to get measurement data (voltages, currents, etc.), status information (on-line, faults, electric hook-up type, etc.) or other type of information (name of the unit, model number, time, etc.) from the unit. To this end, the IEC 61850 protocol routines are configured to be able to communicate through its internal firmware interface with the rest of the device 10. Functions specifically created to attend requests from the IEC 61850 protocol routines 1203 were created in the firmware as call-back functions. The name of the call-back functions are registered in the IEC 61850 protocol routines 1203 at compile time, by creating function tables stored in the callback function collection 1210, and their functionality is implemented outside of the IEC 61850 protocol routines 1203. Most of these functions, the ones that retrieve data from the measurement side, are functions that read the data from a native database 1206.

If a reply was not sent to the requestor at step 1412, the IEC 61850 protocol routines create an internal data request to be issued to the native database via the IEC 61850 data interface 1204. (See Step 1414).

The IEC 61850 data interface 1204 receives the internal data request constructed by the IEC 61850 protocol routines and forwards it to the native database 1206 for execution. (See Step s1416, 1418)

This native database 1206 has its own interface for retrieving internal data, so an interface translates the requests coming from the IEC 61850 protocol routines 1203 into a form that the native database 1206 understands. The native database 1206 keeps its internal data up to date by receiving data from the data gathering process module 1208, which uses the native communication protocol in the measuring unit 1010 to retrieve the data from the measuring side of the measuring unit 1010. The protocol used for this interface is Modbus RTU. The data gathering process module 1208 sends data queries to the measuring unit 1010 on a regular interval basis. (See Step 1410) When the measurement unit 1010 replies, (See Step 1411) the data is stripped from the reply and passed back to the native database 1208. This refresh process is performed at a regular refresh rate irrespective of receiving requests from the IEC 61850 protocol routines 1203. In one embodiment, the refresh rate is on the order of about 1 sec. (See Step 1409) In this way the native database 1208 can reply with the freshest data (e.g., within a 1 second period) to the IEC 61850 protocol routines 1203, formatted by the call-back function in a format required by the IEC 61850 protocol routines 1203.

The data is returned to the requestor (user) from the native database 1206 via the IEC 61850 data interface 1204, the IEC 61850 protocol routines 1203, the network socket IEC 61850 interface translator 1202 and the network interface 1201. (See Step 1420)

The data gathering module 1208 and the database itself 1206 are the means to keep the process efficient and reduce the response time of the IEC 61850 protocol routines 1203 requests. In essence the database 1206 holds the data, its age, and its status (e.g., valid data in database 1206 are refreshed once per second from the data gathering module 408). In this manner, when the IEC 61850 protocol routines 1203 need to retrieve a value, a fresh value may already be stored in native database 1206 thereby precluding the need to perform a Modbus RTU transaction with the measurement unit 1010 of IED 10. Information as the time the data value was read, and the status of the data value is also made available to the IEC 61850 protocol routines 1203, to make best use of the data by the user.

It is to be appreciated that the various features shown and described are interchangeable, that is a feature shown in one embodiment may be incorporated into another embodiment.

An overview of the IEC 61850 will now be provided. The IEC 61850 standard was created to provide a common methodology for the design and implementation of automation systems. Use of the standard provides both challenges and rewards to the user. The challenge is mainly the rather steep learning curve to understand all aspects of the standard. The reward is a vastly simplified method to create inter-operable automation systems in comparison to previous generations of standards such as DNP3 and Modbus.

IEC 61850 has a number of high-level goals:

Specify a design methodology for automation system construction

Reduce the effort for users to construct automation systems using devices from multiple vendors Assure interoperability between components within the automation system "Future-proof" the system by providing simple upgrade paths as the underlying technologies change.

Communicate "information" rather than "data" that requires further processing. The functionality of the components is moved away from the clients toward the servers.

It differs from previous standards in many high-level ways:

It species all aspects of the automation system from system specifications, through device specifications, and then through the testing regime.

The standard specifies a layered approach to the specification of devices. The layered approach allows "future-proofing" of basic functionality by allowing individual "stack" components to be upgraded as technology progresses.

The individual objects within devices are addressed through a hierarchy of names rather than numerical indices Each object has precise semantics across the entire vendor community Devices can provide an online description of their data model A complete (offline) description language defines a consistent view of all components within the system IEC 61850 initially targeted the electrical substation as the complete "system" but has evolved into a more general viewpoint to include Distributed Energy Resources, distribution line equipment, Hydro-electric power plants, and wind power plants. From the viewpoint of the individual server devices, IEC 61850 provides a means for device vendors to compete on a level playing field of the protocol while innovating on high-level features.

The next section discusses the communication "stack" associated with IEC 61850 devices. The importance of this stack is that it provides one of the ways that the standard uses for "future-proofing" by using the independent layering concept.

A short glossary of terms will be helpful before continuing:

IED: Intelligent Electronic Device. The "box" which implements a feature set

SCL: System Configuration Language. An XML (text-based) file interchange format between 61850 tools. 4 types of files: SSD, ICD, SCD, and CID.

Client: The application which processes the automation information

Server: The "box" which sources the information processed by clients

Publisher: A source of information without knowledge of information users

Subscriber: A destination for information from a publisher

Logical Device (LD): top-level of the hierarchy of an IED data model

Logical Node (LN): mid-level collection of structured Data Objects

Data Objects (DO): logical collections of data grouped by data source

Data Attribute (DA): more detailed layers in data hierarchy

MMS: Manufacturing Messaging Specification: Application-layer protocol used by IEC 61850 (ISO/IEC 9506). It specifies many services not used by 61850

BER: Basic encoding Rules: Presentation layer used to encode "bytes-on-the-wire". It uses a tag-length-value system to self-describe the data (ISO 8825)

Dataset: Named grouping of data. Encoded in MMS as named-variable-list

Reports: Information sets communicated between devices. Consists of header information and the contents of a dataset. These are not human-readable.

GOOSE: method to transport low-latency data between devices

Services: the "verb" used in the verb-noun description of 61850 communications. For example: "read-file" when applied to the file system Security: the ability to verify that a requested action has taken place; achieved though supervision.

Supervision: server operation where a feedback point is compared to the desired operation results after the physical operation should succeed.

Stack: a layered collection of software which implements communication

Ethertype: an addressing mechanism used at layer 2 of the communication stack to determine the "type" of the received Ethernet data frame.

VLAN: Virtual Local Area Network: a method to segregate data traffic on a Local Area Network and provide prioritization ACSI: Abstract Communication Service Interface: the technology-independent description of services used in IEC 61850

Communication Stack

Figure 19:
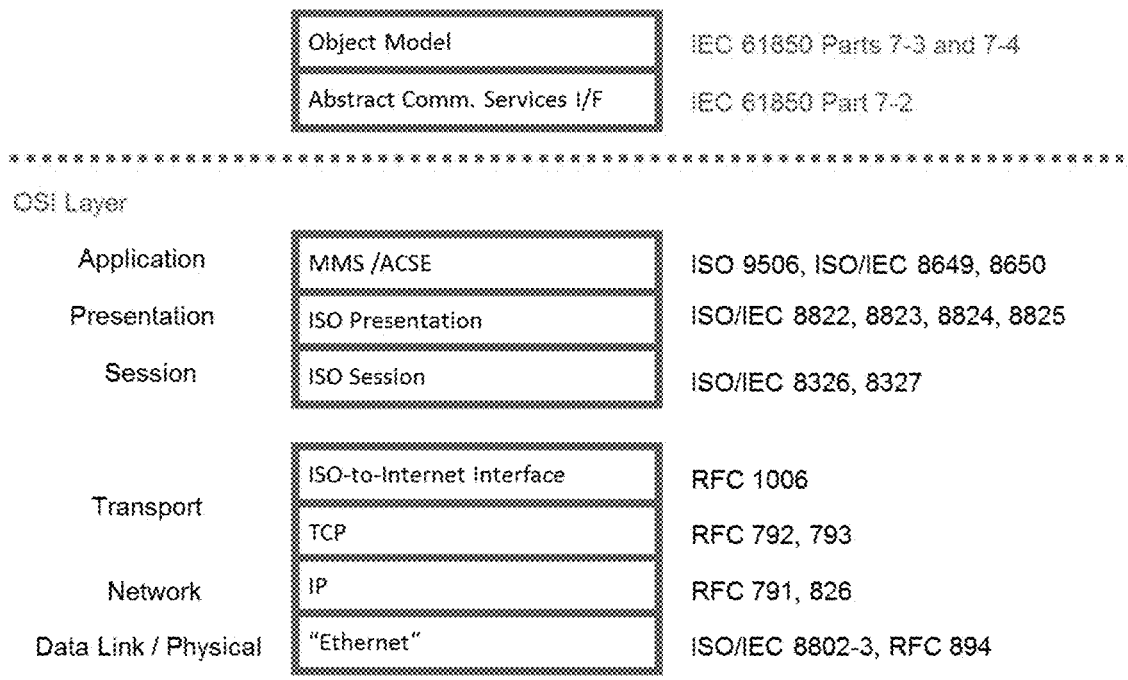
FIGS. 19-25 illustrate various implementations of a protocol employed by an intelligent electronic device in accordance with the present disclosure.

ISO/IEC 7498-1 (ITU x.200) describes the 7-layer network reference model. The layers are summarized in FIG. 19. Lower numbered layers are closest to the physical media; higher numbered layers are closest to the application. Conceptually, each of these layers can be replaced with new layers as technology evolves. For example, there is current work within IEC to replace the MMS application layer with one based on "web-services" to allow easier integration with enterprise-level ("back-office") applications. This change would leave intact all of the existing object definitions and basic communication mechanisms while allowing migration to modern web-based (HTTP) technology.

Layer 1—Physical layer (PHY)

This layer specifies the physical interface to the network. For example, typical networks utilize RJ-45 connectors to 10/100/1000 Mbit copper twisted-pair infrastructure. Most devices use a 100 Mbit copper interface with automatic fallback to 10 Mbit and capability to use 1000 Mbit with the same cabling. The "other end" of the connection is typically an Ethernet switch (technically known as a bridge). Another common option for physical layers, especially in electrical noisy environments, is optical fiber (10FL, 100FX); each of which used incompatible optical wavelengths. This layer has no addressing information.

Layer 2—Data Link Layer (MAC)

This layer specifies the conversion of bits presented at the physical interface into "frames" of data. The layer also handles multiplexing/demultiplexing addressing to higher layers as does all layers above layer 1. A maximum frame size of 1536 octets (bytes) is defined by IEEE 802.3. Typical users of this layer include IP (both IPv4 and IPv6), IEC GOOSE, IEEE 1588 (Precision time Protocol), inter-router messages. This layer uses a 48-bit Media Access Control (MAC) address normally written in the form "uu-vv-ww-xx-yy-zz" where each is a hexadecimal (0 . . . 9 and A . . . F) digit. 3 types of addresses are possible: broadcast (received by each attached device) when all digits are "FF"; unicast (received only but a single targeted device) when "uu" is an even value); and multicast (selectively received) when "uu" is an odd value. Unicast addresses are permanently assigned to a specific piece of hardware (for example, a network card) and are unique amongst all possible devices. This layer also provides a service known as Virtual Local Area Networks (VLANs) which allows sharing of the same physical network by multiple groups of devices, each with differing delivery priorities.

Two types of addressing are used at this layer: EtherType (numeric "name" of upper-layer protocol) and VLAN address. The VLAN address information identifies one of 4095 "virtual network identifiers" as well as a message priority field with 1 being the lowest priority and 7 the highest priority.

Layer 3—Network Layer

This layer provides routing between networks. Typical applications of this layer IP and Novell networks. The addressing information at this layer, when using IP, is known "IP address" which are user-defined and not fixed by the hardware. In IPv4, these addresses are commonly written as "ww.xx.yy.zz" where each pair is a decimal number (IPv6 using a similar but different addressing scheme). In IPv4, two types of addresses are used: public addresses which are globally unique and assigned by the Internet authorities IANA) and private addresses which are unique only to local infrastructure. The important difference between these two types of addresses is that private addresses are not allowed to exist on the public internet without "translations". Examples of private addresses include 10.x.y.z and 192, 168.1.x.

Layer 4—Transport Layer

This layer provides reliable transport of messages to/from upper layers. It is also sometimes used to transport short "best-effort" messages. The addressing information used at this layer for IP is "ports". Example applications of this layer, when used with IP, include TCP (for reliable byte level transport) and UDP (for "best-effort" transport). IP uses this layer as the layer directly below the application layer. Examples of TCP and UDP applications include Hyper Text Transport Protocol (TCP port 80), Network Time Protocol (NTP and SNTP at UDP port 123), Modbus (TCP port 502), DNP3 (TCP and UDP ports 20000), and "RFC 1006" (TCP port 102).

RFC 1006 allows an interface to ISO layers (the "other" network standard) which typically connects to the ISO layer 4 protocol known at TPO. The ISO layer 4 uses an additional addressing scheme known as a "transport selector" (TSEL). A typical value of a TSEL is "00 01".

Layer 5—Session Layer

This layer provides transaction-oriented messages for upper-layer protocols such as database transactions. IEC 61850 uses this layer to establish upper-layer "connections". This layer uses an addressing scheme known as a "session selector" (SSEL) with a typical value of "00 01".

Layer 6—Presentation Layer

This layer converts abstract upper-layer information (such as "send an integer") into an architecture-independent sequence of bytes and also establishes encryption and authentication mechanisms. IEC 61850 uses Basic Encoding Rules (BER) to perform the formatting functions. This layer uses "presentation selector" (PSEL) for addressing information with a typical value of "00 00 00 01".

Layer 7—Application Layer

This layer handles interrogation and commands. IEC 61850 uses Manufacturing Messaging Specification (MMS) at this layer to implement the abstract services defined in IEC 61850. Example services include "provide a directory of objects known within the server", and "return the value of the named object X". This layer uses "application process title" (AP Title) and "application entity qualifier" (AE Qual) to optionally distinguish a possible multiple of application layer users. A typical AP Title would be "1 3 9999 100" and a typical AE Qual value might be "101".

Layer 8—User Layer

This is the layer that is NOT mentioned in ISO/IEC 7498-1. This is the IEC 61850 layer itself discussed in the standard 61850-7-x (this is known as the Abstract Communication Service Interface or ACSI). The layer is responsible for interpreting commands such as "operate a control output using a select-before-operate protocol". Addresses used at this layer include Logical Device (LD) name, Logical Node (LN) name, etc. IEC 61850 applications directly utilize this layer.

Layer Summary

1) Every device has a pre-defined (unicast) 48-bit MAC address which is globally unique and often unchangeable (there are some exceptions)

2) IPv4-enabled devices have a configured "IP address" assigned by IT people and specified in the 61850 System Configuration Language (SCL). Additionally, they require a "subnet mask" and "default gateway". These values are also assigned by IT people and placed within the IEC 61850 configuration file.

3) Applications which use TCP/IP or UDP/IP generally "know" their port number. TCP/IP and UDP/IP use two sets of port numbers: source port and destination port. Clients use the well-known destination port numbers while picking "random" (ephemeral) source port numbers. Servers reverse these two numbers when responding to clients.

4) IEC 61850 devices require that the TSEL and SSEL and PSEL to be specified. Some devices also require the AP Title and possibly the AE Qual to be specified. These values are specified at the time of system configuration. These are mainly a concern of the system configuration software.

5) Some advanced IEC 61850 services require the use of a multicast MAC address, VLAN addresses, and VLAN priorities. These values are also specified at time of system configuration.

Abstract Communication Service Interface (ACSI)

The ACSI defines high-level services used by IEC 61850 devices. In networking, there are two types of devices:
  clients—issue commands or interrogate devices
  servers—respond to requests by the clients.

An example in the PC world is the Internet Browser. Here the browser is the client making specific requests (for example "display the Google search page") and the server is Google (which receives the requests and sends back information on how to build the page along with a "graphic-of-the-day). The client specifies the IP address of Google along with a TCP destination port of 80 when making the request along with an ephemeral source port number. Google servers respond with a destination port number of the ephemeral port and a source port of TCP 80.

IEC 61850 operates in the same client/server mode for some of its communication but also adds additional modes such as "reporting".

ACSI Service Groups

ACSI defines 14 groups of services with about 56 total services in those groups. Each device vendor chooses components of the service groups which meet the needs of the device.

Server: Basic directory (retrieve device model) capabilities

Association: maintenance of connection between servers and clients

Logical Device: retrieval of Logical Device information (directory)

Logical Node: retrieval of Logical Node model and information (directory)

Data: data value read and write

Data-set: maintenance of named object groupings

Substitution: capability to temporarily assign fixed values to data

Setting-group: capability to alter many settings

Reports and logs: capability of server to autonomously record and transmit to information to clients (includes buffered reporting for SCADA, unbuffered reporting for user interface updates, and logging for SOE reporting)

GSE: high-speed server-to-server messaging (includes GOOSE and now obsoleted GSSE)

Sampled values: capability to transmit cyclic (periodic) data

Controls: capability to change output values with optional supervision

Time and time synchronization: capability to synchronize time between devices

File transfer: file directory and file transfer

IEC 61850 servers are required to implement the service groups: Server, Association, Logical Device, Logical Node, and Data. All other service groups are options. Some services within the mandatory service groups are also optional. The implemented services are specified in the Protocol Implementation Conformance Statement (PICS).

ACSI Data Types

ACSI defines 17 basic data types and "common ACSI types". The basic data types are:

Integer: signed and unsigned in various sizes

Floating point: single and double precision

Boolean: value of false or true

Enumerated: well-defined ordered named values (example: "on" and "off")

Coded Enumeration: packed bits and enumerations

Octet strings: arbitrary sequences of bytes

Visible strings: ASCII printable character sequences

Unicode strings: strings include foreign language characters such as Cyrillic

ACSI also defines "simple" structured data objects:

ObjectName: name of a data object from a specific hierarchy level

ObjectReference: unique name of object within entire system

ServiceError: protocol error codes

EntryID: name of a specific data instance within a report

EntryTime: time associated with a specific EntryID

Timestamp: time of occurrence with sub-microsecond resolution

TriggerConditions: reason codes indicating why a report was created

ACSI defines a mechanism to create new structured data objects. This mechanism is used to construct standardized "Common Data Classes" (groups of simple types) which form the type of higher-level "Data Objects". ACSI uses these Common Data Classes (CDCs) to construct all Data Objects (DOs) which are then used to construct Logical Nodes (LNs).

ACSI uses the concept of "Functional Constraint" to group items at the Common Data Class level. Typical Functional Constraints include "MX" (measurements), "ST" (status objects), and "DC" (descriptor elements). Functional Constraints are most important when constructing "datasets" (described later).

Device Model Hierarchy

Figure 20:
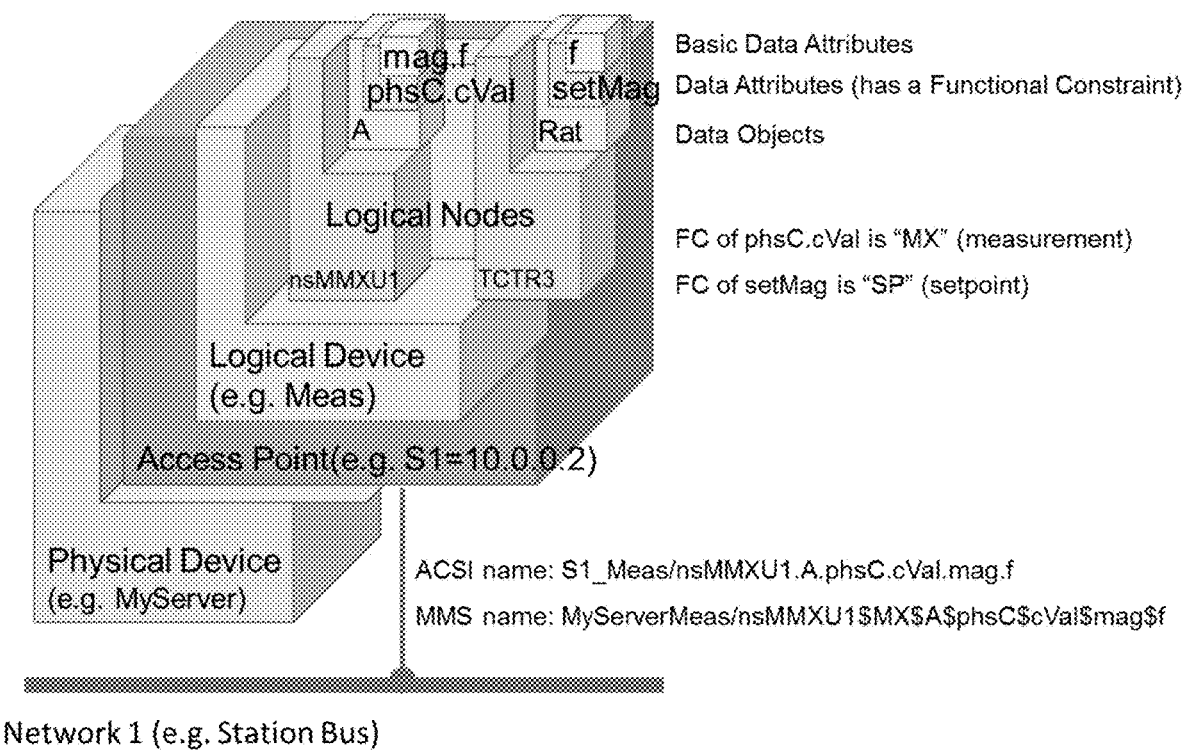

ACSI defines a data model hierarchy for servers, as shown in FIG. 20.

Server: a physical device or application program. Has an associated user manual

Access Point: a "connection point" to a communication network.

Logical Device (LD): a vendor-defined grouping of functions (Logical Nodes)

Logical Nodes (LN): standardized grouping of Data Objects by function

Data Object (DO): standardized named objects with a specific type (CDC)

Figure 21:
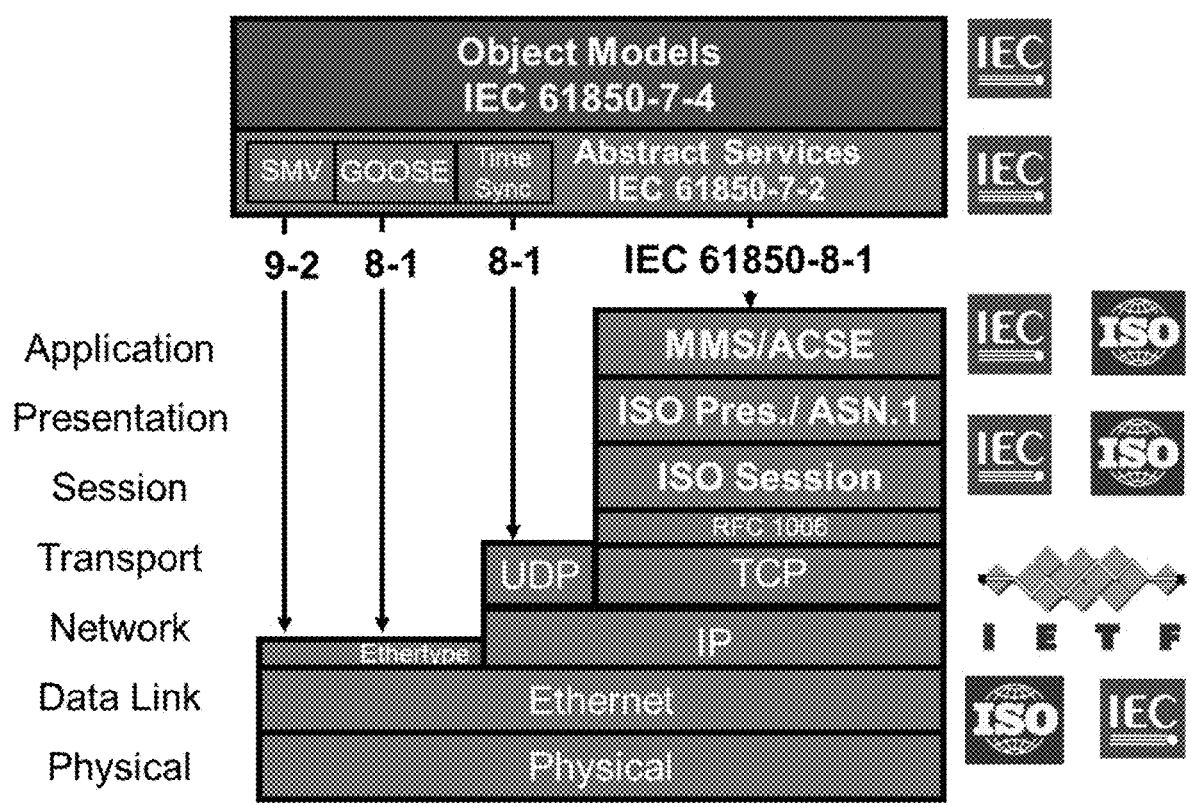

Data Attributes: the "type" of a Data Object, it is a list of detailed attributes An example of an ACSI object would be the measurement of the deadbanded RMS current in Phase C of the measured circuit:

Server: "myServer"
Access Point: "S1"
Logical Device" "Meas"
Logical Node: nsMMTR1
Data Object: A
Sub-Data Object: phsC
Data Attribute: cVal
Sub-Data Attribute: mag
Basic Data Attribute: f Mapping ACSI ACSI maps to the "real world" using different interfaces, as shown in FIG. 21. Most of ACSI maps through the MMS layer to the ISO application layer. There are two exceptions to this rule:

GOOSE and Sampled Values map directly onto Layer 2

Time Sync maps onto UDP/IP

Mapping to MMS

ACSI "maps" onto the underlying Layer 7 protocol, Manufacturing Messaging Services (MMS). For the most part, this consists of renaming portions of the model.

The ACSI server name is not mapped at all. The Access Point name is mapped onto the full address of the device (IP address, etc.). The Logical Device is mapped onto MMS "domains". The Logical Node is mapped onto MMS "named variables" within a domain. Objects within the Logical Node are mapped as sub-structures within the named variables with the "." replaced with a "$". Additionally, the MMS model includes a "functional constraint" which is placed between the Logical Node name and the data object. Datasets are mapped to MMS "Named Variable Lists".

Figure 22:
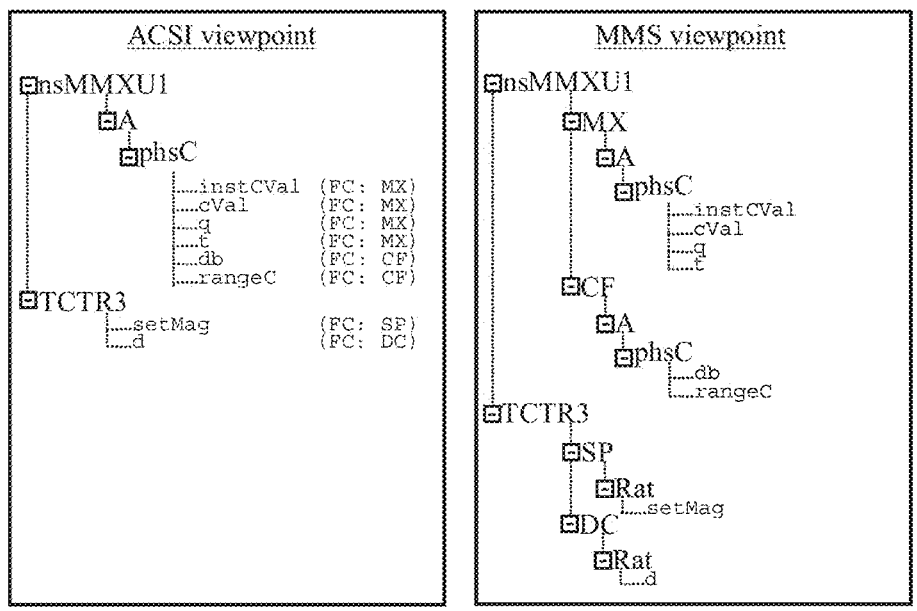

For example, the MMS name of the above-named energy object would be: Domain=myServerMeas, object=nsMMXU1$MX$A$phsC$cVal$mag$f FIG. 22 shows an image that maps ACSI (left side) to MMS (right side).

This mapping is important to understand because many monitoring tools present the information seen at the communication level which does not include ACSI names, but only MMS structures.

IEC 61850 Standards

Figure 23:
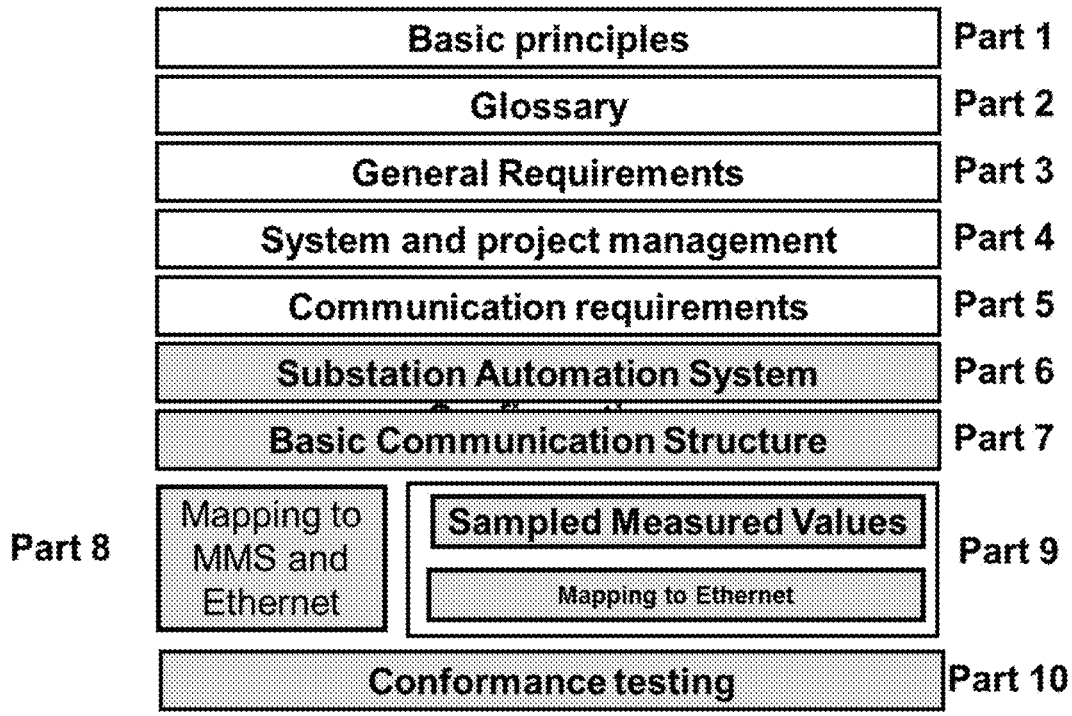

IEC 61850 is partitioned into 14 sets of standards as shown in FIG. 23. The most important parts of the standards are 61850-7-1 through 61850-7-4 which define the ACSI model of servers and the services used to manipulate the model.

Clients and Servers and Publishers and Subscribers

The understanding of the roles of clients and servers and publishers and subscribers is key to the use of IEC 61850 devices.

A client is the requester (sink) of information while the server is the responder (source) of information. Information generally flows on a request-response basis with the client issuing the request and the server issuing the response. However, the concept of servers is extended to provide autonomous transmissions when "interesting" events occur within the server. This information flow is always to the client requesting this "interesting information".

The publisher/subscriber relationship differs from the client/server in that there is no explicit one-to-one relationship between the information producer and consumer. Publishers issue data without knowledge of which devices will consume the data, and whether the data has been received. Subscribers use internal means to access the published data. From the viewpoint of IEC 61850, the publisher/subscriber mechanism use the Ethernet multicast mechanism (i.e. multicast MAC addresses at layer 2). The communication layer of the system is responsible for transmitting this information to all interested subscribers and the subscribers are responsible for accepting these multicast packets from the Ethernet layer. The publish/subscribe mechanism is used for GOOSE and Sampled Value services.

IEC 61850 Clients

Clients are the devices or services which "talk" to IEC 61850 servers. The function of the client is to configure the server "connection", set up any dynamic information in the server, enable the reporting mechanisms, and possibly interrogate specific information from the server. Most clients are relatively passive devices which await information from the server but perform little direct ongoing interactions with them except for control operations.

Some clients are used for diagnostic purposes. These devices generally perform ongoing direct interrogation of the servers. A specific example is the "desktop client" where the engineer remotely diagnoses system problems or retrieves data which is not normally sent from the server (for example, power quality information).

IEC 61850 clients are highly interoperable with IEC 61850 servers. Clients are able to retrieve the server object directory (when needed) and then perform any allowable operation with that server.

Figure 24:
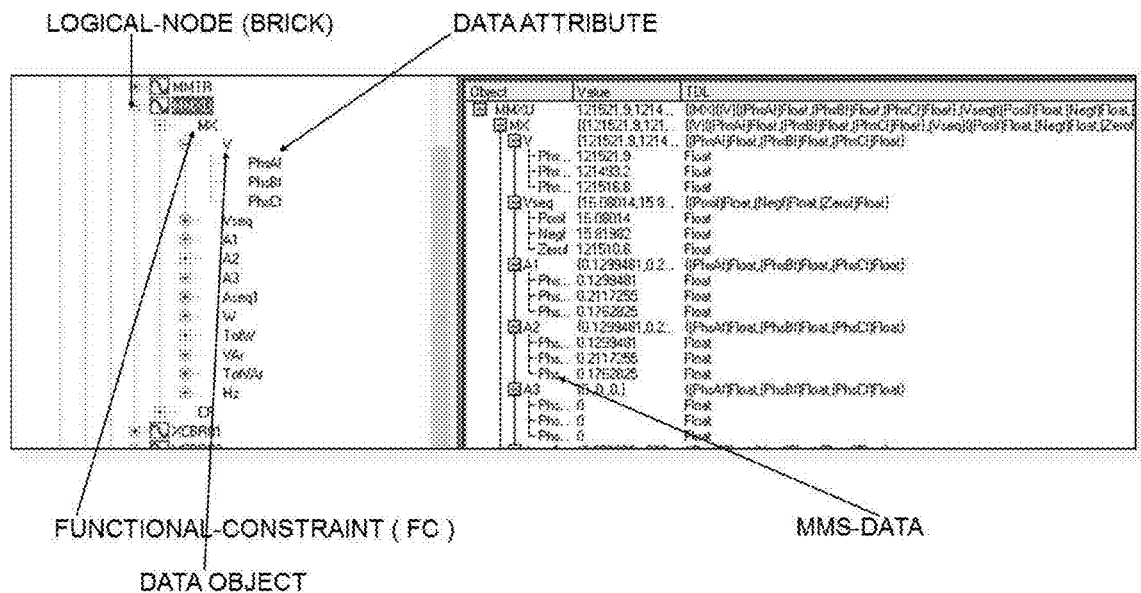

Example clients include:
Diagnostic clients: Omicron IED scout, SISCO AX-S4 61850, TMW Hammer
"Real Clients": KalkiTech gateway, Siemens DIGSI An example of the object model display on a diagnostic client is shown in FIG. 24.

IEC 61850 Detailed Services

IEC 61850 provides many services available to clients. These are detailed below.

Directory Services

IEC 61850 allows a client to retrieve online the entire data model of a server. The data model is a hierarchy of objects starting with the Logical Device and working down towards the data attributes.

Data Model Components

The data model of an IEC 61850 server can be quite complex. It consists of the Logical Devices and Logical Nodes and Data Objects and Data Attributes previously described with additional components.

Dataset are used to name a group of objects and/or attributes. This name can be used to refer to the group of objects either direct retrieval or incorporation into reports.

Control Blocks are used to perform administrative functions for reports, GOOSE, and Sampled Values. Examples of the administration include enabling the reports, setting the integrity period, and performing a report "General Interrogation" (request to return every value within the associated dataset).

Reports are used to transport data from the server to the client without requiring ongoing client interaction. A report consists of a dataset along with header information and is sent on the client connection to the server. Two types of reports exist:
Unbuffered reports—used to transport "best effort" information to a display device or controller. "Best efforts" means that the data will be sent as long as a connection exists between the client and server. If the connection is lost, then all of the information is lost.
Buffered reports—used to transmit SCADA information to a client. This is similar to unbuffered reports but the server maintains a limited amount of data if the client and server lose the communication link.

Data Sets

Datasets are named groups of data objects within a server. The dataset exists within Logical Node "LLNO". Control Blocks (such as reports or GOOSE) use datasets as the "payload" reference. A dataset must exist within the same Logical Node as the associated control block.

Datasets are generally created at configuration time when the control blocks are defined. There is a practical limit to the number of elements within a control block.

A dataset element is described as "Functionally Constrained Data" or a "Functionally Constrained Data Attribute" using the "FCDA" element of the SCL language. This FCDA element names the Logical Device, Logical Node, Data Object, a Functional Constraint, and optionally a Data Attribute. For example, one element of a dataset could be identified as
LD="Meas", LN="nsMMXU1", DO="TotPF", FC="MX"

Which would result in that element containing a structure with all data measurement of the total power factor measurement object (specifically, the instantaneous power factor, deadbanded power factor, its data quality indicator, and the timestamp indicating the last change to the deadbanded power factor value value).

A second dataset element could be identified as
LD="Meas", LN="nsMMXU1", DO="A.phsC", DA="cVal.mag.f" FC="MX"
which would result in that element containing a single floating-point value of the deadbanded phase-C amperes.

Buffered and Unbuffered Reports

Reports provide a method for the server to push data to a client without requiring any active involvement by the client. The report consists of a list of changed data and is of the form of an "MMS Information Report" (i.e. it is not human readable). Two types of reports: buffered and unbuffered.

Buffered reports are used in cases where it is important that every event be transmitted to the client even if connectivity has been lost. Examples of this include input transitions. Buffered reports require resources within the server to store the information during times of connectivity loss. Upon the re-establishment of a connection, the client and server perform a re-synchronization process to ensure that the client receives the reports generated while the connection was lost. There is a finite limit to this storage, after which the synchronization will not be perfect.

Unbuffered reports are used to communicate present conditions to a client. They are identical to buffered reports except that no re-synchronization is possible (and they consume far less server resources).

Both report services automatically determine when transmission of the report is required. This is done by monitoring the contents of the dataset for changes and transmitting only the changed values. Clients can choose to optimize network traffic by requesting that report transmission be delayed for a finite time (bufTim) after the first change to the dataset. This allows changes which occur "almost simultaneously" to be sent within the same dataset. Another mechanism allows periodic transmission of the entire dataset (intgPd). Still another mechanism allows a client to request the contents of the entire dataset (General Interrogation, GI).

Reports are assigned to "Control Blocks" which define properties of the report such as the dataset name, the control block name, and other properties. The control block name is the communication element used as the basis for data transfer.

Sampled Values

IEC 61850 used the sampled value mechanism to report periodic (cyclic) data to a subscriber. The period between samples is fixed by the server at configuration time. Typically, this is used to transmit a fixed number of raw analog samples per nominal power-line cycle. For example, 80 samples per nominal cycle at 60 Hz means that exactly 4800 samples are transmitted per second. High samples rates require a high communication bandwidth. Another common use of sampled values transmission is the use of synchrophasors which are transmitted at a relatively low rate (10-120 samples per second). Sampled Values use control blocks in a similar fashion as reports.

GOOSE

GOOSE is used to transmit aperiodic information between devices with very low latency. GOOSE is similar to reports but uses a publish/subscribe mechanism using LAN multicast. This means that the message originator sends one message without regard to the number of receivers, making it very scalable. GOOSE differs from unbuffered and buffered reports in the following ways:

Upon any change, the entire GOOSE dataset is transmitted

Senders of the GOOSE receive no receiver acknowledgement. Reliability of the messaging is accomplished by repeated transmissions of the information with increasing intervals between these repeated transmissions.

It is not possible to add intentional delay

The GOOSE packet indicates when the next transmission is expected

The maximum interval between transmissions is defined on the order of seconds. This allows the integrity testing of the communication link.

The last point needs emphasis. It implies that GOOSE communication channels are self-checking because the lack of a transmission within the interval set by the previous GOOSE indicates a fault in the system. This makes the GOOSE mechanism more robust compared to a "wired" connection between devices. Also, due to galvanic isolation requirements between wired devices, there is an inherent delay while output relays activate and input debounce takes place when using wired connections. GOOSE eliminates these delays and actually provides faster communication than dedicated wired links in most cases. GOOSE uses control blocks in a similar fashion as reports.

Controls

The IEC 61850 control model is used to operate outputs with optional supervision. The model is quite complex with many options. Four types of controls exist, 2 each with normal-security and 2 with enhanced-security. The term "security" in this context means that the output operation is verified by the server via input changes sourced by the external devices and the results reported back to the client. Normal security controls are responded as a "best-effort" operation. The type of controls are:

Direct Operate with Normal Security (DOns)—report back whether control COULD operate Select-Before-Operate with Normal security (SBOns)— use a two-step operation process. Once a control is selected by a specific client, the control is locked-out from operations by other clients.

Direct Operate with Enhanced Security (DOes)—single-step operation with the server supervising the resulting operation Select-Before-Operate with Enhanced Security (SBOes)—a combination of the above two control types It is important to understand that each control in IEC 61850 includes an inherent feedback point. In other words, every control output has a (mandatory) associated input. Some control point do not use any control operations and simply use the mandatory feedback point.

For example, a valve actuator might have a limit switch as the feedback point. A command to open the value is expected to result in the limit switch eventually indicating the open position. The system designer decides whether the client will perform this supervision (by periodically polling the limit switch) or whether the server should perform this testing. This fits with the IEC 61850 philosophy of moving intelligence toward the server and leaving the client in a passive role.

Each control operation initiated by the client produces a response from the server indicating whether the server is capable of operating the control. Enhanced security operations have an additional phase where the server sends a report to the client upon either timeout or successful completion.

Configuration

IEC 61850 provides a well-defined configuration mechanism using text-based (XML) files known as the System Configuration Language (SCL). Four types of SCL files, each with identical structure, are defined:

SSD—System Specification Description: Used during the specification stage of a system to define physical equipment, connections between physical equipment, and Logical Nodes which will be used by each piece of equipment ICD—IED Capability Description: This is provided by the communication equipment vendor to specify the features of the equipment and the data model published by the equipment.

SCD—System Configuration Description: A complete description of the configured automation system including all devices and all needed inter-device communications. It optionally includes elements of the SSD file.

CID—Configured IED Description: The file used to configure an individual device. It is a pure subset of the SCD file.

The configuration of an IED communication system begins with the set of vendor-provided ICD files which are combined into a SCD file by a vendor-independent System Configurator. The system configurator assigns addresses to the equipment and sets up datasets, reports, GOOSEs, etc. for inter-device communication. The resulting SCD file is then imported by vendor-specific tools into the various devices.

Some vendors add the additional step of filtering the SCD file into a smaller file containing only information needed by the specific device, resulting in a CID file which is used to configure the device. The actual configuration of the device is left unspecified by IEC 61850 except to require that the SCD file remains the source of the configuration information. In this way, consistency of the information across the whole system is maintained.

The important concept of SCL is that it specifies an interface between the software tools themselves and not the behavior of those tools.

SCL files use the concept of an XML "schema" which describes most (but not all) of the restrictions required to ensure a consistent description file. The XML file can be checked by "validators" against the schema using freely available tools.

Anatomy of a SCL File

An SCL file is a well-formed XML file which superficially looks like an HTML file.

The file consists of 6 parts:

Prologue: XML declaration, (XML) namespace declarations, etc.

Header element: Names the system and contains the file version history

Substation element: defines the physical structure of the system

Communication element: defines all device-to-device communication aspects

IED element: defines the data model presented by each communicating device

DataTypeTemplates element: contains the detailed definition of data models

Each type of SCL file has differing required elements with only the prologue and Header element required in every file type.

The (vendor supplied) ICD variation of the SCL file contains a Communication section specifying the lower-layer selectors and default addressing and also an IED section containing the data model of the device.

Figure 25:
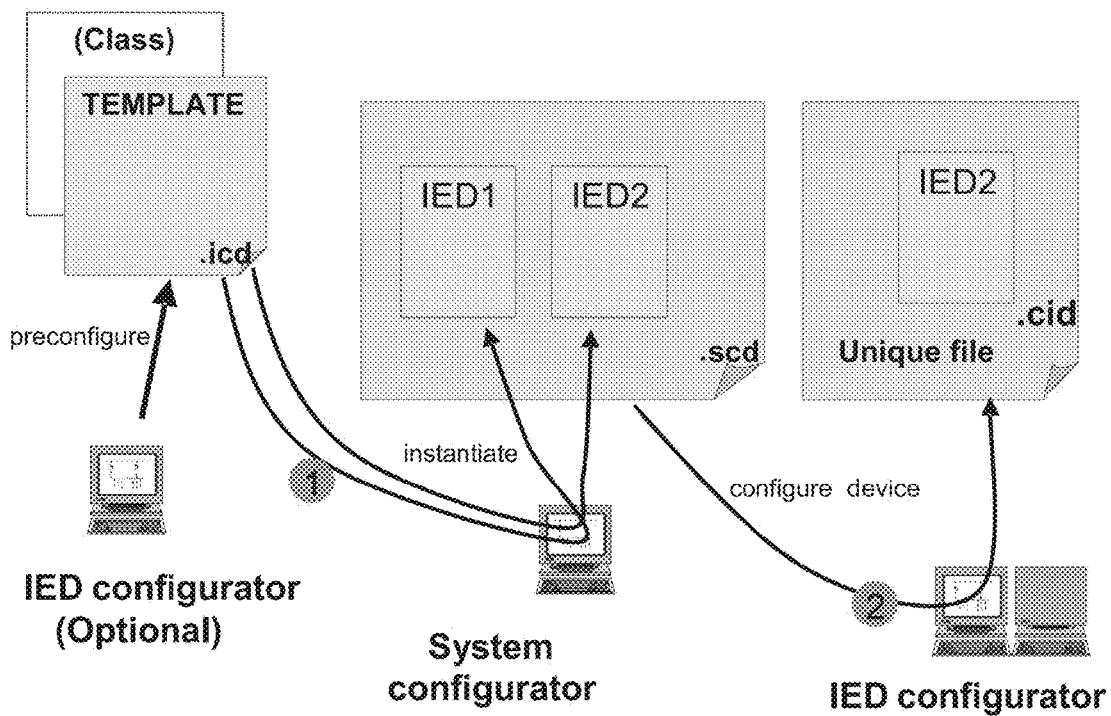

Referring to FIG. 25, the IED template is provided by the vendor (or sometimes created by a vendor tool). This file is imported into the vendor-independent tool (called a "System Configurator"), along with other device templates into the system configuration tool in step 1. The System Configurator uses these templates to instantiate the correct number of IEDs in the system and then provides configuration information. The configuration consists of providing addresses for all IEDs in the system, creation of datasets, configuring control blocks, and setting individual device parameters such as analog deadbands. The System Configurator then creates a SCD file with a consistent view of the entire system. In step 2, the SCD file is used to configure each device using vendor-supplied tools. Vendors are free to choose the configuration mechanism, but the configuration information MUST be derived from the SCD file.

This standard differs substantially from previous standards. It provides vendors with detailed guidance on the construction of their products which maximize interoperability with other devices. The use of "special implementation features" is strongly discouraged by the standard due to the interference with interoperability.

The important take-aways from this introduction are:

Servers perform data processing functions traditionally done by clients. This means that clients can concentrate their efforts on processing useful information and not deriving it from server data streams.

System integration is eased by using interoperable devices and services

Servers become very complex devices with a wide range of (optional) capabilities Precise object semantics eases integration efforts by removing the barrier of "what does this object mean?" question The configuration language describes both device capabilities and the final configured system Summary of Data Elements and Inter-relationships A physical device has a name (IEDname) and consists of one or more AccessPoints An AccessPoint has an IP address and consists of one or more Logical Devices A Logical Device contains LLN0 and LPHD1 and optional other Logical Nodes.

LLN0 (Logical Node Zero) is a special object which "controls" the Logical Device. It contains all of the datasets used for unsolicited transmission from the device. It also contains the report, SV, and GOOSE control blocks (which reference the datasets).

LPHD1 (Physical Device) represents the hardware "box" and contains nameplate information.

Other Logical Nodes implement the remainder of the data model

Logical Nodes (LNs) are standardized groups of "Data Objects" (DOs). The grouping is used to assemble complex functions from small groups of objects (think of them as building blocks). The standard defines specific mandatory and optional DOs for each LN. The device may instantiate multiple LNs of the same type differentiated by either a (named) prefix or (numerical) suffix.

Data Objects represent "real-world" information, possibly grouped by electrical object. The IEC 61850 standard has specific semantics for each of the DOs. For example, the DO named "PhV" represents the voltage of a point on a three-phase power system. The DOs are composed of standardized Common Data Classes (CDCs) which are groups of low-level attributes of the objects. For example, the DO named "Hz" represents system frequency and is of CDC named "MV" (Measurement Value).

Common Data Classes (CDCs) consists of standardized groups of "attributes" (simple data types). For example, the attribute "instMag" represents the instantaneous magnitude of the underlying quantity. The standard specifies mandatory and optional attributes for each CDC. For example, the DO named "Hz" in Logical Node class MMXU contains a mandatory attribute named "mag" which represents the deadbanded value of the frequency. The physical device contains a database of data values which map to the various structures described above. The database values are manipulated by the device to perform actions such as deadbanding (holding a constant value until the underlying value changes by more than a specified amount) or triggering of reports.

The Configuration Process

The user begins the configuration process by importing the vendor-supplied IED files into the system configurator. The system configurator will create an "instance" of the configured device by applying the following information:

The name of the device

IP address, subnet mask, and IP gateway of the device

Datasets:
  The users must decide which information within the IED will be included in reports, GOOSE, etc. and place this information into datasets. The system configurator should allow the selection of information using a "pick list" from information within the ICD file.

Report control blocks (unbuffered and buffered):
  The user must allocate the URCBs to each of the clients. Setup information includes the dataset name, a report identifier, the optional fields to be used in the report, the trigger options, buffer time (delay from first event to report issuance), and integrity time (server periodic reports of all data in dataset). The decision whether to use buffered or unbuffered must be decided by the user.

GOOSE control blocks (GOOSE publisher):
  The user must define the multicast MAC address and AppID which will be used for GOOSE transmission. Additionally, the GOOSE control block requires a dataset name, a GoCBRef, a GOOSE Identifier, and a configuration revision.

GOOSE subscription information:
  GOOSE subscription is performed by entering information in the ExtRef elements of the Input element within the Logical Nodes. The ICD file will contain templates of these elements. The required data source information needed is:
    IED name
    LD Name
    LN Name (prefix, LN Class, and instance)
    DO Name
    (optionally) a DA name
    Functional Constraint The system configurator should perform a consistency check and then output the SCD file.

The SCD file is imported by the "ScdToCid" tool where the user specifies the device name.

The resulting CID file is then imported into the target device

In one embodiment, the lower-level addressing uses PSEL=00000001, SSEL=0001, and TSEL=0001. At the server level, each implements a single Logical Device name formed by concatenating the IED name (chosen by the System Configurator) and "Meas" (ex, "MyDeviceMeas").

The Logical Nodes implemented within include the Logical Device include the standard LLN0 and LPHD1 with optional standard logical nodes in the "M" class (ex, "MMXU") and "T" class (ex, "TVTR"). Each Logical Node contains only standardized objects of standardized types (Common Data Class, CDC). The device is based upon the first edition of the IEC 61850 standards.

Examples of Logical Nodes within the IED of the present disclosure include eneMMTR1 (energy metering) and nsMMXU1 (normal speed Measurement Unit). Example Logical Nodes within another embodiment of an IED include nsMMXU1 (normal speed Measurement Unit) and hsMFLK1 (high-speed flicker measurements).

As an example of the object modeling, the IED consists of one access point (i.e. one IP address) and a single Logical Device named "Meas". It has LLN0 and LPHD1 and many other Logical Nodes. One Logical Node is named "nsMMXU1" which contains the "normal-speed" basic electrical measurements such as volts/amps/wattsNArs/frequency/power factor/etc. The Data Object for total watts is named "TotW" is of CDC "MV". The CDC contains the mandatory attribute "mag", which contains a floating point value of total watts in units of watts. It also contains other attributes such as "q" (data quality) and "t" (timestamp of the change in the value of "mag"). The overall name of the total watts value is "Meas/nsMMXU1.TotW.mag.f".

This attribute can be placed within a dataset named (for example) "MyUsefulData", along with other attributes or even data objects. The dataset resides within the LN "Meas/LLN0" and is named "Meas/LLN0.MyUsefulData".

LLN0 could contain a report named "MyClientWantsToSeeBasicData" which references "MyUsefulData". A client would then, at runtime, request that the server send changes to the dataset to the client in the form of an unsolicited report. The client controls many parameters of how and when the reports are sent.

The configuration of the devices takes place by converting the SCD file exported by the System Configuration tool into a CID file. This CID file contains all of the information from the SCD file which is needed by the IED for configuration. The tool is named "SCDtoCIDConverter" and is a simple publically available program. The resulting CID file is then sent to the IED 10 using HTTP file transfer.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device (IED) comprising:
one or more sensors configured to sense electrical parameters from an electrical power distribution system;
a first processor configured to control the operations of the components of the IED, the first processor further configured to receive the electrical parameters from the one or more sensors and continuously process the sensed electrical parameters to obtain up-to-date power data;
a network communication card comprising an internal database and a data gathering module, the data gathering module configured to continuously retrieve the up-to-date power data from the first processor irrespective of whether a client request for information is received, the data gathering module further configured to send the up-to-date power data to the internal database, and the internal database configured to store the up-to-date power data; and
a housing in which at least the one or more sensors, the first processor, and the network communication card are disposed;
wherein a communication link is configured to enable communication between the network communication card and a remote terminal;
wherein the network communication card is configured to receive an information request from the remote terminal via the communication link;
wherein the network communication card is further configured to retrieve the up-to-date power data from the internal database without involvement by the one or more sensors or first processor; and
wherein the network communication card is further configured to respond to the information request with the retrieved up-to-date power data stored in the internal database without requesting data from the one or more sensors or first processor.

2. The IED of claim 1, wherein the network communication card is configured to send and receive messages in accordance with at least one of the IEC 61850 suite of network protocols.

3. The IED of claim 1, wherein the communication link enables communication between the network communication card and the remote terminal via the Internet.

4. The IED of claim 1, wherein the network communication card is further configured to be connected to a Modbus server.

5. The IED of claim 1, wherein the network communication card communicates with the first processor via a serial communication interface.

6. The IED of claim 1, wherein the network communication card is configured to store and implement at least one protocol routine.

7. The IED of claim 6, wherein one or more of the at least one protocol routine includes a process of interpreting the information request from the remote terminal.

8. The IED of claim 7, wherein the process of interpreting the information request includes interpreting a Simple Network Time Protocol (SNTP) request.

9. The IED of claim 6, wherein one or more of the at least one protocol routine includes a process of formatting replies back to the remote terminal.

10. The IED of claim 6, wherein one or more of the at least one protocol routine includes a process of handling Generic Object Oriented Substation Event (GOOSE) messages.

11. The IED of claim 10, wherein handling GOOSE messages includes adding or removing a Virtual Local Area Network (VLAN) tag upon transmission or reception.

12. The IED of claim 1, wherein the data gathering module is configured to refresh the up-to-date power data in the internal database at a refresh rate of one refresh per second.

13. The IED of claim 1, wherein the IED is one of a Programmable Logic Controller (PLC), a Remote Terminal Unit (RTU), an electric power meter, a revenue meter, a protective relay, a fault recorder, a phase measurement unit, a serial switch and/or a smart input/output device.

14. The IED of claim 1, wherein the at least one sensor, at least one analog-to-digital converter, and at least one processor are disposed in a housing, the housing is at least one of a socket/S-base housing, a panel meter housing, a switchboard/draw-out housing and/or a A-base housing.

15. A network communication card of an electric power meter, the network communication card comprising:
a processing device configured to control operations of the network communication card;
a data gathering module configured to continuously retrieve power data from a measuring unit of the electric power meter, the measuring unit configured to obtain the power data by sensing electrical parameters from an electrical power distribution system;
a native database configured to store the power data retrieved by the data gathering module as objects; and
a network interface configured to receive a request from a remote terminal via a communication link;
a protocol library configured to interpret the request received from the remote terminal and issue a call to request the latest power date from the native database, the protocol library including a database for creating a relationship between objects of a communication protocol and the object stored in the native database;
wherein the network interface is further configured to respond to the request with the latest power data stored in the native database without requesting data from the measuring unit;
wherein the data gathering module, native database, and network interface are disposed on a card within a housing and wherein components of the electric power meter are also disposed within the housing.

16. The network communication card of claim 15, further comprising a network socket interface translator configured to translate between a first network protocol and a second network protocol, the network interface communicating with the remote terminal in accordance with the first network protocol, and the data gathering module communicating with the measuring unit in accordance with the second network protocol.

17. The network communication card of claim 16, wherein the first network protocol is the Transmission Control Protocol/Internet Protocol (TCP/IP) and the second network protocol is the Berkeley sockets model protocol associated with Berkeley Software Distribution (BSD).

18. The network communication card of claim 15, further comprising a data interface configured to execute the call from the protocol library to request the latest power data from the native database.

19. The network communication card of claim 15, wherein the protocol library comprises at least one protocol routine configured to identify the request as one of an information request, data request, and configuration request.

20. The network communication card of claim 15, wherein the native database is configured to map the power data with known register numbers for the Modbus protocol that is native to the network communication card and used to retrieve power data from the measuring unit.

21. The network communication card of claim 15, wherein the data gathering module is further configured to use the Modbus RTU network protocol to continuously retrieve the power data.

22. The network communication card of claim 15, wherein the data gathering module is configured to send data queries to the measuring unit on an interval basis and retrieve the power data from the measuring unit in response to the data queries, the sending data queries and retrieving the power data performed by the data gathering module using a communication protocol that is native to the measuring unit.

23. The network communication card of claim 15, wherein the client side requests are configured as IEC 61850 data packets.

24. The network communication card of claim 15, wherein the data gathering module is configured to refresh the up-to-date power data in the native database at a refresh rate of one refresh per second.

25. The network communication card of claim 15, wherein the housing is at least one of a socket/S-base housing, a panel meter housing, a switchboard/draw-out housing and/or a A-base housing.

26. The network communication card of claim 15, wherein the network interface is configured to send and receive messages in accordance with at least one of the IEC 61850 suite of network protocols.

27. The network communication card of claim 15, wherein the protocol library includes a process of handling Generic Object Oriented Substation Event (GOOSE) messages.

28. The network communication card of claim 27, wherein handling GOOSE messages includes adding or removing a Virtual Local Area Network (VLAN) tag upon transmission or reception.

29. A network communication card of an electric power meter, the network communication card comprising:
  a data gathering module configured to continuously retrieve power data from a measuring unit of the electric power meter, the data gathering module communicating with the measuring unit using a communication protocol that is native to the measuring unit, the measuring unit configured to obtain the power data by sensing electrical parameters from an electrical power distribution system;
  a native database configured to store the power data from the data gathering module as objects;
  a network interface configured to receive an IEC 61850 request from a remote terminal via a communication link for the stored power data, the network interface communicating with the remote terminal in accordance with a first network protocol;
  a network socket translator configured to translate the IEC 61850 request between the first network protocol and an internet socket protocol;
  a protocol library configured to interpret the IEC 61850 request and issue a call to the native database for the power data, the protocol library further configured to use the internet socket protocol, wherein the protocol library includes a database for creating a relationship between IEC 61850 objects and the objects stored in the native database; and
  a data interface configured to translate the call from a protocol library format to a native database format and request the power data from the native database in the native database format;
  wherein the native database is configured to respond to the request from the data interface with the power data stored in the native database and the power data is sent to the remote terminal via the data interface, protocol library, network socket translator, and network interface.

* * * * *